United States Patent
Sun et al.

(10) Patent No.: US 9,431,691 B2
(45) Date of Patent: Aug. 30, 2016

(54) VOLTAGE TUNABLE FILTERS

(75) Inventors: Dexin Sun, Indianapolis, IN (US);
Raleigh Benton Stelle, IV,
Indianapolis, IN (US)

(73) Assignee: M-TRON INDUSTRIES, INC.,
Orlando, FL (US)

(*) Notice: Subject to any disclaimer, the term of this patent is extended or adjusted under 35 U.S.C. 154(b) by 192 days.

(21) Appl. No.: 14/115,027

(22) PCT Filed: May 20, 2011

(86) PCT No.: PCT/US2011/037345
§ 371 (c)(1),
(2), (4) Date: Oct. 31, 2013

(87) PCT Pub. No.: WO2012/161676
PCT Pub. Date: Nov. 29, 2012

(65) Prior Publication Data
US 2014/0062620 A1    Mar. 6, 2014

(51) Int. Cl.
| | | |
|---|---|---|
| H01P 7/08 | (2006.01) | |
| H01P 3/08 | (2006.01) | |
| H01P 11/00 | (2006.01) | |
| H01P 1/203 | (2006.01) | |
| H03K 17/74 | (2006.01) | |

(52) U.S. Cl.
CPC ............ *H01P 7/088* (2013.01); *H01P 1/2039* (2013.01); *H01P 3/084* (2013.01); *H01P 11/003* (2013.01); *H03K 17/74* (2013.01)

(58) Field of Classification Search
CPC ...... H01P 7/088; H01P 77/08; H01P 11/003; H01P 3/084

USPC ....... 333/204, 205, 219, 101, 104–105, 245, 333/262, 184
See application file for complete search history.

(56) References Cited

U.S. PATENT DOCUMENTS

| | | | |
|---|---|---|---|
| 4,692,724 A | | 9/1987 | Harris |
| 4,849,722 A | * | 7/1989 | Cruchon ................ H01P 1/207 333/205 |
| 5,923,233 A | | 7/1999 | Jantunen et al. |
| 5,994,982 A | | 11/1999 | Kintis et al. |
| 6,528,732 B1 | * | 3/2003 | Okubora ............... H01L 23/642 174/255 |
| 7,259,643 B2 | | 8/2007 | Son et al. |
| 7,583,950 B2 | | 9/2009 | Russell et al. |
| 7,795,995 B2 | * | 9/2010 | White ................... H01L 23/552 333/134 |
| 2005/0225411 A1 | | 10/2005 | Sauder et al. |
| 2006/0199622 A1 | | 9/2006 | Bhanji et al. |
| 2009/0121951 A1 | | 5/2009 | Kaneda |
| 2010/0073107 A1 | | 3/2010 | Prophet et al. |
| 2010/0295634 A1 | | 11/2010 | Akale |

OTHER PUBLICATIONS

PCT Search Report and Written Opinion for PCT/US2011/037345, completed Sep. 6, 2011.

* cited by examiner

*Primary Examiner* — Dinh T Le
(74) *Attorney, Agent, or Firm* — Husch Blackwell LLP

(57) ABSTRACT

A suspended line resonator and a tunable filter comprising multiple suspended line resonators. A microstrip resonator and a tunable filter comprising multiple microstrip resonators. A suspended substrate resonator and a tunable filter comprising multiple suspended substrate resonators.

22 Claims, 61 Drawing Sheets

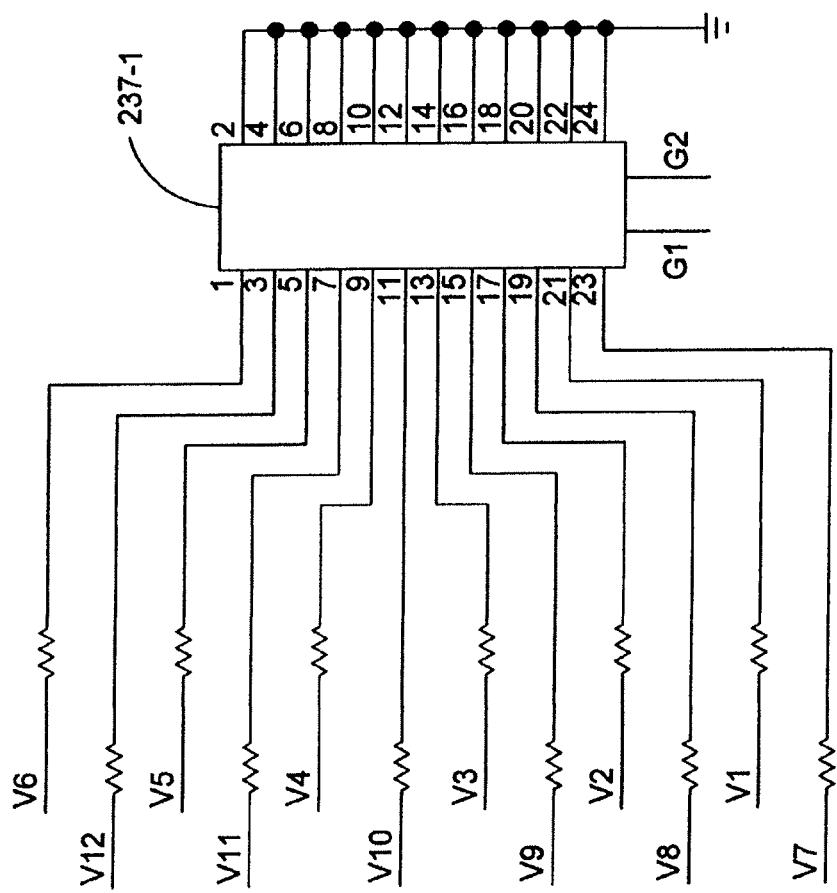
Fig. 12a1

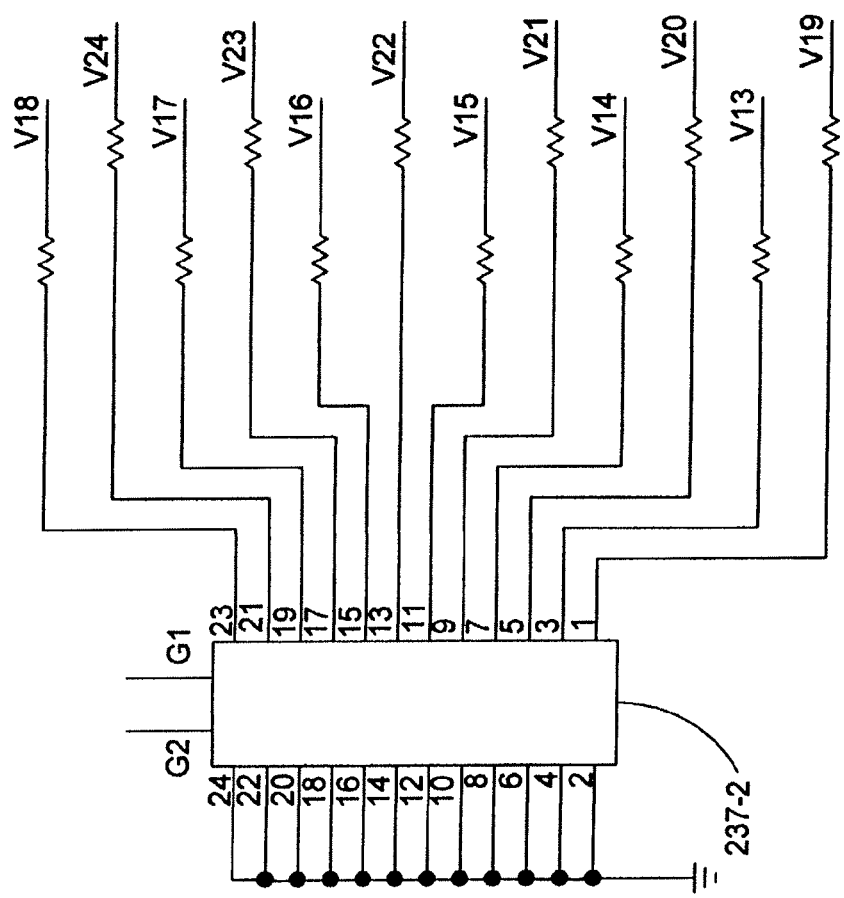
Fig. 12a2

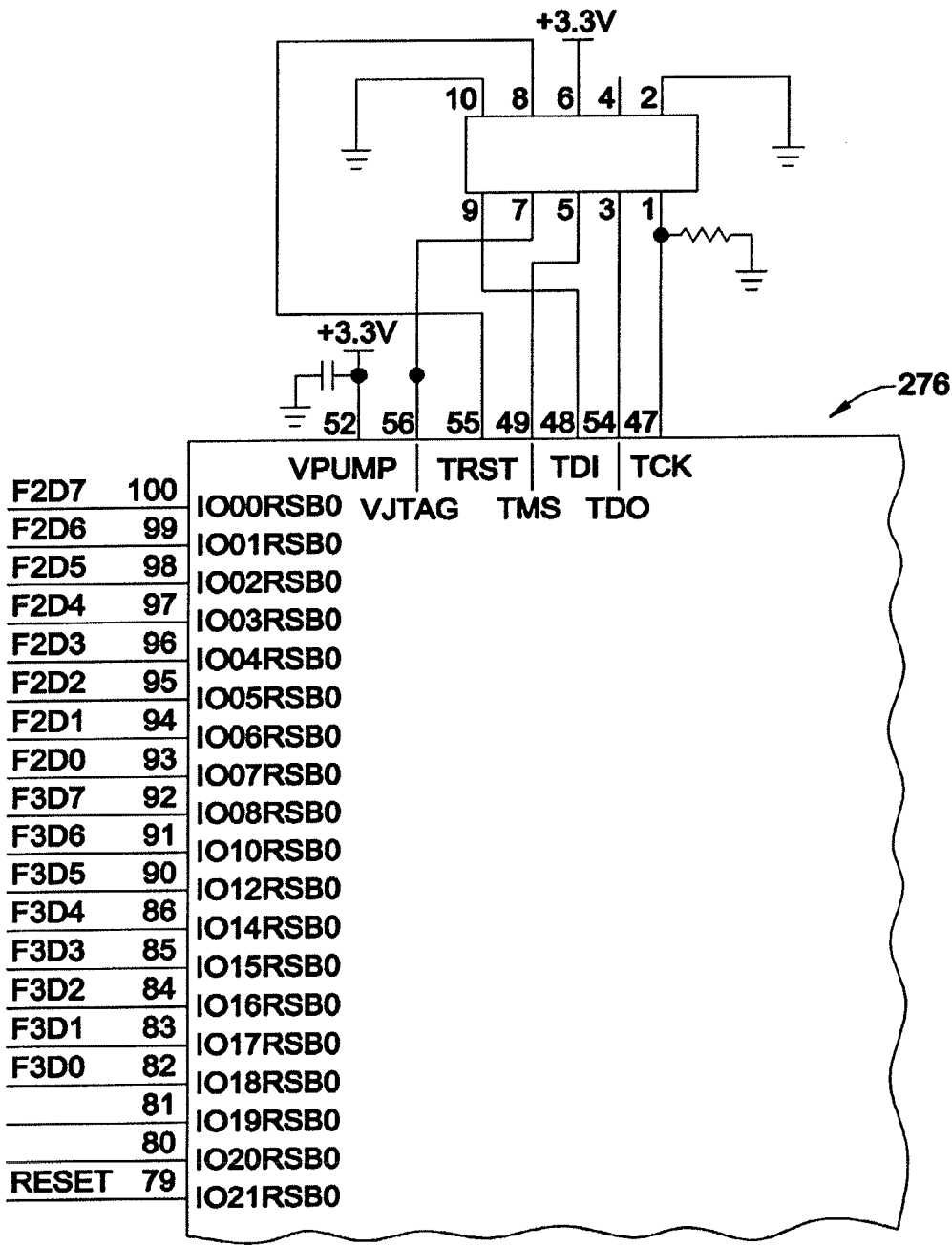
Fig. 13c1

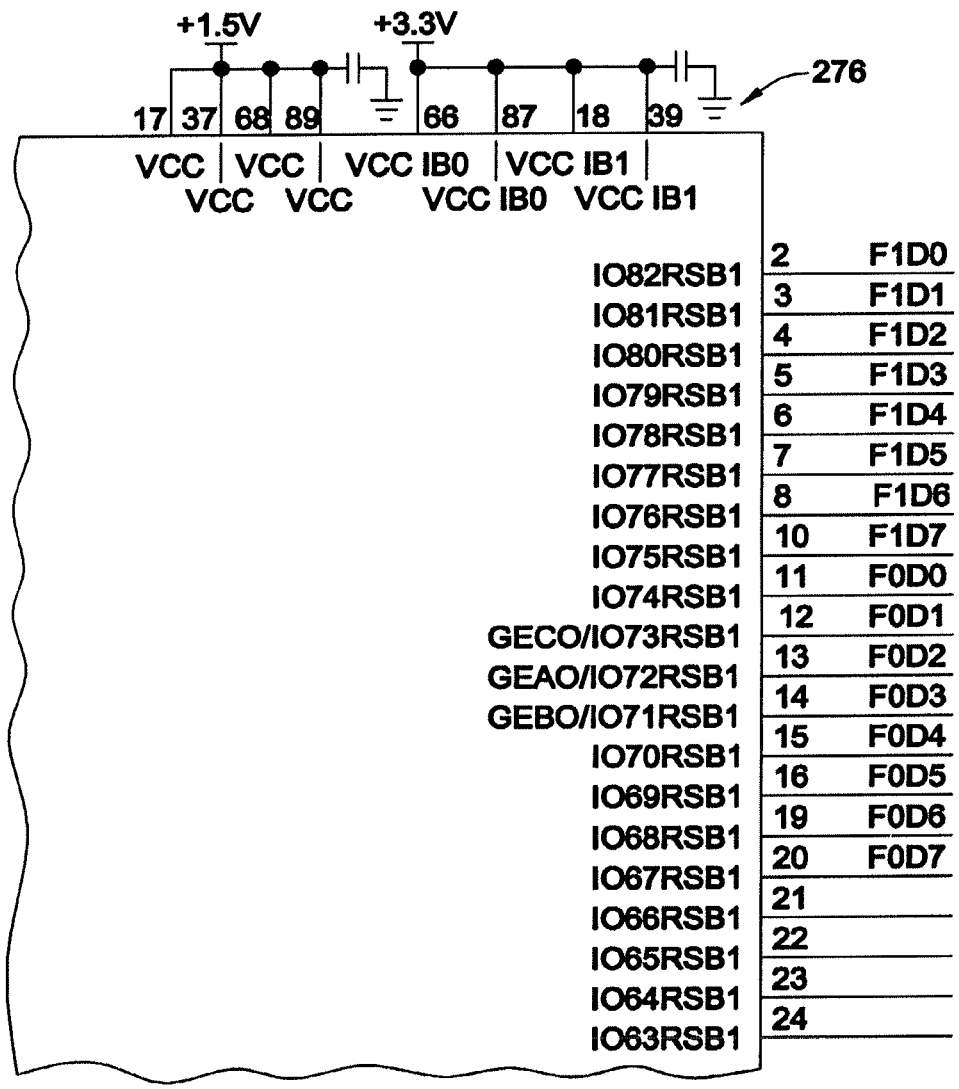
Fig. 13c2

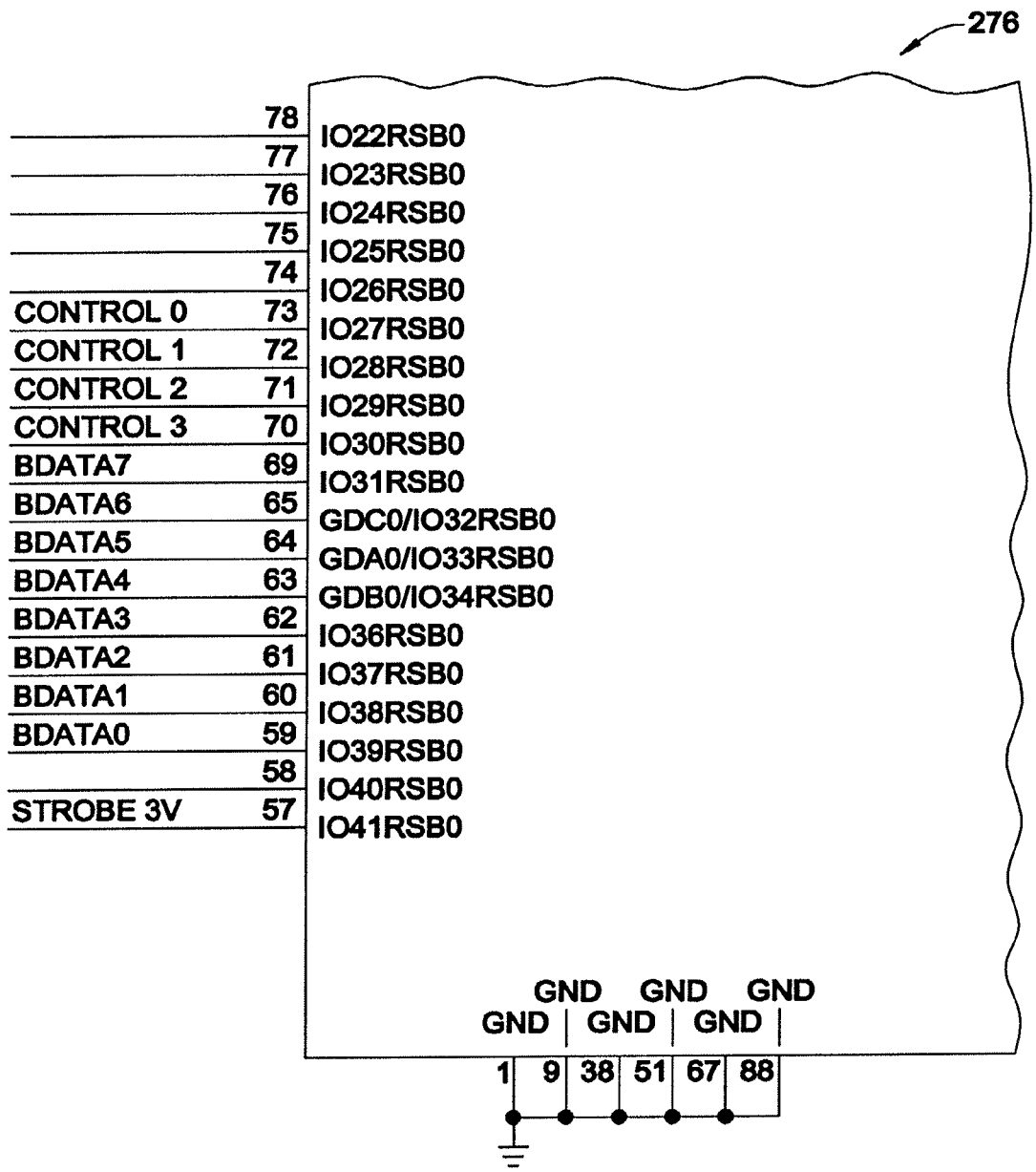
Fig. 13c3

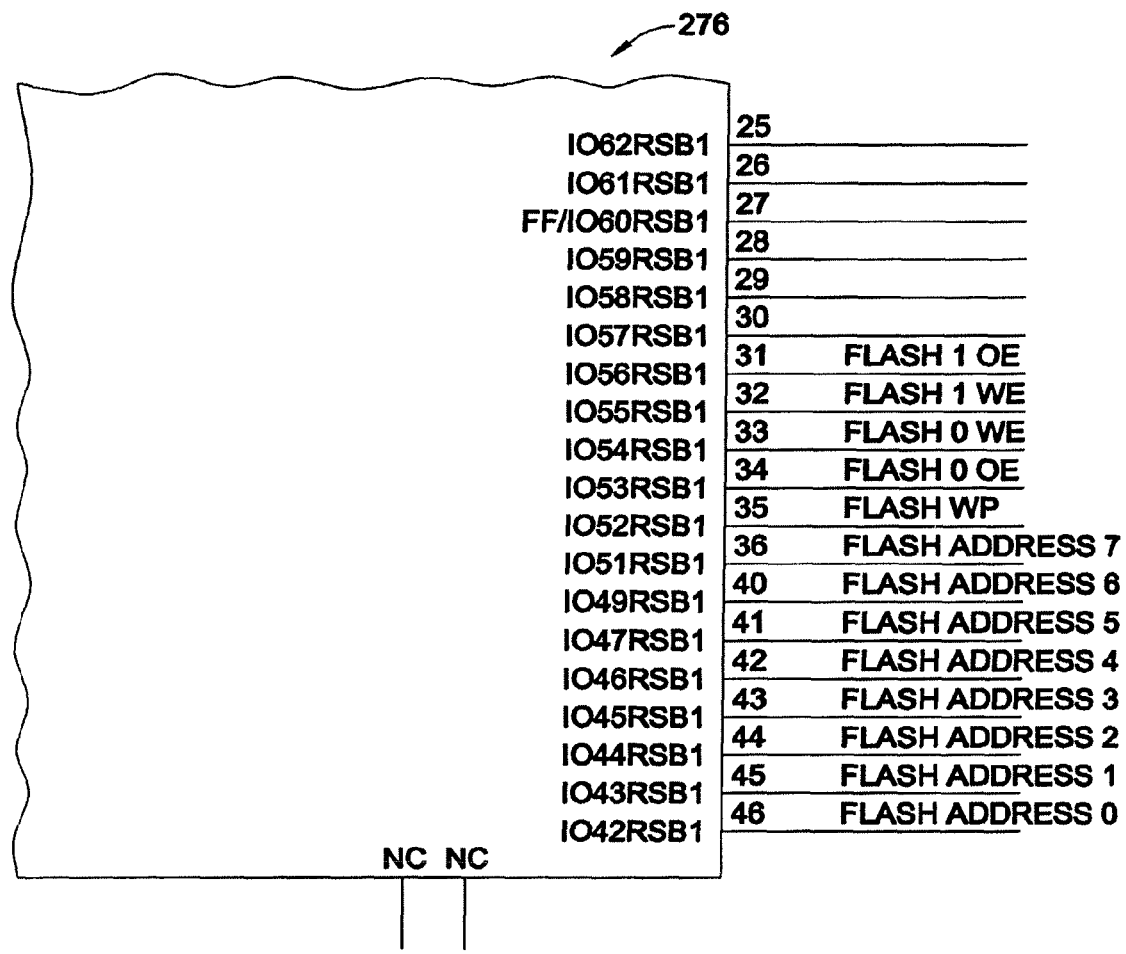
Fig. 13c4

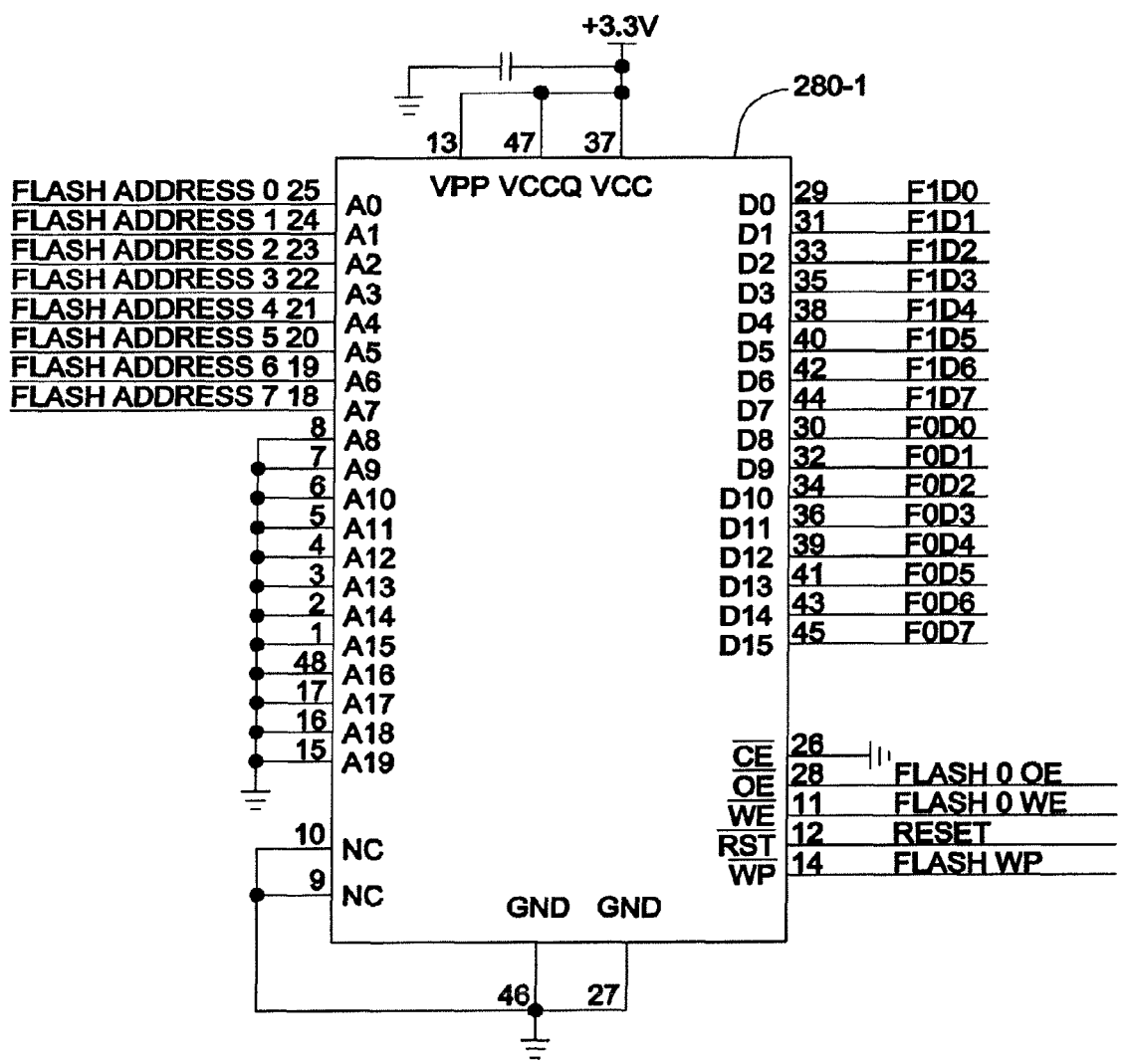
Fig. 13d1

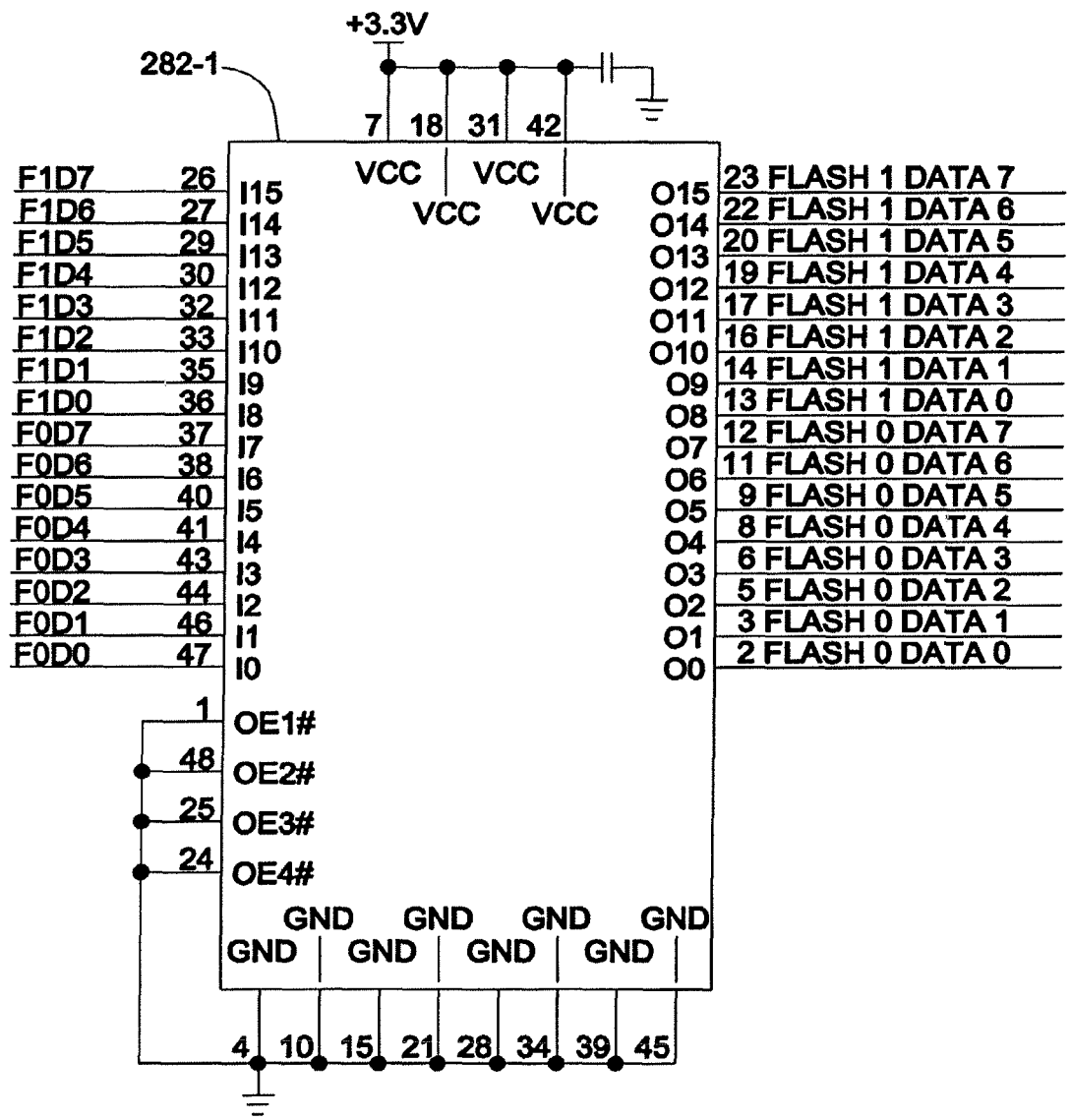
Fig. 13d2

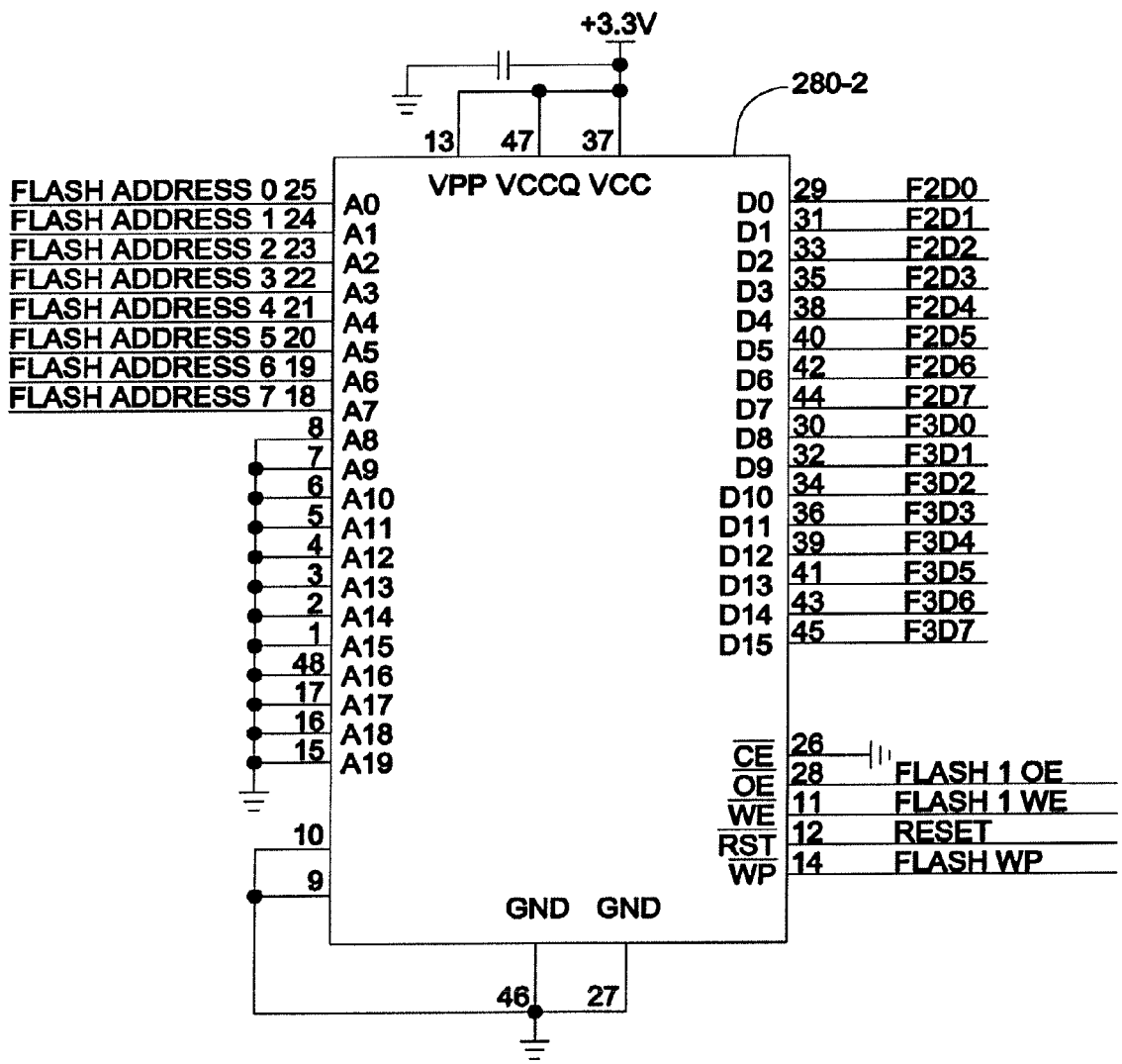
Fig. 13e1

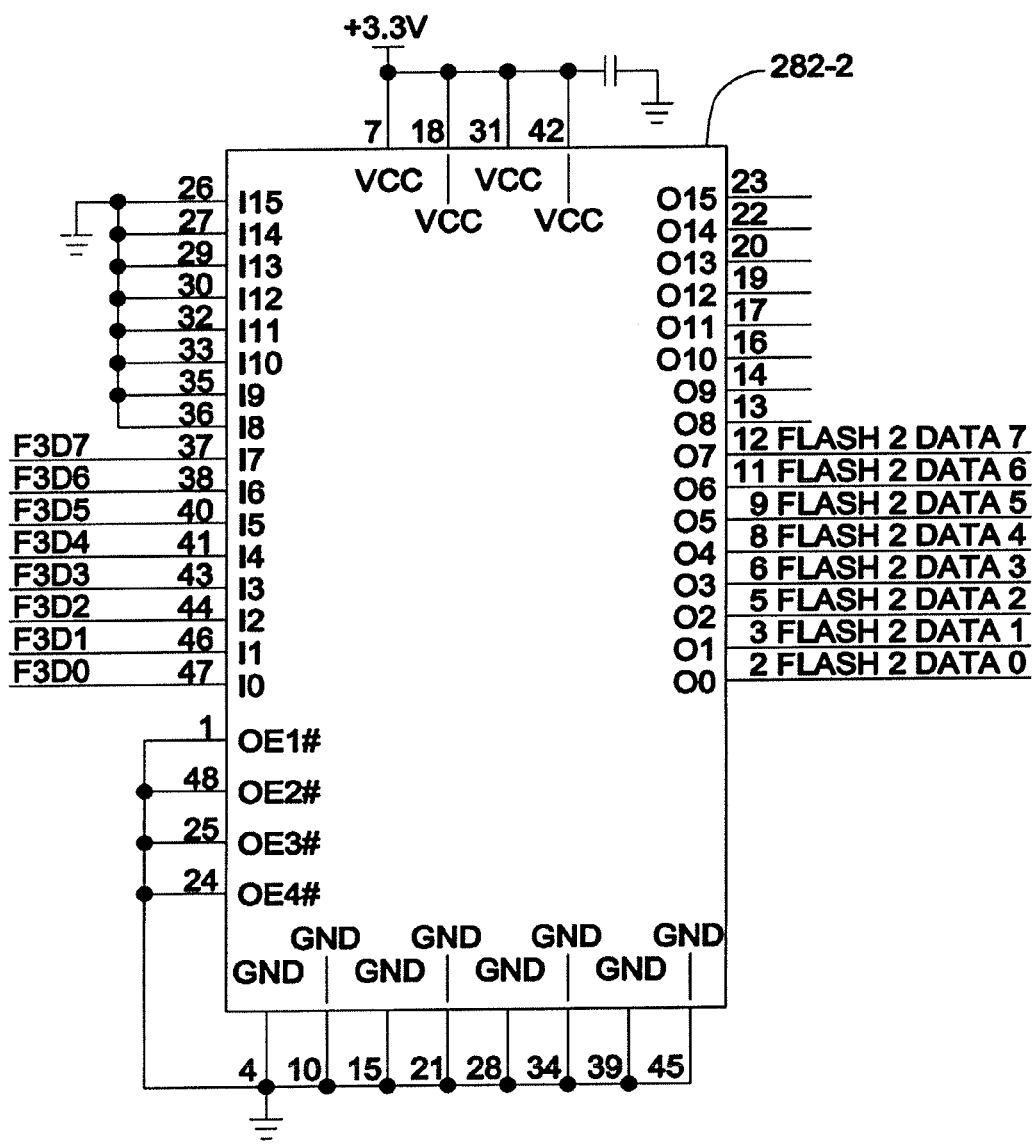
Fig. 13e2

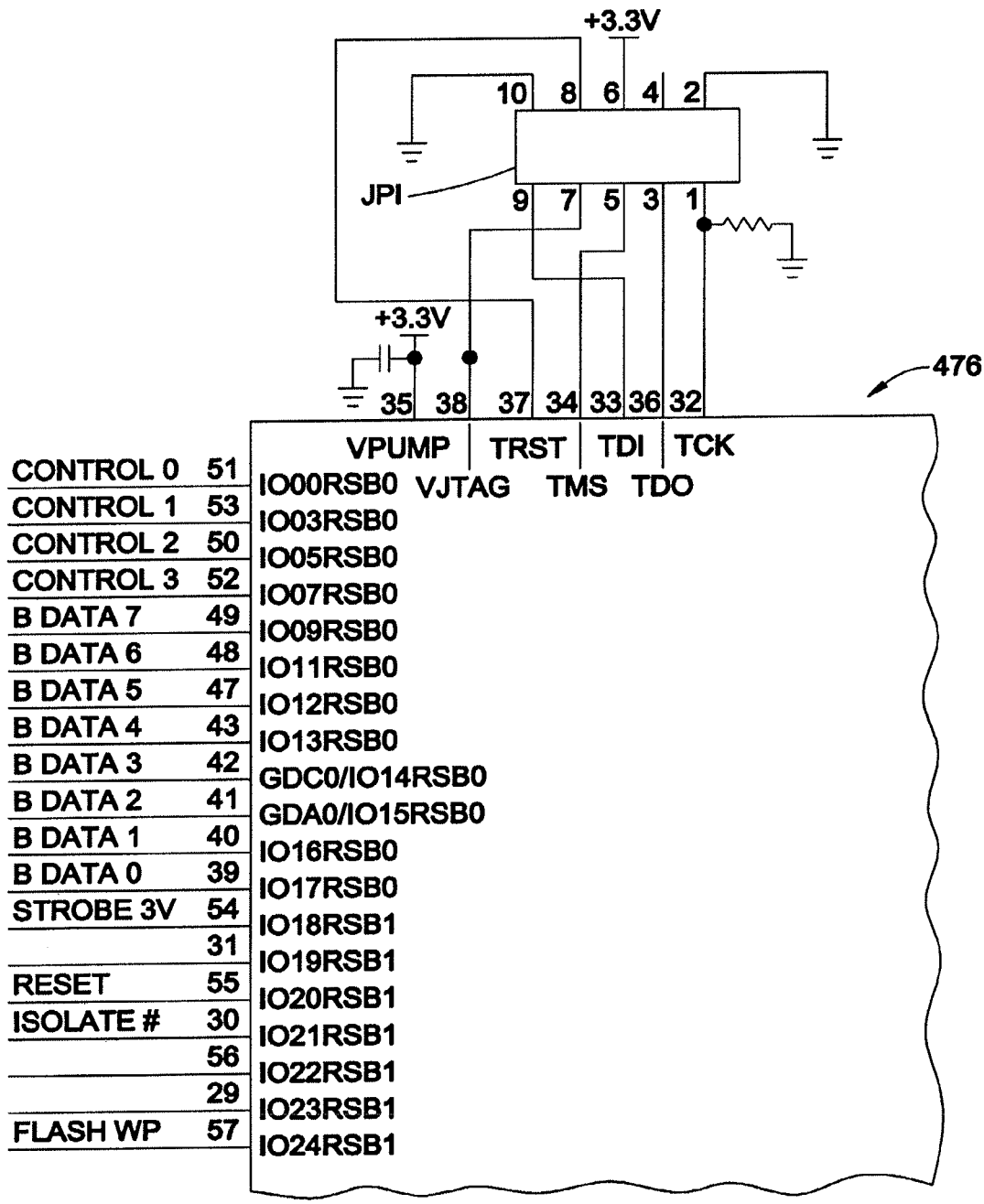
Fig. 19c1

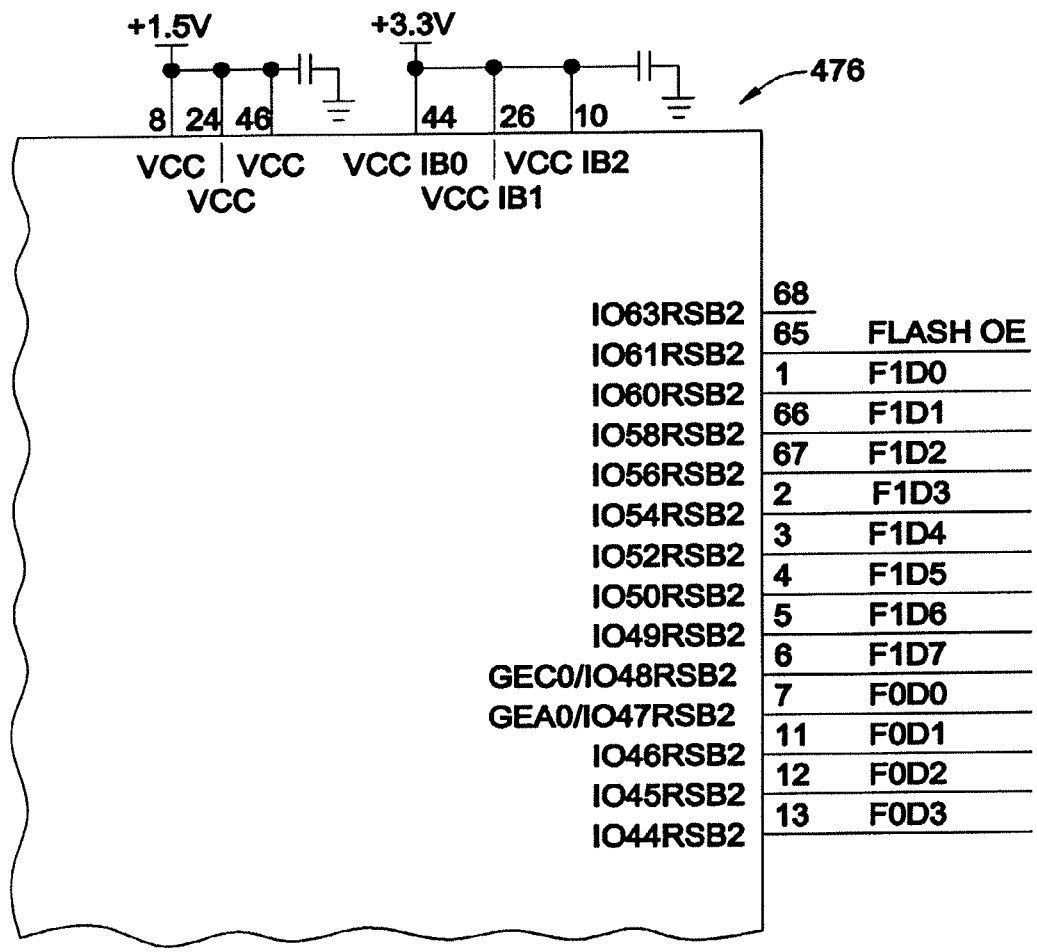
Fig. 19c2

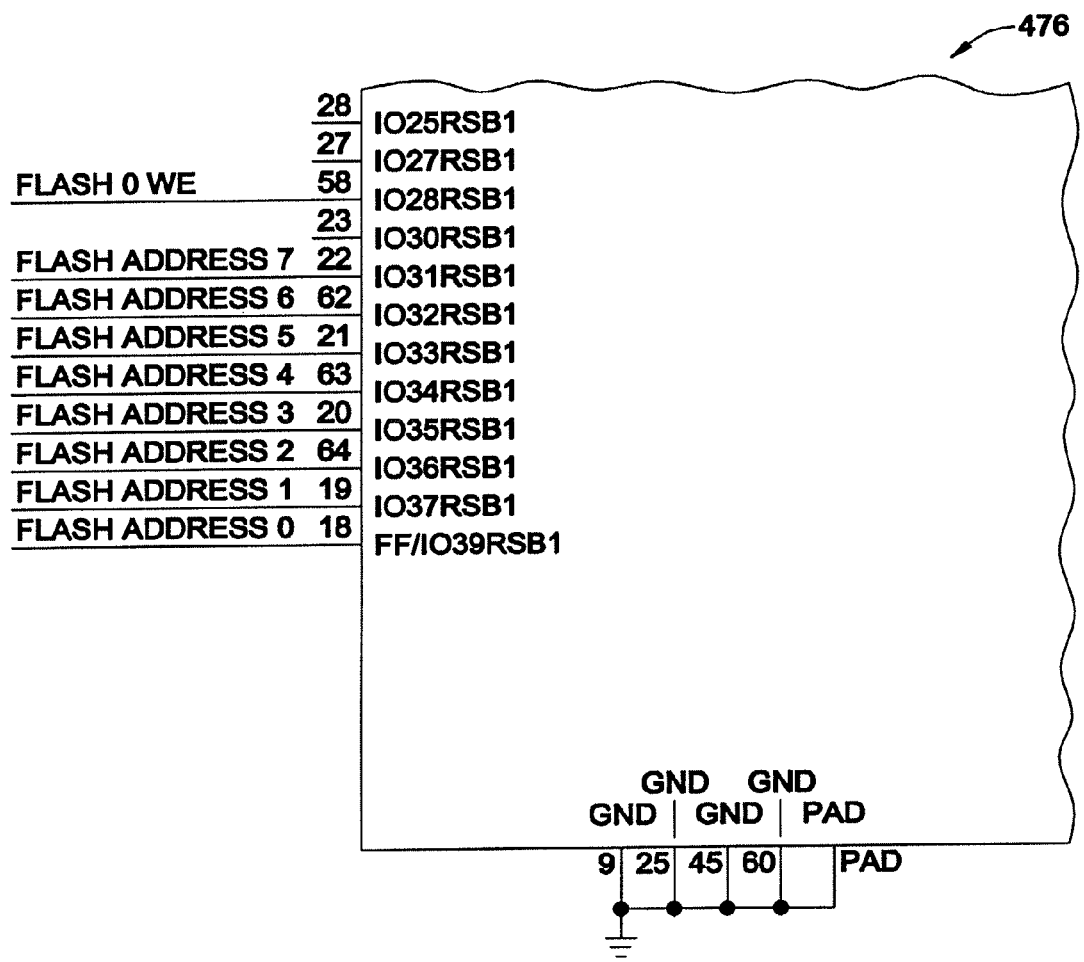
Fig. 19c3

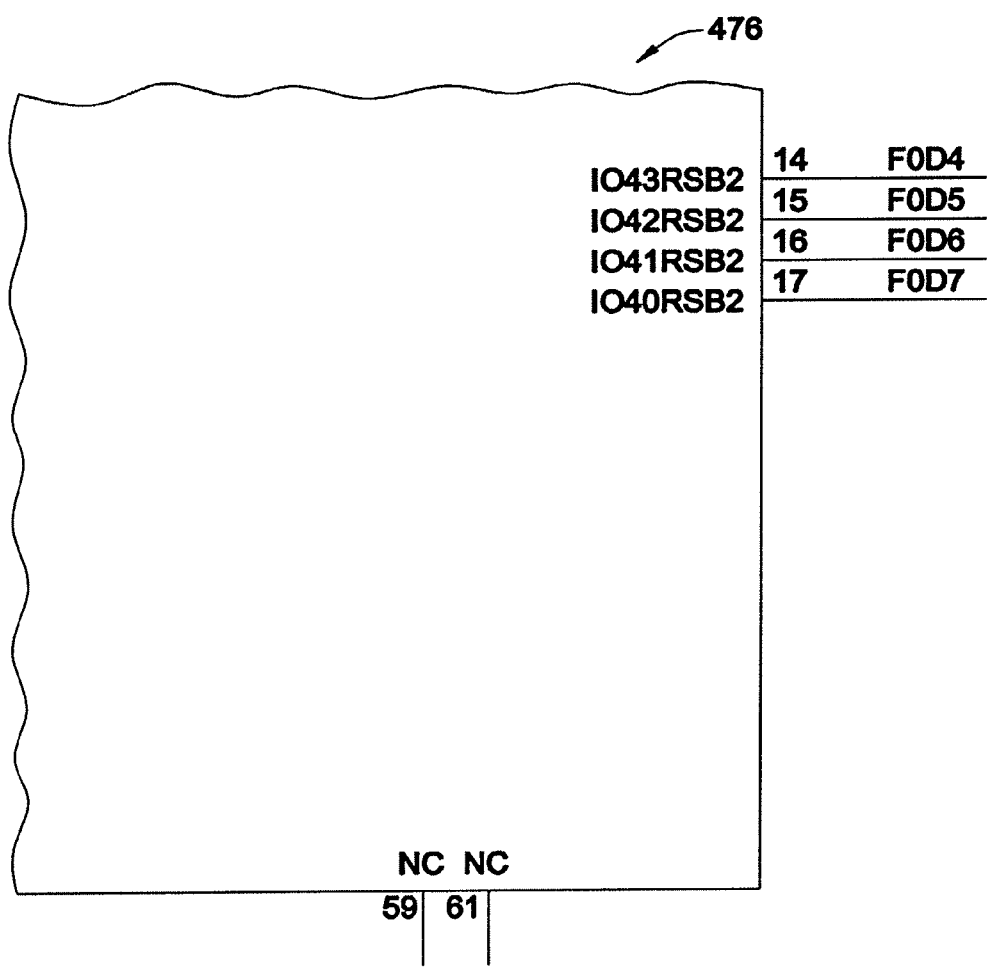
Fig. 19c4

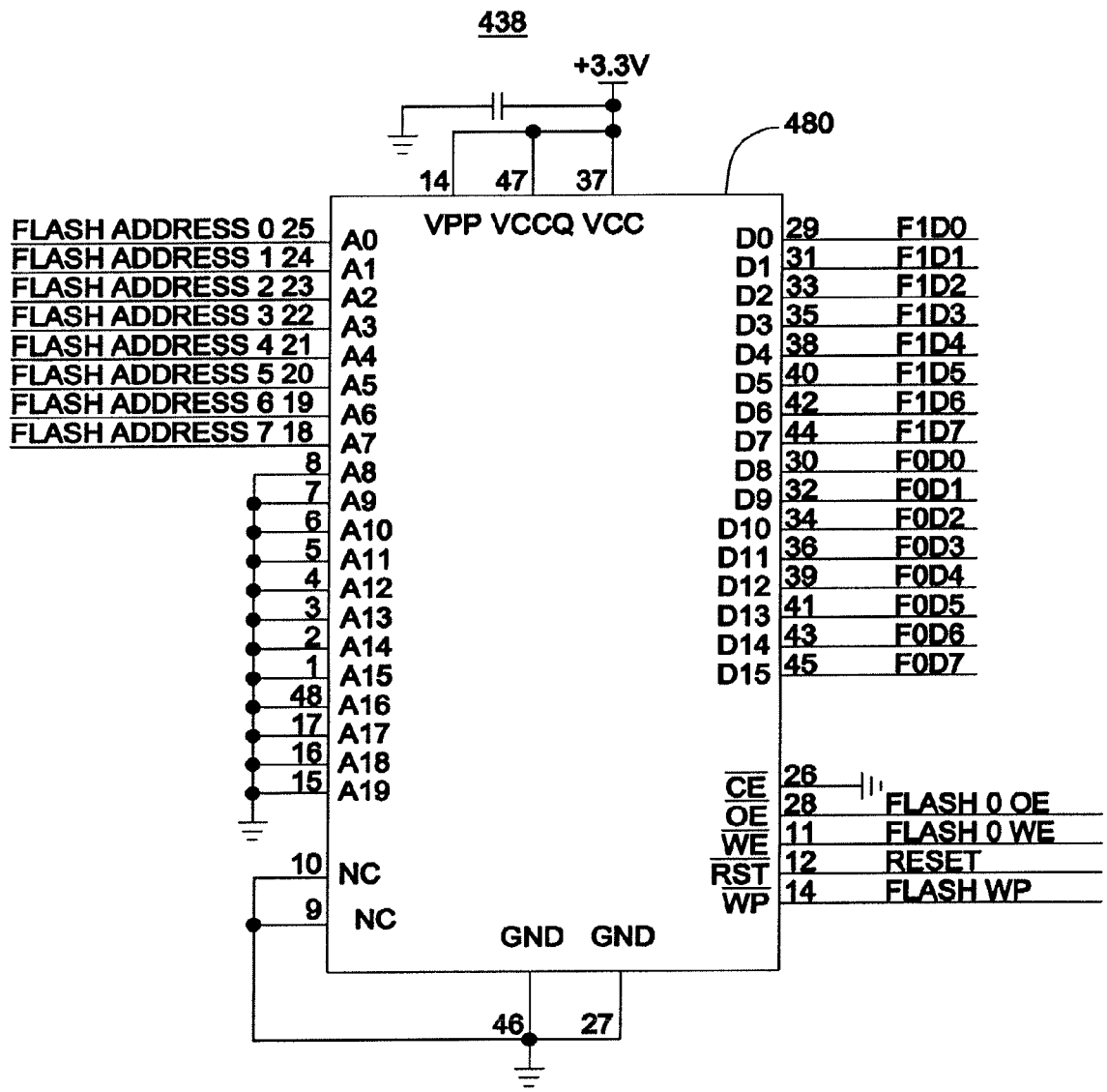
Fig. 19d1

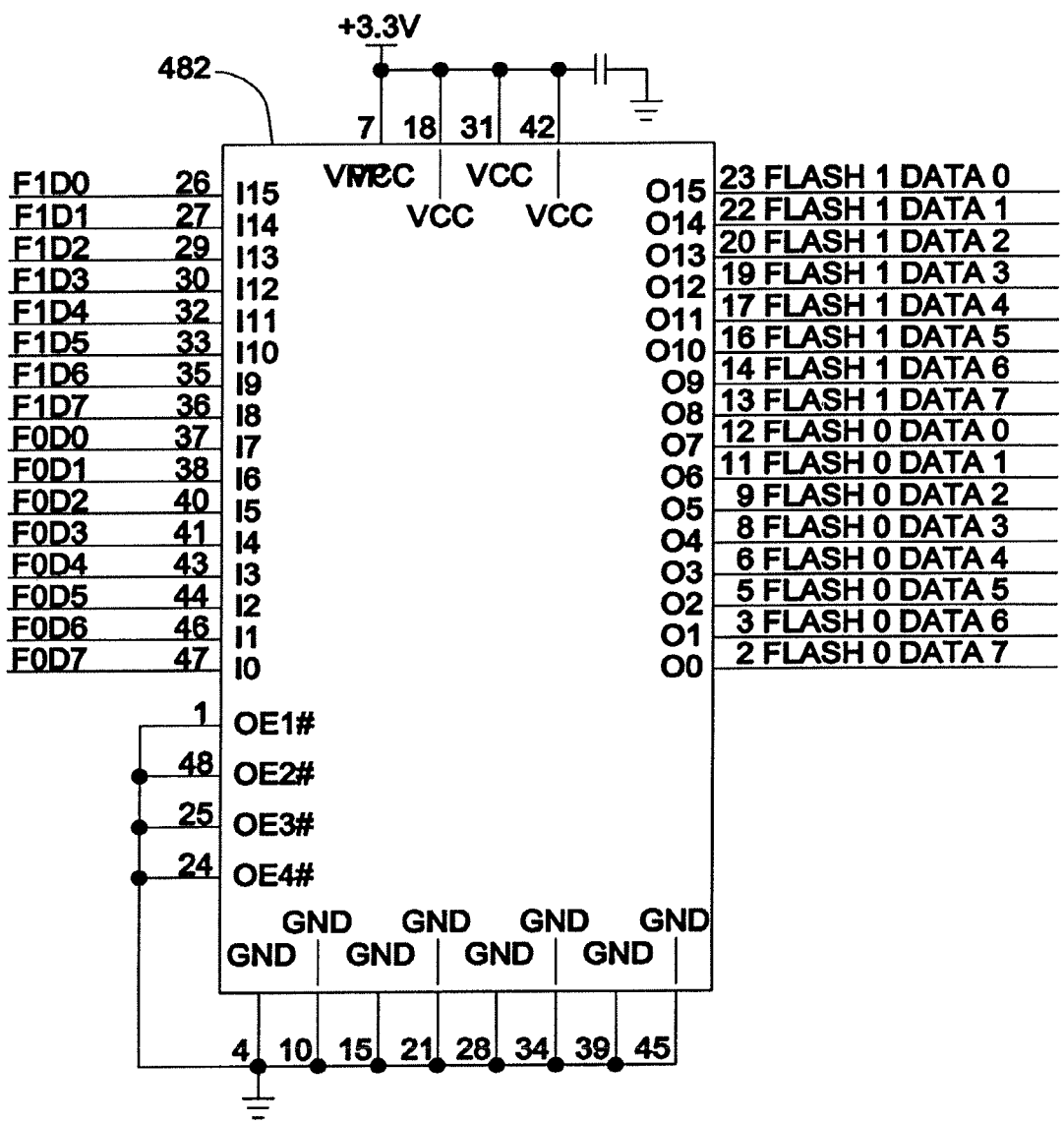
Fig. 19d2

VOLTAGE TUNABLE FILTERS

CROSS-REFERENCE TO RELATED APPLICATIONS

This application is the U.S. national phase of PCT/US2011/037345 filed May 20, 2011. The entire disclosure PCT/US2011/037345 is hereby incorporated herein by reference.

FIELD OF THE INVENTION

This application relates to tunable filters.

BACKGROUND

Voltage tunable filters with microstrip-coupled and suspended coupled lines based on combline topology can be used in diplexers, digital frequency hopping radios, and communication systems. A typical tunable filter based on combline topology comprises a number of coupled resonators, each generally as illustrated in FIG. 1. Each such resonator is characterized by a resonant frequency $f_o$ in Hertz (Hz), $f_o=1/(2\pi (L_o C_o)^{1/2})$, where $L_o$ is the inductance presented at the end of the transmission line, $C_o$ is the capacitance presented at the end of the transmission line, $L_o=Z_c \times \tan(2\pi f_o l/c)/2\pi f_o$, $Z_c$ is the characteristic impedance of the transmission line, l is the length of the transmission line, and c is the phase velocity. $Co=C1+C2+C3+C4+C5+\ldots Cm$, where $C1 \ldots Cm$ are switchable capacitances for each coupled resonator to permit small step frequency tuning.

Tunable combline filters may be realized in several ways, including coaxial coupled lines, an example of which is illustrated in FIG. 2. Coaxially coupled line filters are well known in the art and include, for example, the Maxipole and Powerpole filters available from Pole/Zero Corporation, 5558 Union Centre Drive, West Chester, Ohio 45069 (Minipole and Maxipole). U.S. Pat. No. 4,692,724 also describes filters of this general type. Reference is here also made to: published U.S. patent application 2008/0085694; U.S. Pat. No. 5,994,982; and, U.S. Pat. No. 5,923,233. The disclosures of all of the references cited herein are hereby incorporated herein by reference.

SUMMARY

According to a first aspect, a tunable filter comprises a suspended coupled line structure comprising a substrate and line segments on both sides of the substrate. The line segments are connected with multiple conductors extending through the substrate to form the suspended coupled line structure. A plurality of capacitors are provided at an ungrounded end of the suspended coupled line structure. A plurality of switching elements are coupled to respective ones of the capacitors to switch their respective capacitor into and out of circuit with the ungrounded end of the suspended coupled line structure.

Further illustratively according to this aspect, the tunable filter comprises a housing. The housing includes a first chamber housing the suspended coupled line structure. A second chamber houses the capacitors and switching elements. The second chamber is electrically shielded from the first chamber by the housing.

Illustratively, the tunable filter comprises first and second suspended coupled line structures. Each of the first and second suspended coupled line structures comprises line segments on both sides of the substrate. The line segments of each suspended coupled line structure are connected with multiple conductors extending through the substrate to form a resonator. First and second pluralities of capacitors are provided at the ungrounded ends of the first and second suspended coupled line structures, respectively. First and second pluralities of switching elements are coupled to respective ones of the first and second pluralities of capacitors to switch their respective capacitors into and out of circuit with the ungrounded end of the suspended coupled line structure.

Further illustratively according to this aspect, the tunable filter comprises an input port coupled to the first suspended coupled line structure between a grounded end of the first suspended coupled line structure and the ungrounded end of the first suspended coupled line structure and an output port coupled to the second suspended coupled line structure between a grounded end of the second suspended coupled line structure and the ungrounded end of the second suspended coupled line structure.

Further illustratively according to this aspect, the tunable filter comprises a low pass filter coupled between the input port and the first suspended coupled line structure.

Further illustratively according to this aspect, the tunable filter comprises a low pass filter coupled between the second suspended coupled line structure and the output port.

Further illustratively according to this aspect, the tunable filter comprises a controller for controlling the switching of the switching elements to switch their respective capacitors into and out of circuit with the ungrounded end of the suspended coupled line structure to tune the filter to a desired frequency.

Further illustratively according to this aspect, the tunable filter comprises a housing. The housing includes a first chamber housing the suspended coupled line structure, a second chamber housing the first plurality of capacitors and first plurality of switching elements, a third chamber housing the second plurality of capacitors and second plurality of switching elements, and a fourth chamber housing the controller, the first, second, third and fourth chambers electrically shielded from each other by the housing.

According to an aspect, a tunable filter comprises a first microstrip structure comprising a substrate, a line segment on one side of the substrate, and a ground plane on the other side of the substrate. A first plurality of capacitors are provided at an ungrounded end of the first microstrip structure. A first plurality of switching elements are coupled to respective ones of the first plurality of capacitors to switch their respective capacitors into and out of circuit with the ungrounded end of the first microstrip structure.

Illustratively, the tunable filter comprises first and second coupled microstrip structures, first and second pluralities of capacitors at the ungrounded ends of the first and second coupled microstrip structures, respectively, and first and second pluralities of switching elements to switch their respective capacitors into and out of circuit with the ungrounded ends of the coupled first and second microstrip structures.

Further illustratively according to this aspect, the tunable filter comprises an input port coupled to the first microstrip structure between the grounded end of the first microstrip structure and the ungrounded end of the first microstrip structure and an output port coupled to the second microstrip structure between the grounded end of the second microstrip structure and the ungrounded end of the second microstrip structure.

Further illustratively according to this aspect, the tunable filter comprises a low pass filter coupled between the input port and the first microstrip structure.

Further illustratively according to this aspect, the tunable filter comprises a low pass filter coupled between the second microstrip structure and the output port.

Further illustratively according to this aspect, the tunable filter comprises a controller for controlling the switching of the switching elements to switch their respective capacitors into and out of circuit with the ungrounded end of the microstrip structure to tune the filter to a desired frequency.

Further illustratively according to this aspect, the tunable filter comprises a housing. The housing includes a first chamber housing the first microstrip structure, the first plurality of capacitors and first plurality of switching elements, and a second chamber housing the controller. The second chamber is electrically shielded from the first chamber by the housing.

According to an aspect, a suspended line resonator comprises a first electrically insulating substrate having two opposed sides and a first pair of electrically conductive traces. Each trace of the first pair of electrically conductive traces is provided on a respective one of the two sides. Each of the electrically conductive traces of the first pair has a first grounded end and a second ungrounded end. First passageways are provided through the first substrate between the electrically conductive traces of the first pair. The first passageways are provided with conductive material electrically coupling the conductive traces of the first pair.

Illustratively according to this aspect, a tunable filter comprising the suspended line resonator further comprises a first plurality of capacitors at the ungrounded end of the first pair of electrically conductive traces and a first plurality of switching elements. Each switching element of the first plurality of switching elements is coupled to a respective one of the first plurality of capacitors to switch its respective capacitor into and out of circuit with the ungrounded end of the first pair of electrically conductive traces.

Further illustratively according to this aspect, the suspended line resonator comprises a second pair of electrically conductive traces. Each trace of the second pair of electrically conductive traces is provided on a respective one of the two sides. Each of the electrically conductive traces of the second pair has a first end coupled to the first ends of the first pair of conductive traces and a second ungrounded end. The electrically conductive traces of the second pair are spaced from respective electrically conductive traces of the first pair. Second passageways are provided through the first substrate between the electrically conductive traces of the second pair. The second passageways are provided with conductive material electrically coupling the conductive traces of the second pair.

Further illustratively according to this aspect, the suspended line resonator comprises a first plurality of capacitors at the ungrounded end of the first pair of traces, a second plurality of capacitors at the ungrounded end of the second pair of traces, a first plurality of switching elements, and a second plurality of switching elements. Each switching element of the first plurality of switching elements is coupled to a respective capacitor of the first plurality of capacitors to switch its respective capacitor into and out of circuit with the ungrounded end of the first pair of traces. Each switching element of the second plurality of switching elements is coupled to a respective capacitor of the second plurality of capacitors to switch its respective capacitor into and out of circuit with the ungrounded end of the second pair of traces.

Further illustratively according to this aspect, the tunable filter comprises an input port coupled to the first pair of traces between the grounded end of the first pair of traces and the ungrounded end of the first pair of traces and an output port coupled to the second pair of traces between the grounded end of the second pair of traces and the ungrounded end of the second pair of traces.

Further illustratively according to this aspect, the tunable filter comprises a low pass filter coupled between the input port and the first suspended coupled line structure.

Further illustratively according to this aspect, the tunable filter comprises a low pass filter coupled between the second suspended coupled line structure and the output port.

Further illustratively according to this aspect, the tunable filter comprises a second electrically insulating substrate, a first plurality of capacitors at the ungrounded end of the first pair of electrically conductive traces, and a first plurality of switching elements. A controller is provided for controlling the switching of the switching elements to switch their respective capacitors into and out of circuit with the ungrounded end of the suspended coupled line structure to tune the filter to a desired frequency. The controller is provided on the second electrically insulating substrate. One of a plug and a socket is provided on the first electrically insulating substrate. The other of the plug and socket is provided on the second electrically insulating substrate. Engagement of the plug and socket couples the first and second pluralities of switches to the controller.

According to an aspect, a microstrip resonator comprises a first electrically insulating substrate having two opposed sides. A first electrically conductive trace is provided on one of the two sides. A ground plane is provided on the other of the two sides. The first electrically conductive trace has a first grounded end coupled to the ground plane and a second ungrounded end. A first plurality of capacitors are provided at the ungrounded end of the first electrically conductive trace. A first plurality of switching elements are coupled to respective ones of the first plurality of capacitors to switch the respective capacitor into and out of circuit between the ungrounded end of the first electrically conductive trace and the ground plane.

Further illustratively according to this aspect, the microstrip resonator comprises a second electrically conductive trace provided on the same side of the substrate as the first electrically conductive trace and spaced from the first electrically conductive trace. The second electrically conductive trace has a first end coupled to the first end of the first electrically conductive trace and a second ungrounded end. A second plurality of capacitors are provided at the ungrounded end of the second electrically conductive trace. A second plurality of switching elements are coupled to respective ones of the second plurality of capacitors to switch their respective capacitors into and out of circuit between the ungrounded end of the second electrically conductive trace and the ground plane.

Further illustratively according to this aspect, the microstrip resonator comprises an input port coupled to the first electrically conductive trace between the grounded end of the first electrically conductive trace and the ungrounded end of the first electrically conductive trace and an output port coupled to the second electrically conductive trace between the grounded end of the second electrically conductive trace and the ungrounded end of the second electrically conductive trace.

Further illustratively according to this aspect, the microstrip resonator comprises a low pass filter coupled between the input port and the first electrically conductive trace.

Further illustratively according to this aspect, the microstrip resonator comprises a low pass filter coupled between the second electrically conductive trace and the output port.

Further illustratively according to this aspect, the microstrip resonator comprises a second electrically insulating substrate. A controller is provided for controlling the switching of the switching elements to switch their respective capacitors into and out of circuit with the ungrounded ends of the first electrically conductive trace and the second electrically conductive trace to tune the resonator to a desired frequency. The controller is provided on the second electrically insulating substrate. One of a plug and a socket is provided on the first electrically insulating substrate and the other of the plug and socket is provided on the second electrically insulating substrate. Engagement of the plug and socket couples the first and second pluralities of switches to the controller.

According to an aspect, a tunable filter comprises a first suspended substrate resonator comprising a substrate having first and second opposed sides, and a first line segment on the first side of the substrate. The first line segment has an end for coupling to ground and an ungrounded end. A first plurality of capacitors are provided at the ungrounded end of the first line segment. A first plurality of switching elements are coupled to respective ones of the first plurality of capacitors to switch their respective capacitors into and out of circuit with the ungrounded end of the first line segment.

Further illustratively according to this aspect, the tunable filter comprises a second line segment having an end for coupling to ground and an ungrounded end, a second plurality of capacitors at the ungrounded end of the second line segment, respectively, and a second plurality of switching elements. Each switching element of the second plurality of switching elements is coupled to a respective one of the second plurality of capacitors to switch its respective capacitor of the second plurality of capacitors into and out of circuit with the ungrounded end of the second line segment.

Further illustratively according to this aspect, the tunable filter comprises an input port coupled to the first line segment between the grounded end of the first line segment and the ungrounded end of the first line segment and an output port coupled to the second line segment between the grounded end of the second line segment and the ungrounded end of the second line segment.

Further illustratively according to this aspect, the tunable filter comprises a low pass filter coupled between the input port and the first line segment.

Further illustratively according to this aspect, the tunable filter comprises a low pass filter coupled between the second line segment and the output port.

Further illustratively according to this aspect, the tunable filter comprises a controller for controlling the switching of the switching elements to switch their respective capacitors into and out of circuit with the ungrounded end of the first line segment to tune the filter to a desired frequency.

Further illustratively according to this aspect, the tunable filter comprises a housing including a first chamber housing the substrate and providing ground planes substantially parallel to the first and second sides and substantially equidistantly spaced from the first line segment, and a second chamber housing the controller. The second chamber is electrically shielded from the first chamber by the housing.

According to an aspect, a suspended substrate resonator comprises a first electrically insulating substrate having two opposed sides, and a first electrically conductive trace provided on one of the two sides. The first electrically conductive trace has a first grounded end coupled to the ground plane and a second ungrounded end. A first plurality of capacitors is provided at the ungrounded end of the first electrically conductive trace. Each switching element of a first plurality of switching elements is coupled to a respective one of the first plurality of capacitors to switch its respective capacitor into and out of circuit between the ungrounded end of the first electrically conductive trace and ground.

Further illustratively according to this aspect, the suspended substrate resonator comprises a second electrically conductive trace. The second electrically conductive trace is provided on the same side of the substrate as the first electrically conductive trace and is spaced from the first electrically conductive trace. The second electrically conductive trace has a first end coupled to the first end of the first electrically conductive trace and a second ungrounded end. A second plurality of capacitors are provided at the ungrounded end of the second electrically conductive trace. Each switching element of a second plurality of switching elements is coupled to a respective one of the second plurality of capacitors to switch its respective capacitor into and out of circuit between the ungrounded end of the second electrically conductive trace and ground.

Further illustratively according to this aspect, the suspended substrate resonator comprises an input port coupled to the first electrically conductive trace between the grounded end of the first electrically conductive trace and the ungrounded end of the first electrically conductive trace and an output port coupled to the second electrically conductive trace between the grounded end of the second electrically conductive trace and the ungrounded end of the second electrically conductive trace.

Further illustratively according to this aspect, the suspended substrate resonator comprises a low pass filter coupled between the input port and the first electrically conductive trace.

Further illustratively according to this aspect, the suspended substrate resonator comprises a low pass filter coupled between the second electrically conductive trace and the output port.

Further illustratively according to this aspect, the suspended substrate resonator comprises a second electrically insulating substrate. A controller is provided for controlling the switching of the switching elements to switch their respective capacitors into and out of circuit with the ungrounded ends of the first electrically conductive trace and the second electrically conductive trace to tune the resonator to a desired frequency. The controller is provided on the second electrically insulating substrate. One of a plug and socket is provided on the first electrically insulating substrate and the other of the plug and socket is provided on the second electrically insulating substrate. Engagement of the plug and socket couples the first and second pluralities of switches to the controller.

Illustratively according to the various aspects, the switching elements are selected from the group consisting of positive-intrinsic-negative (PIN) diodes, field effect transistors (FETs), microelectromechanical systems (MEMS) devices and digitally tunable capacitors (DTCs).

Illustratively according to the various aspects, the minimum frequency tuning step provides a filter frequency tuning step size that is less than the 3 dB bandwidth of the filter.

BRIEF DESCRIPTION OF THE DRAWINGS

The invention may best be understood by referring to the following detailed descriptions and accompanying drawings. In the drawings:

FIGS. 12a-g illustrate schematic circuit diagrams for a filter circuit of the type described;

FIGS. 19a-l illustrate schematic circuit diagrams for the logic circuit of FIGS. 14-17.

DETAILED DESCRIPTION

Figure 1:
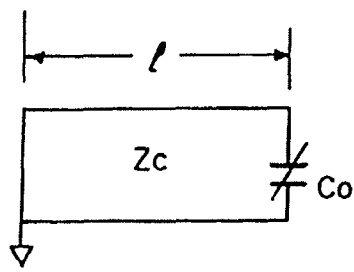
FIG. 1 illustrates a simplified schematic diagram of a resonator.
Figure 2:
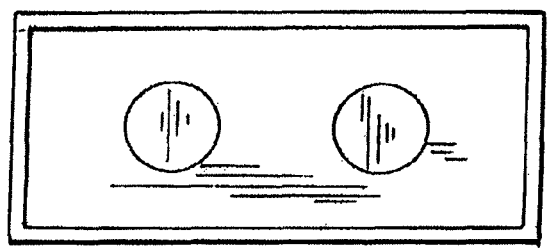
FIG. 2 illustrates a three dimensional structure including resonators with circular cross section suspended in a metal cavity.

As illustrated in FIG. 2, a tunable combline filter structure comprises a three dimensional structure including resonators with either circular or rectangular cross section (here, circular cross section) suspended in a metal cavity. Resonators of this type have the advantage of relatively high Q and power handling capability. Tuning circuitry is generally connected to the resonators by mounting a circuit board constructed from a suitable insulative material and containing the tuning elements, typically capacitors, and typically PIN diode switches perpendicular to the resonators. Additional shielding is necessary to isolate the switches and resonators from the electronics which control the PIN switches. A significant disadvantage of this approach is the relatively high cost of the resonators and the complex mechanical assembly procedure.

This disclosure relates to improvements to current microstrip coupled lines and suspended coupled lines. Both structures include two such boards, one containing the resonators, tuning capacitors and RF switches, and the other containing the switch drivers, power supplies and digital logic. The boards are isolated from one another by a wall internal to the filter housing and are connected using a standard PWB-to-PWB connector.

For purposes of illustration, symmetrical filters employing two resonators each with a switchable capacitor bank are described. It is understood that more complex filters may be designed using the illustrated techniques.

Figure 3:
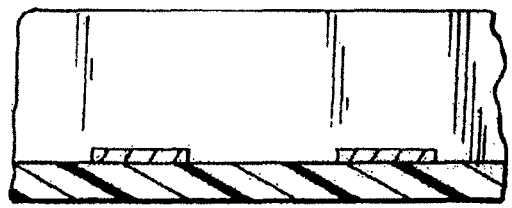
FIG. 3 illustrates a two dimensional, or planar, microstrip coupled lines structure.

Referring to FIG. 3, a two dimensional, or planar, microstrip coupled lines structure is suitable for low power filters in the 1 watt or less range. In such a structure, the resonators comprise microstrip transmission lines and the tuning is performed by selecting any of a number of switched capacitors at the ungrounded end of each resonator. The switching elements may be any of a combination of PIN diodes, FETs, MEMS devices or DTCs having relatively low RF resistance in the ON state and relatively low parasitic capacitance in the OFF state. The capacitors may be discrete capacitors, voltage variable capacitors, passively tunable integrated circuit (PTIC) capacitors, DTCs, or the like. With proper selection of the transmission line impedance and physical length and careful placement of the tuning capacitors and switches, performance in terms of selectivity and loss can approximate the selectivity and loss of filters using coaxial coupled lines. As with coaxial coupled lines, the minimum frequency tuning step is determined by the number of switched capacitors which can generally be arranged to give a filter frequency tuning step size that is less than the 3 dB bandwidth of the filter which provides substantially continuous frequency coverage over the tuning range of the filter. A major advantage of this approach is that filters can be built on a single printed wiring board. This approach also presents other advantages such as size reduction, lower material cost and automated assembly of the resonators and tuning elements.

Alternate methods for tuning microstrip filters by changing the length of the microstrip transmission line by shorting sections to ground have been described in Masoud Koochakzadeh and Abbas Abbaspour-Tamijani, "Tunable Filters With Nonuniform Microstrip Coupled Lines," 314 IEEE Microwave And Wireless Components Letters, Vol. 18, No. 5, May 2008, and in U.S. Pat. No. 4,692,724.

Both of these resonator length modification approaches are limited to relatively small numbers of tuning steps due to physical constraints in segmenting the microstrip transmission line.

Figure 4:
FIG. 4 illustrates a three dimensional suspended coupled lines structure.

A second method, illustrated in FIG. 4, for providing a significant improvement in performance over the microstrip approach uses the planar approach of the microstrip filter and converts the microstrip structure to a suspended coupled line structure by replacing the microstrip with line segments on both sides of the board and connecting them with multiple plated vias or slots to form a single resonator. This effectively lowers the resonator loss by increasing the surface area of the resonator. Because the primary dielectric determining the impedance of the resonator is air instead of the board material, this method has the advantage of improving the resonator Q and thereby the power handling capability of the filter. Filters according to this strategy can be realized with specifications that are competitive with the coaxial resonator approach. While somewhat larger in physical size, this approach maintains all of the cost advantages of the microstrip coupled resonator approach.

General steps in the realization of suspended coupled line filters include optimizing the size ratio of suspended lines and the cavity (or characteristic impedance) to achieve the desired resonator Q. The length of the suspended lines (or inductance value) is optimized for frequency, tuning range and desired tuning step size of the filter. Optimization is most easily accomplished using RF EM-simulation software such as Sonnet.

Referring to FIG. 4, in the implementation of suspended coupled lines and a switchable capacitor bank, the suspended lines are fabricated using copper strips or traces on both of the parallel, planar sides of a two-sided board. The traces are connected along their edges through plated-through slots, plated-through holes, or other plated-through passageways or vias.

Figure 5A:
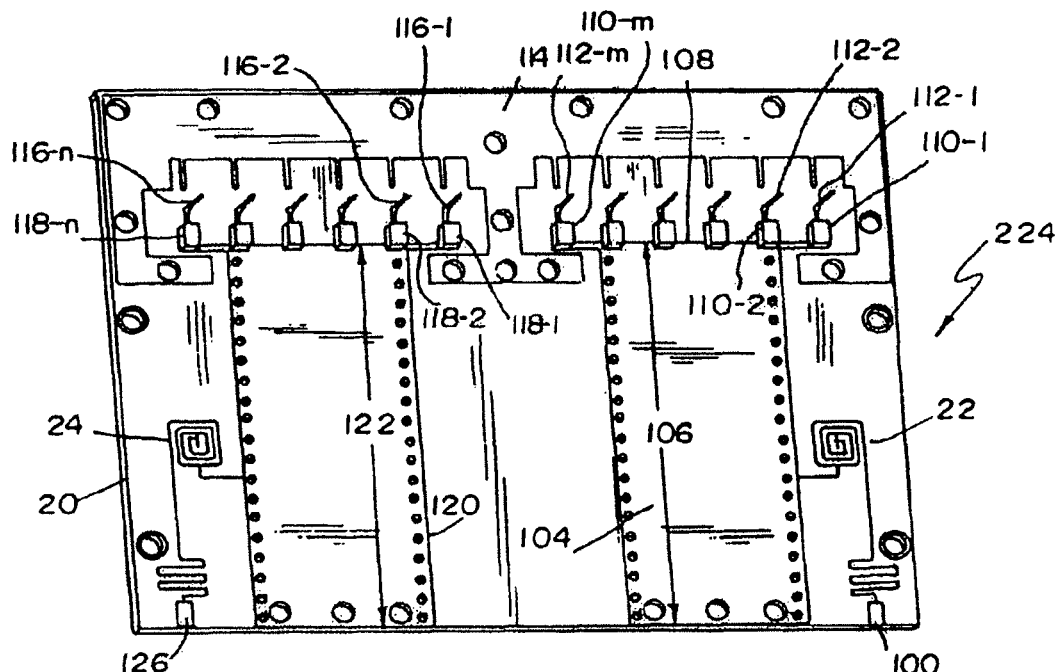
FIGS. 5a and b illustrate a two layer low loss printed wiring board (hereinafter sometimes PWB or PCB) with suspended lines and switched capacitor banks.
Figure 5B:
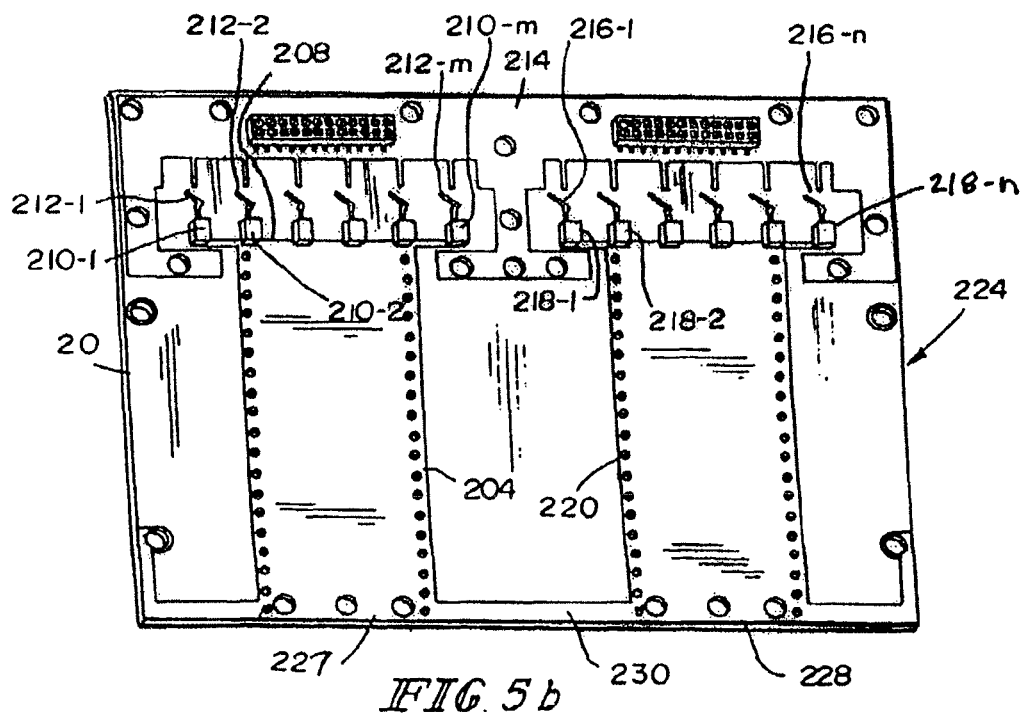

FIGS. 5a and b illustrate a two layer, low loss board with suspended lines and switched capacitor banks. FIG. 5a illustrates the top layer of the filter PCB 20. An enhancement to overall filter performance is achieved by adding low pass filters 22, 24 employing printed inductors to improve rejection at frequencies above the tunable filter passband. Additionally, shunt switches (not shown) on the input 100 and output 126 ports can be used to provide high isolation between input 100 and output 126 ports to provide a high isolation mode (RF OFF mode) for the filter. FIG. 5b illustrates the bottom layer of the filter PCB 20.

In FIG. 5a, input port 100 is coupled through low pass filter trace 22 to an input suspended coupled line trace 104 along its length 106. The trace 104 is terminated at one 108 of its ends at a plurality of switched capacitors 110-1, 110-2, ... 110-m. The capacitors 110-1, 110-2, ... 110-m are switched through a respective plurality of RF switches, such as PIN diodes, FETs, MEMS devices or DTCs, which are illustrated as analog switches 112-1, 112-2, ... 112-m, to a header 114, and through the header 114 and a set of RF switches, such as PIN diodes, FETs, MEMS devices or DTC analog switches 116-1, 116-2, ... 116-n and a respective plurality of switched capacitors 118-1, 118-2, ... 118-n to an output suspended coupled line trace 120. Along its length 122, trace 120 is coupled through low pass filter trace 24 to output port 126.

The suspended coupled line traces 204, 220 on the other side of the filter PCB 20, illustrated in FIG. 5b, are shorted together at their ends 227, 228, respectively, by a header 230. The input suspended coupled line trace 204 is terminated at its end 208 at a plurality of switched capacitors 210-1, 210-2, ... 210-m. The capacitors 210-1, 210-2, ... 210-m are switched through a respective plurality of PIN diodes, FETs or MEMS devices or DTCs illustrated as analog switches 212-1, 212-2, ... 212-m, to a header 214 shorted to header 114 by plated through holes in headers 114, 214, and through the header 214 and a set of PIN diodes, FETs, MEMS devices or DTC analog switches 216-1, 216-2, ... 216-n and a respective plurality of switched capacitors 218-1, 218-2, ... 218-n to the output suspended coupled line trace 220.

In the implementation of the filter, the suspended lines are fabricated using copper traces 104, 204 for the input suspended coupled line and 120, 220 for the output suspended coupled line. Traces 104, 120 and 204, 220 are provided on both sides of a two sided board 20. Traces 104, 204 are connected along their edges through plated through holes. Traces 120, 220 are connected along their edges through plated through holes. Slots and other connector configurations can be used for this purpose as well.

FIGS. 6-10 illustrate the incorporation of a suspended coupled lines tunable filter structure 224 of the type illustrated in FIGS. 5a-b into a high power tunable filter 226. It should be noted that construction of a coupled microstrip filter may be realized in a similar manner. It is understood that a variety of equivalent mechanical structures are possible.

Figure 6:
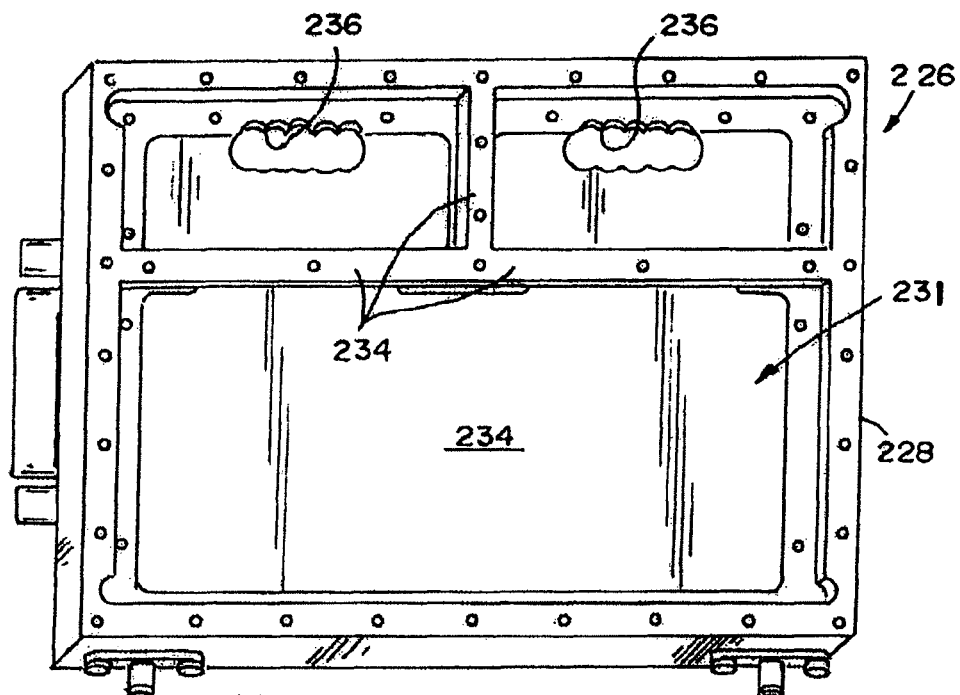
FIGS. 6-10 illustrate a suspended coupled lines tunable filter structure of the type illustrated in FIGS. 5a-b incorporated into a high power tunable filter.
Figure 7:
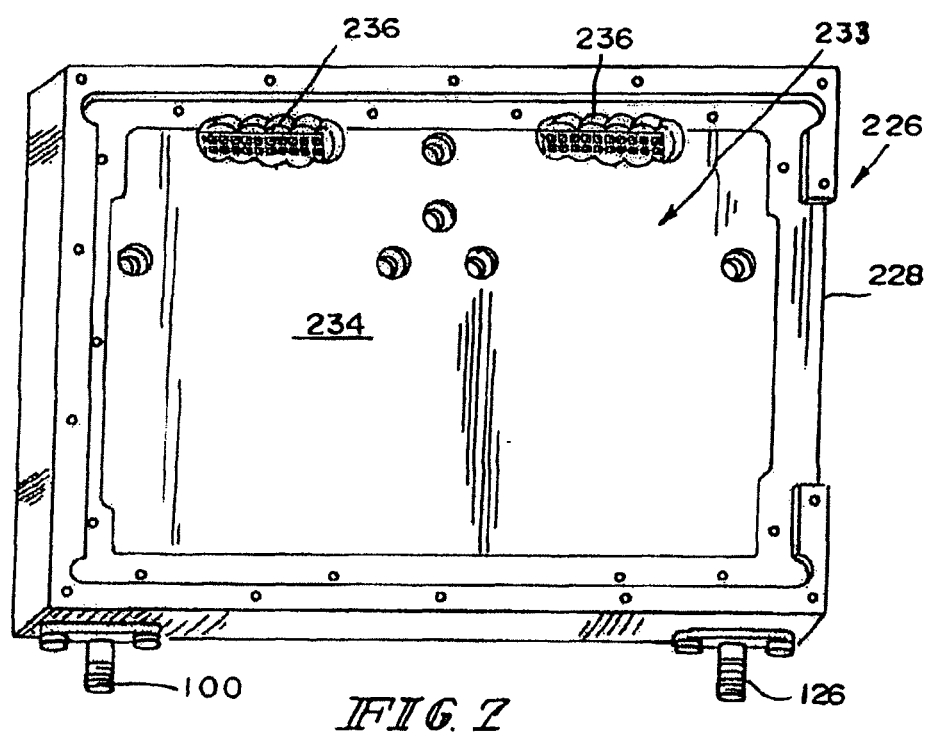
Figure 8:
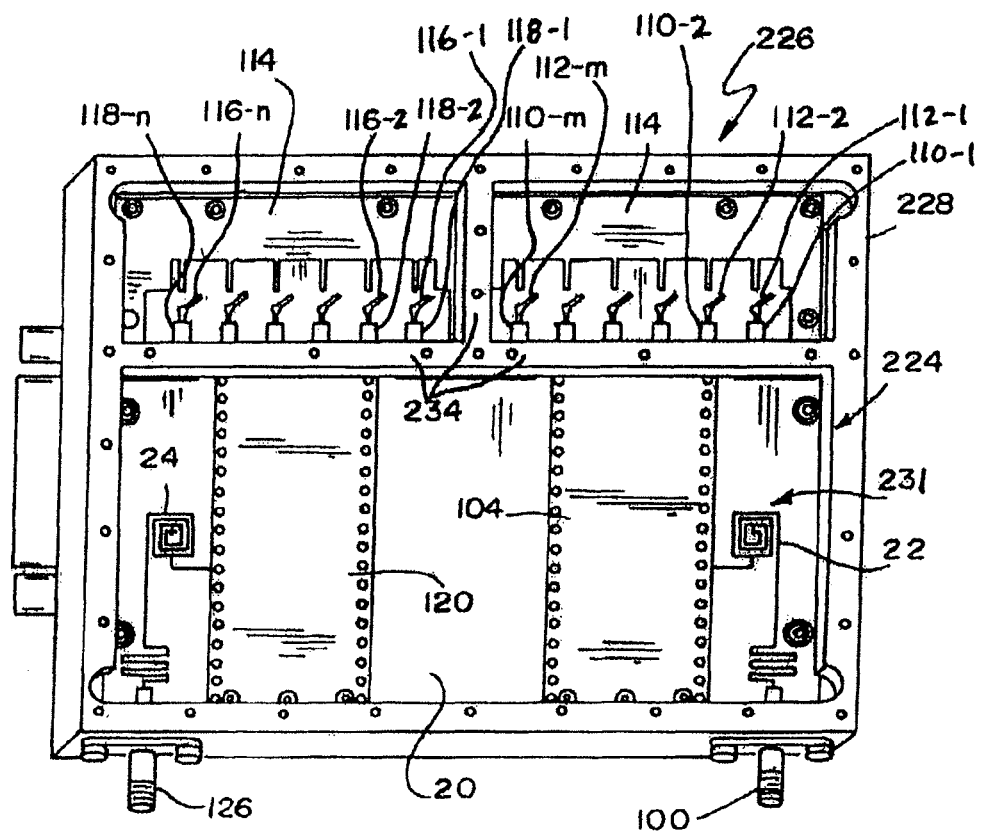
Figure 9:
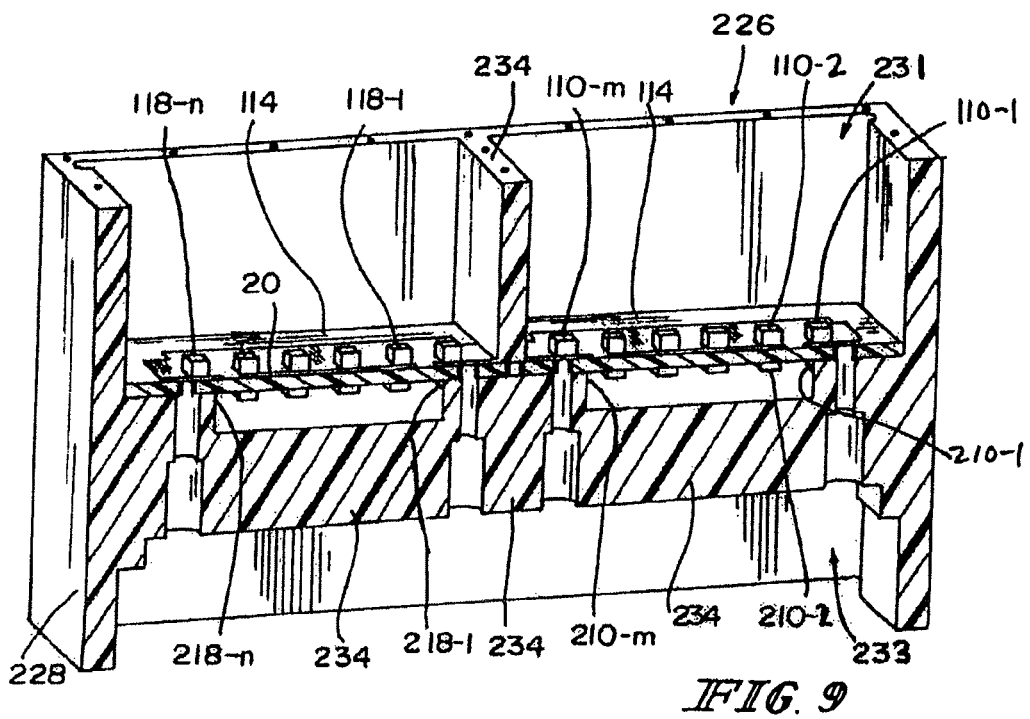
Figure 10:
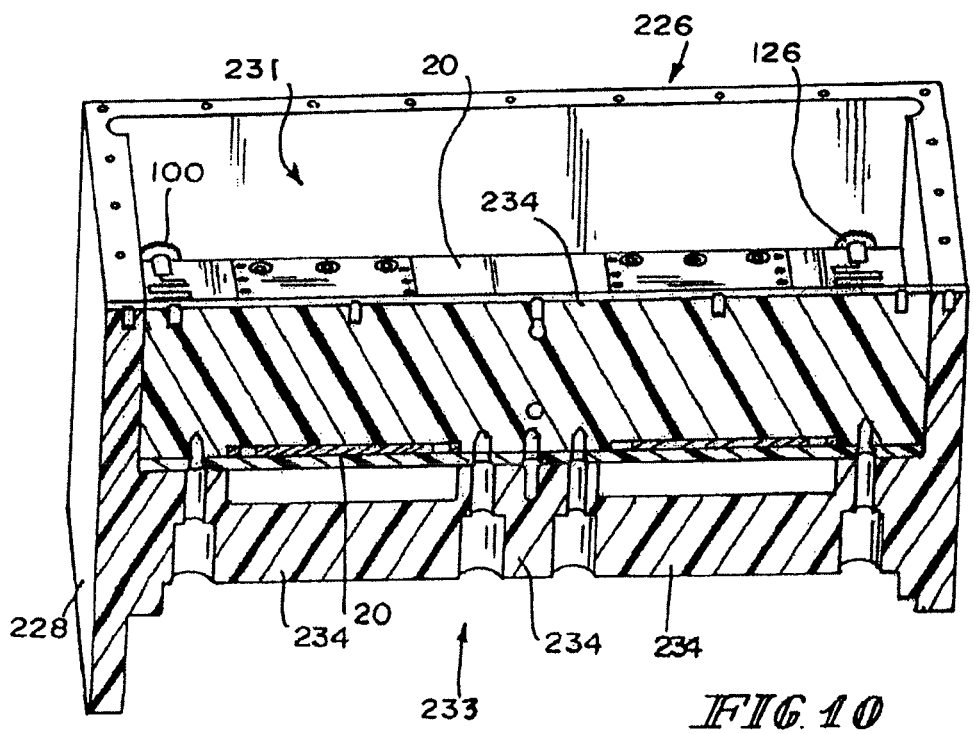

The filter structure 224 is housed in a metal enclosure or housing 229 with two main cavities 231, 233. The RF portion 224 of the filter is mounted in one cavity 231 and the logic interface 232 including the (for example, TTL, not shown) RF switch 112-1, 112-2, ... 112-m, 116-1, 116-2, ... 116-n, 212-1, 212-2, ... 212-m, 216-1, 216-2, ... 216-n drivers is located in the other cavity 232. The cavities 231, 233 are separated by a wall 234 containing access holes 236 for connecting the driver outputs from the logic board 238 to the corresponding RF switches 112-1, 112-2, ... 112-m, 116-1, 116-2, ... 116-n, 212-1, 212-2, ... 212-m, 216-1, 216-2, ... 216-n on the filter board 20. FIG. 6 illustrates the filter side 231 of the tunable filter 226 with filter board 20 removed. FIG. 7 illustrates the logic side 233 of the filter enclosure 229 with the logic board 238 removed. FIG. 8 illustrates the enclosure 229 with the filter board 20 and shielding 234 installed. The metal shielding pieces 234 have two functions. One function is to isolate the capacitor 110-1, 110-2, ... 110-m, 118-1, 118-2, ... 118-n, 210-1, 210-2, ... 210-m, 218-1, 218-2, ... 218-n banks from the suspended line cavity 231. The other is to act as a heat sink in high power applications. FIG. 9 illustrates the switched capacitor 110-1, 110-2, ... 110-m, 118-1, 118-2, ... 118-n, 210-1, 210-2, ... 210-m, 218-1, 218-2, ... 218-n bank section of the tunable filter 226. FIG. 10 illustrates the suspended coupled lines cavity section 231 of the tunable filter 226 with shielding 234.

The switched capacitors 110-1, 110-2, ... 110-m, 118-1, 118-2, ... 118-n, 210-1, 210-2, ... 210-m, 218-1, 218-2, ... 218-n could be replaced with suitable equivalents, such as voltage variable capacitors (for example, varactors), passively tunable integrated circuit (PTIC) capacitors, DTCs, ferroelectric capacitors, or the like with one switch or no switches to tune an octave. An advantage of varactor-based three dimensional filters is lower cost. An advantage of ferroelectric capacitor-based three dimensional filters is higher Q over the full voltage tuning range. Additionally, and as noted earlier in this description, there are now continuously variable microelectromechanical systems (MEMS) devices employing a mechanically movable "flap" that effects the tuning in a small chip-sized device. These may have advantages in power handling.

Tunable filters using coupled microstrip or suspended coupled lines as described have a simpler structure than filters using three dimensional coaxial resonators, yet exhibit similar performance. The reduced complexity of coupled microstrip or suspended coupled lines filters makes them more reliable and lower cost than similar three dimensional filters.

In the descriptions that follow, circuit schematic and block diagrams will be described. In many cases, specific components, specific sources, and in some cases, specific terminal, pin and port names and numbers of those components will be provided. However, it is to be understood that other components capable of performing equivalent functions to those specifically identified components may be available from the same, or different, sources, and that the various terminals, pins and ports of any such equivalent components may have different names and numbers. Thus, this invention is not limited to the specifically identified components or the specifically identified sources.

Figure 11:
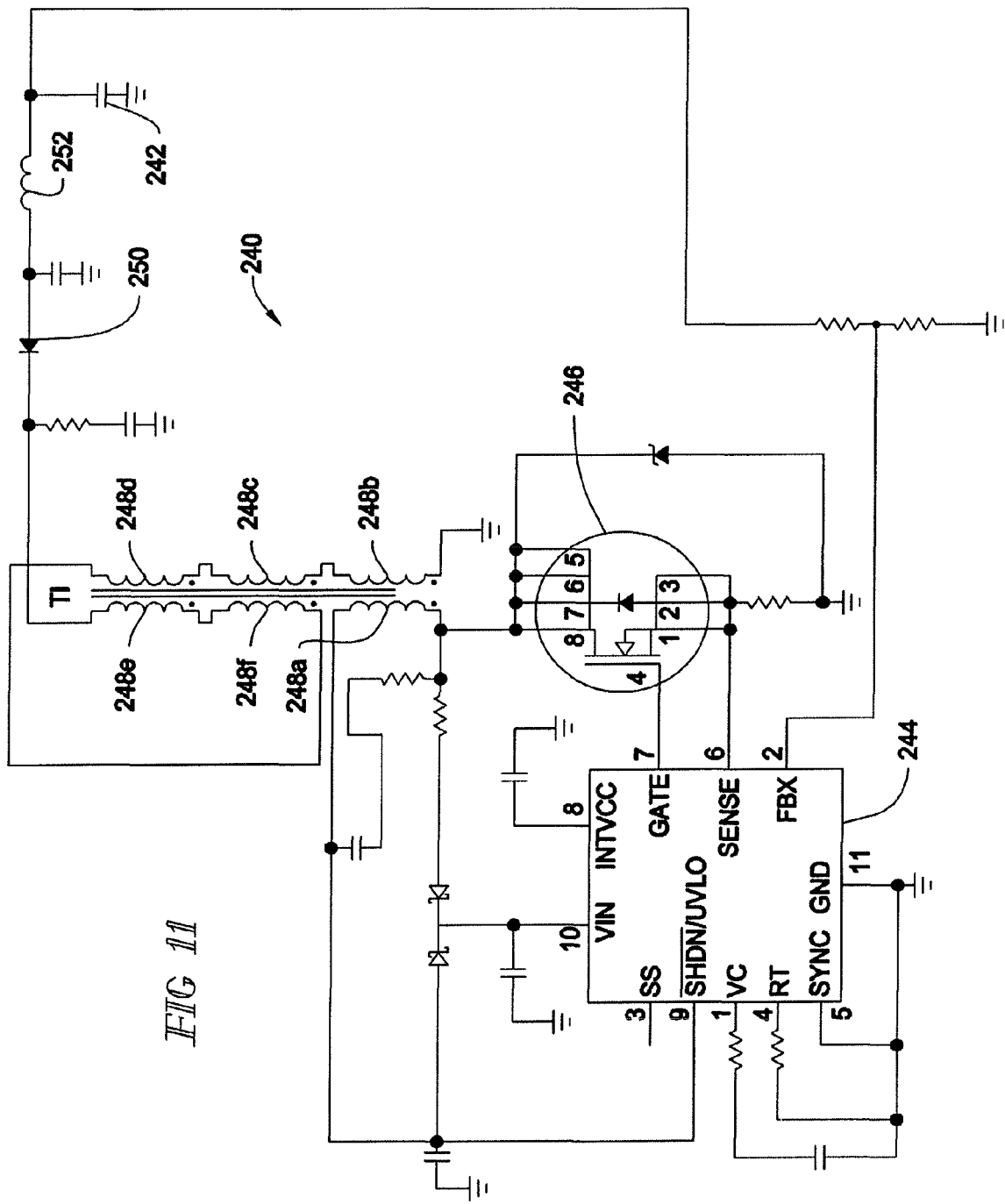
FIG. 11 illustrates a schematic diagram of a power supply for a voltage tunable filter of the type described.

Turning now to FIG. 11, an illustrative voltage tunable filter 226 includes a power supply 240 for supplying −100 VDC VoltageOUTput across a 0.01 μF, 5% tolerance capacitor 242. Power supply 240 includes a Linear Technology type LT3757 boost, flyback, single-ended primary-inductor converter (SEPIC) and inverting controller IC 244, the Gate and Sense terminals, pins 7 and 6, respectively, of which are coupled to the gate and source terminals, pins 4 and 1, 2, 3, respectively, of an International Rectifier type IRF7468 field effect transistor (FET) 246. Source pins 1, 2, 3 of FET 246 are coupled through a 0.03Ω, 1% feedback resistor to ground. The drain terminal, pins 5, 6, 7, 8 of FET 246 is coupled to a terminal of a primary winding 248*a* of a step-up transformer 248. A 33 V Zener diode is coupled across the drain terminal of FET 246 and ground. Either +3.3 VDC or +5 VDC VIN voltage is coupled to the remaining terminal of winding 248*a*. The five series coupled secondary windings 248*b*-248*f* of transformer 248 are coupled between ground and the cathode of a Fairchild Semiconductor ES1G rectifier diode 250. The anode of diode 250 is coupled through a series 10 mH inductor 252 to the ungrounded terminal of capacitor 242. −100 VDC is generated at this terminal.

The remaining components of the power supply circuit 240 include a 100 μF, 20% capacitor across the VIN terminal and ground, a series 3300 pF, 5% capacitor and 10Ω, 5% resistor across primary 248*a*, and an NXP type BAS40-05T dual, common cathode Schottky barrier diode, one anode of which is coupled through a 100Ω, 5% resistor to the drain of FET 246, the other anode of which is coupled to VIN and the cathode of which is coupled to the VIN terminal, pin 10, of IC 244. A 1 μF, 10% capacitor is coupled across pin 10 of IC 244 and ground. A 4.7 μF, 10% capacitor is coupled across the INTVCC terminal, pin 8, of IC 244 and ground. The series combination of a 22 KΩ, %5 resistor and a 3300 pF, 5% capacitor is coupled across the VC terminal, pin 1, of IC 244 and ground. A 66.5 KΩ, 1% resistor is coupled across the RT terminal, pin 4, of IC 244 and ground. The SYNC and GrouND terminals, pins 5 and 11 respectively, of IC 244 are coupled to ground. The notSHutDowN/UnderVoltageLockOut terminal, pin 9, of IC 244 is coupled to VIN. A series resistive voltage divider including a 1 MΩ, 1% resistor and an 8.06 KΩ, 1% resistor is coupled across capacitor 242, dividing the −100 VDC down to about −0.8 VDC which is coupled to the FeedBaX terminal, pin 2, of IC 244. A series 240Ω, 5% resistor and 15 pF, 5% capacitor are coupled across the cathode of diode 250 and ground. A 1.2 μF, 10% capacitor is coupled across the anode of diode 250 and ground.

Turning now to FIGS. 12*a-g*, the circuit including capacitors 110-1, 110-2, . . . 110-*m*, 118-1, 118-2, . . . 118-*n*, 210-1, 210-2, . . . 210-*m*, 218-1, 218-2, . . . 218-*n* and RF switches 112-1, 112-2, . . . 112-*m*, 116-1, 116-2, . . . 116-*n*, 212-1, 212-2, . . . 212-*m*, 216-1, 216-2, . . . 216-*n* is illustrated.

Figure 12B:
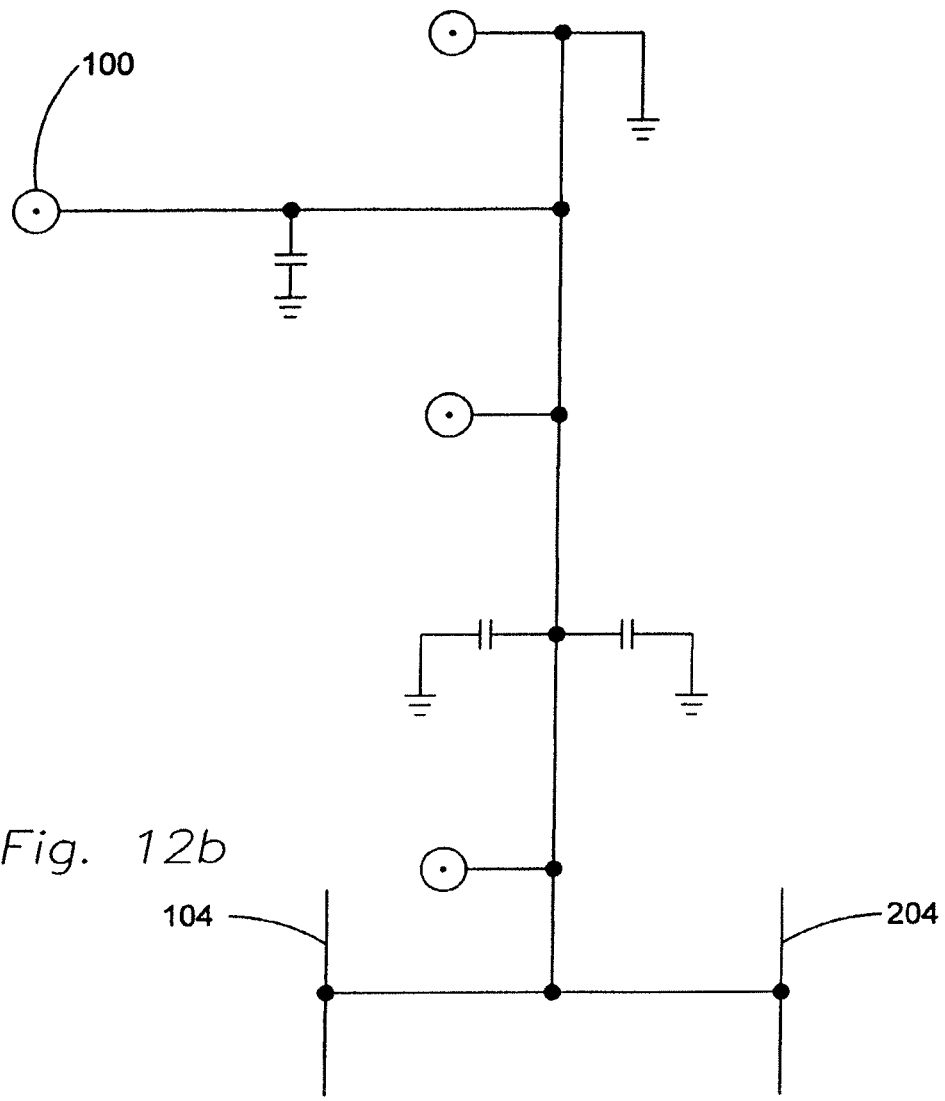

Referring first to FIG. 12*a*, connectors 237-1 and 237-2 accessible through access hole 236 for connecting the driver outputs from the logic board 238 to the corresponding RF switches 112-1, 112-2, . . . 112-*m*, 116-1, 116-2, . . . 116-*n*, 212-1, 212-2, . . . 212-*m*, 216-1, 216-2, . . . 216-*n* on the filter board 20 is illustrated. In the embodiment illustrated in FIGS. 12*a-g*, m and n both equal 6. The illustrated connectors 237 are SAMTEC type SKT 2×12 pin connectors. The even numbered pins of connectors 237 are coupled to ground. Pins 1, 5, 9, 13, 17 and 21 of connector 237-1 and pins 3, 7, 11, 15, 19 and 23 of connector 237-2 are coupled through respective 75Ω resistors to lines V6, V5, V4, V3, V2, V1, V13, V14, V15, V16, V17 and V18, respectively, of filter PCB 20. Pins 3, 7, 11, 15, 19 and 23 of connector 237-1 and pins 1, 5, 9, 13, 17 and 21 of connector 237-2 are coupled through respective 150Ω resistors to lines V12, V11, V10, V9, V8, V7, V19, V20, V21, V22, V23 and V24, respectively, of filter PCB 20.

As best seen in FIG. 12*b*, input port 100 is in the form of a coaxial connector, the inner conductor of which is coupled to input suspended coupled line 104, 204 and the outer conductor (hereinafter sometimes sheath) of which is coupled through an 8.2 pF capacitor to ground.

The illustrated RF switches 112-1, 112-2, 112-3, 112-4, 112-5, 112-6, 116-1, 116-2, 116-3, 116-4, 116-5, 116-6 are realized using type SM0512-M1 PIN diodes available from several sources. The illustrated RF switches 212-1, 212-2, 212-3, 212-4, 212-5, 212-6, 216-1, 216-2, 216-3, 216-4, 216-5, 216-6 are realized using type SM0502-M1 PIN diodes available from several sources. Referring to FIGS. 12*c-f*, the capacitor values are as follows: 110-1, 10 pF; 110-2, 8.2 pF; 110-3, 6.8 pF; 110-4, 5.6 pF; 110-5, 3.9 pF; 110-6, 2.5 pF; 210-1, 1.5 pF; 210-2, 0.8 pF; 210-3, 0.5 pF; 210-4, 0.3 pF; 210-5, 0.2 pF; 210-6, 0.2 pF; 118-1, 10 pF; 118-2, 8.2 pF; 118-3, 6.8 pF; 118-4, 5.6 pF; 118-5, 3.9 pF; 118-6, 2.5 pF; 218-1, 1.5 pF; 218-2, 0.8 pF; 218-3, 0.5 pF; 218-4, 0.3 pF; 218-5, 0.2 pF; and 218-6, 0.2 pF.

Figure 12C:
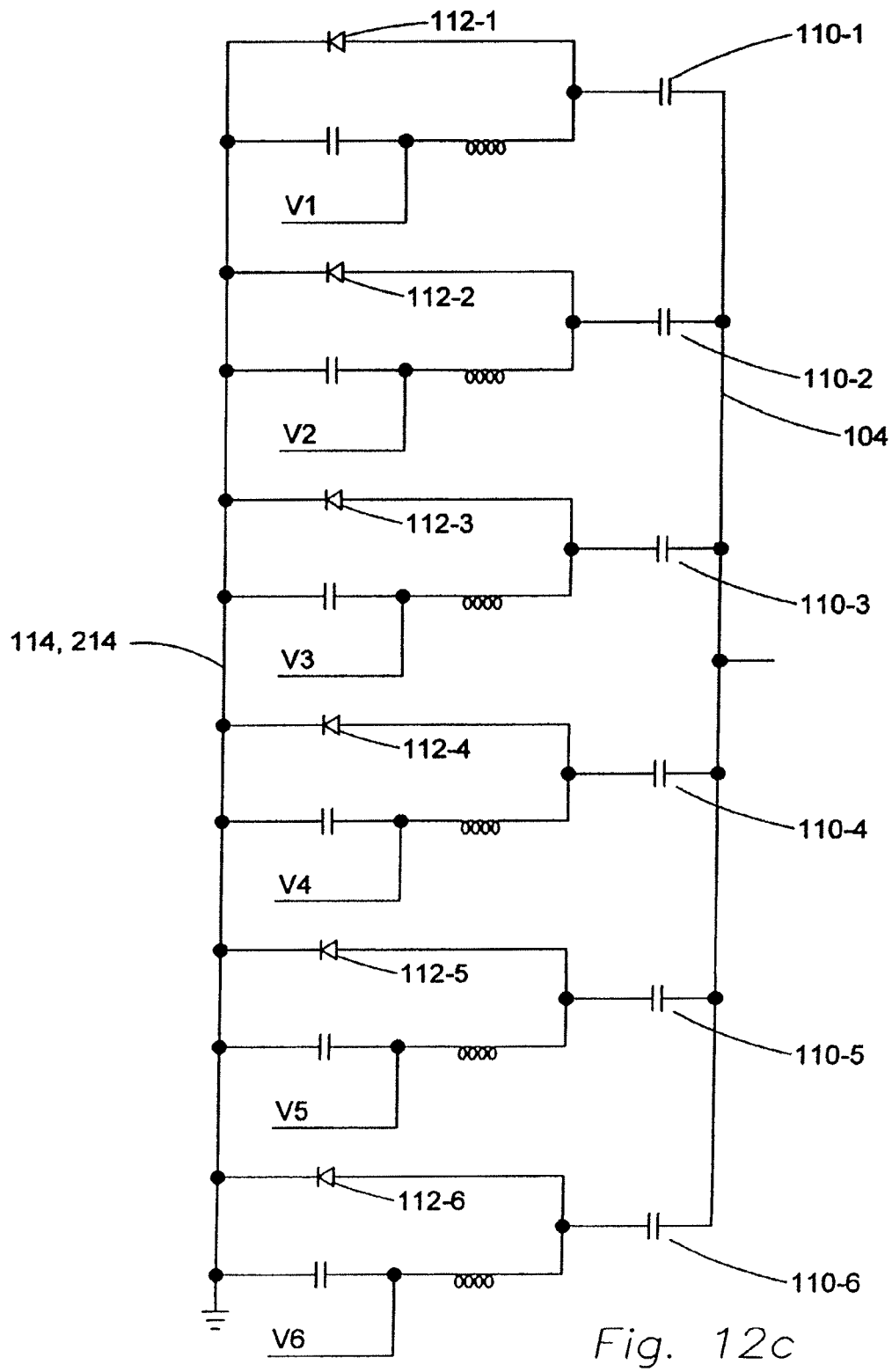

Referring to FIG. 12*c*, the cathodes of diodes 112-1, 112-2, 112-3, 112-4, 112-5, 112-6 are coupled to header 114, 214. The anodes of diodes 112-1, 112-2, 112-3, 112-4, 112-5, 112-6 are coupled to respective capacitors 110-1, 110-2, 110-3, 110-4, 110-5, 110-6. Respective series 510 pF capacitors and 1 μH inductors are coupled across respective diodes 112-1, 112-2, 112-3, 112-4, 112-5, 112-6, with the inductors being coupled to the anodes and the capacitors to the cathodes. Lines V1-V6, respectively, are coupled to the common terminals of the respective series 510 pF capacitors and 1 μH inductors.

Figure 12D:
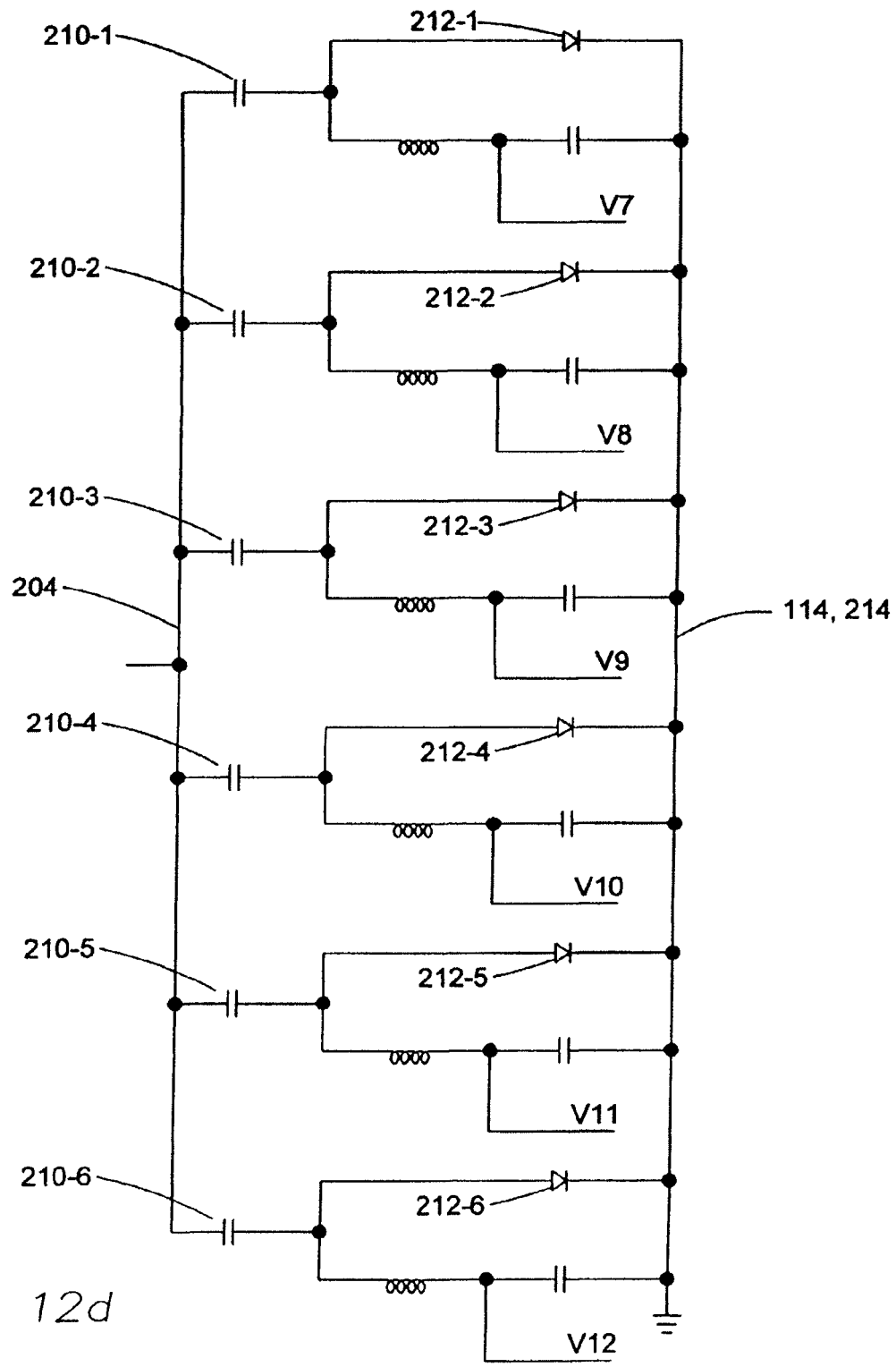

Referring to FIG. 12*d*, the cathodes of diodes 212-1, 212-2, 212-3, 212-4, 212-5, 212-6 are coupled to header 114, 214. The anodes of diodes 212-1, 212-2, 212-3, 212-4, 212-5, 212-6 are coupled to respective capacitors 210-1, 210-2, 210-3, 210-4, 210-5, 210-6. Respective series 510 pF capacitors and 1 μH inductors are coupled across respective diodes 212-1, 212-2, 212-3, 212-4, 212-5, 212-6, with the inductors being coupled to the anodes and the capacitors to the cathodes. Lines V7-V12, respectively, are coupled to the common terminals of the respective series 510 pF capacitors and 1 μH inductors.

Figure 12E:
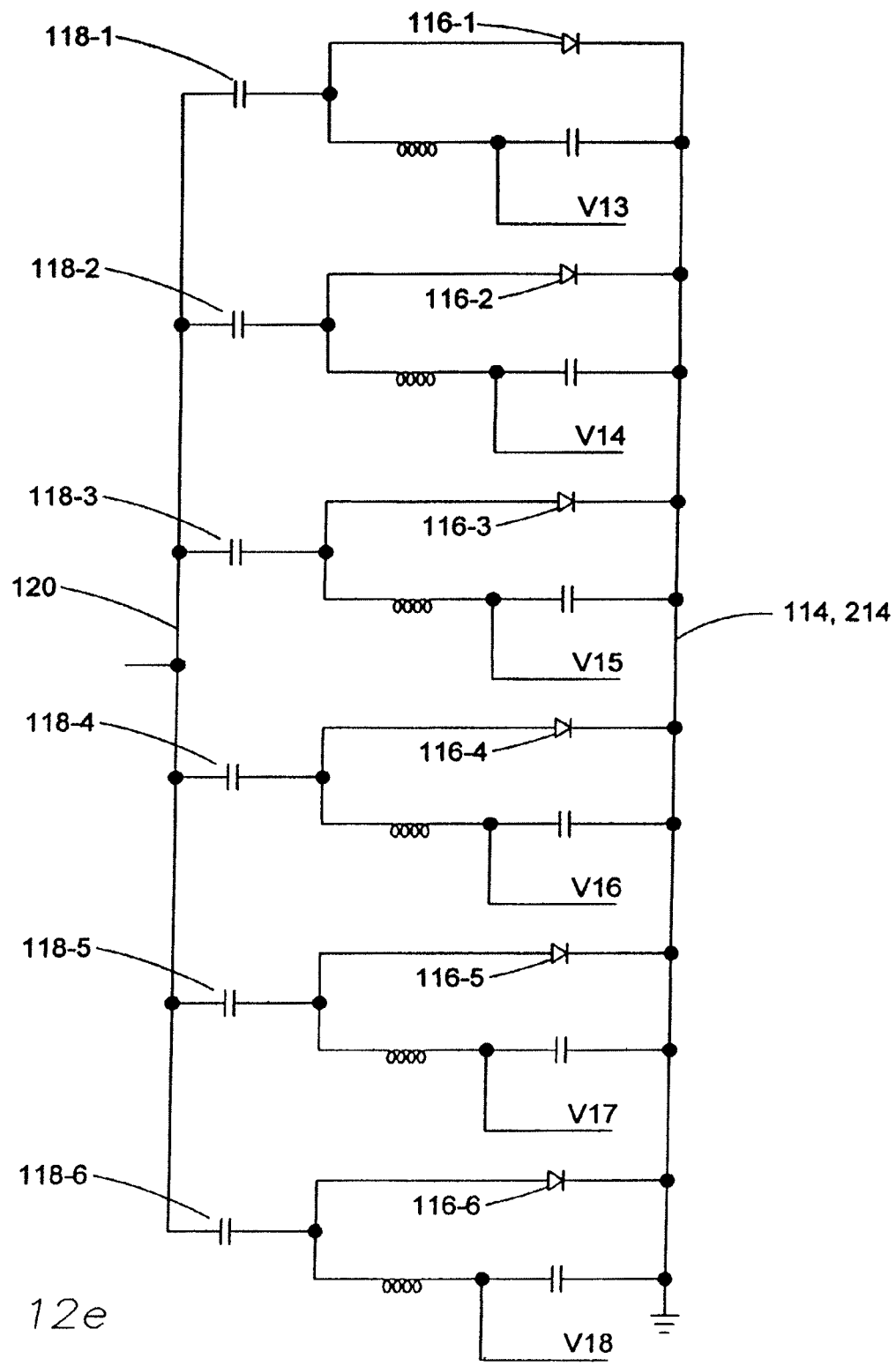

Referring to FIG. 12*e*, the cathodes of diodes 116-1, 116-2, 116-3, 116-4, 116-5, 116-6 are coupled to header 114, 214. The anodes of diodes 116-1, 116-2, 116-3, 116-4, 116-5, 116-6 are coupled to respective capacitors 118-1, 118-2, 118-3, 118-4, 118-5, 118-6. Respective series 510 pF capacitors and 1 μH inductors are coupled across respective diodes 116-1, 116-2, 116-3, 116-4, 116-5, 116-6, with the inductors being coupled to the anodes and the capacitors to the cathodes. Lines V13-V18, respectively, are coupled to the common terminals of the respective series 510 pF capacitors and 1 μH inductors.

Figure 12F:
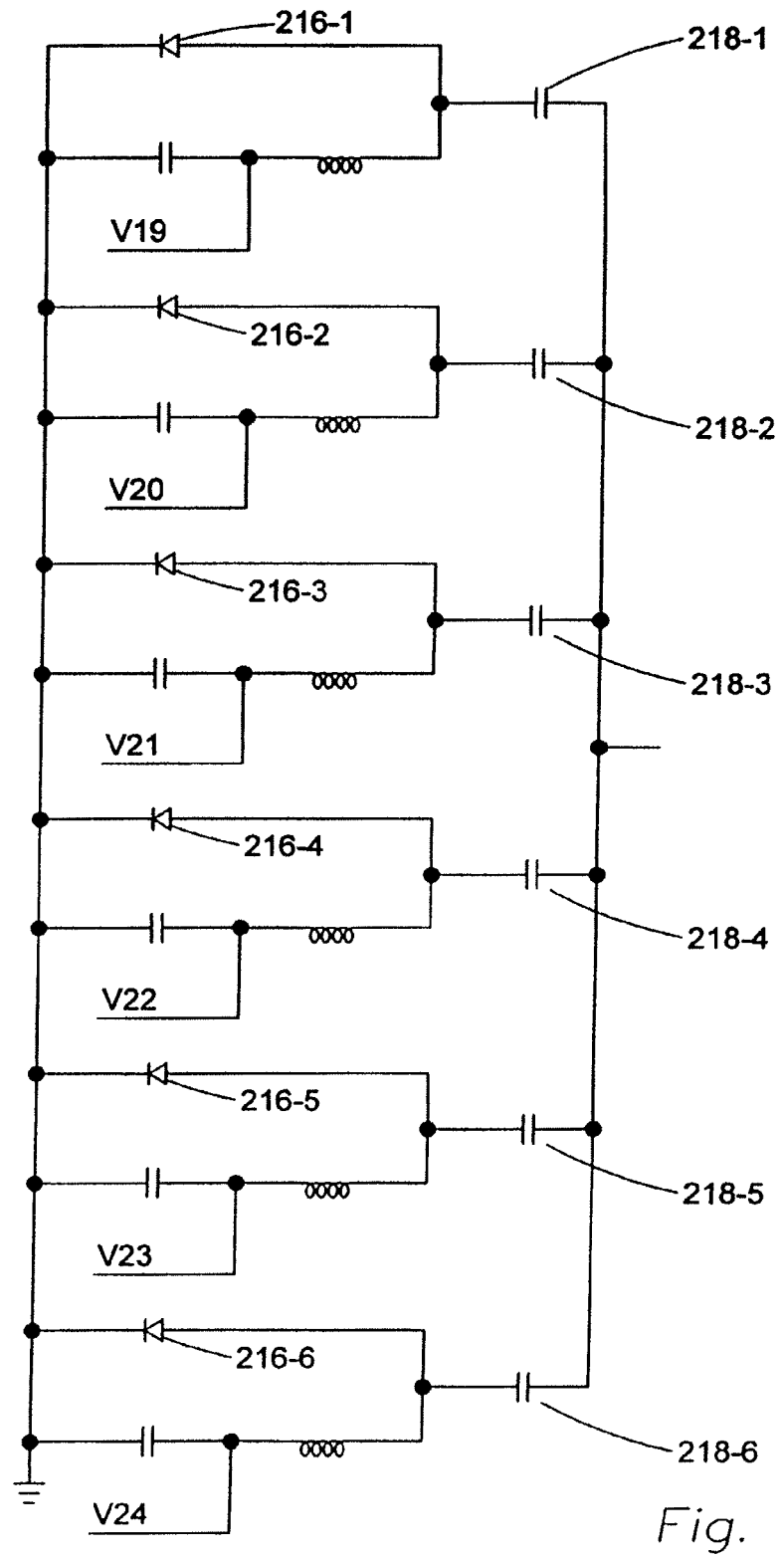

Referring to FIG. 12*f*, the cathodes of diodes 216-1, 216-2, 216-3, 216-4, 216-5, 216-6 are coupled to header 114, 214. The anodes of diodes 216-1, 216-2, 216-3, 216-4, 216-5, 216-6 are coupled to respective capacitors 218-1, 218-2, 218-3, 218-4, 218-5, 218-6. Respective series 510 pF capacitors and 1 μH inductors are coupled across respective diodes 216-1, 216-2, 216-3, 216-4, 216-5, 216-6, with the inductors being coupled to the anodes and the capacitors to the cathodes. Lines V19-V24, respectively, are coupled to the common terminals of the respective series 510 pF capacitors and 1 μH inductors.

Figure 12G:
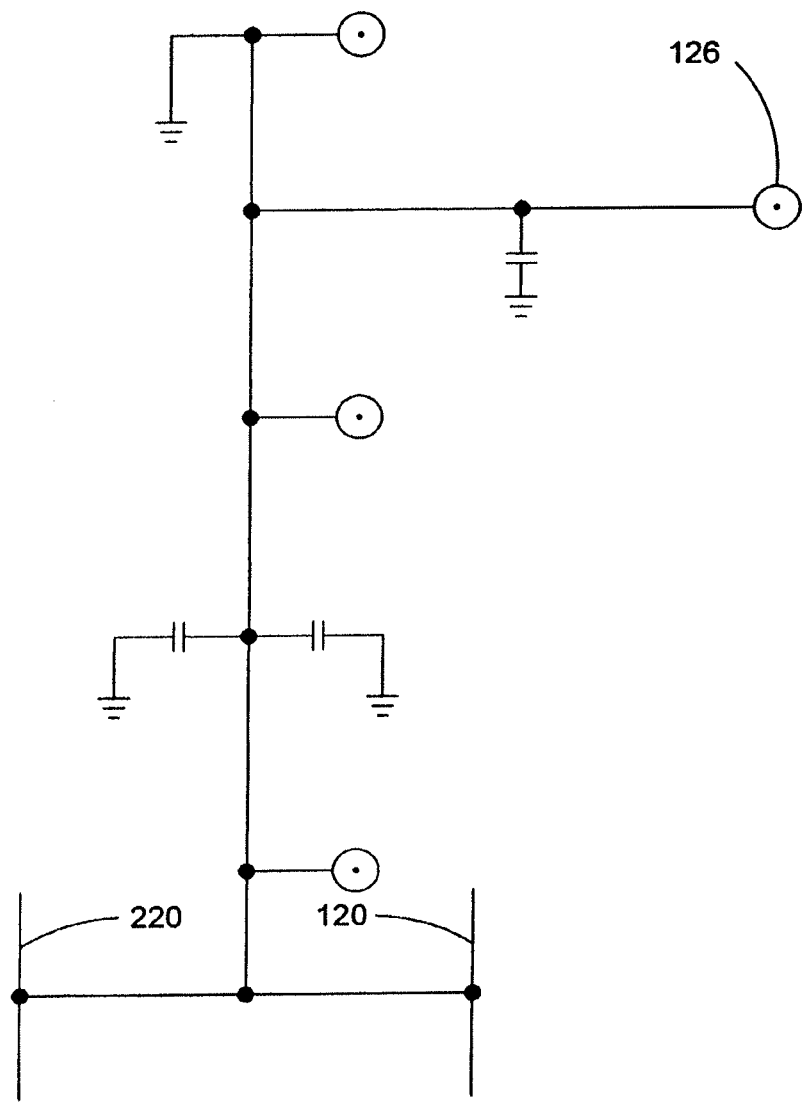

As best seen in FIG. 12*g*, output port 126 is in the form of a coaxial connector, the inner conductor of which is coupled to output suspended coupled line 120, 220 and the sheath of which is coupled to one terminal of an 8.2 pF capacitor, the other terminal of which is coupled to ground.

Figure 13A:
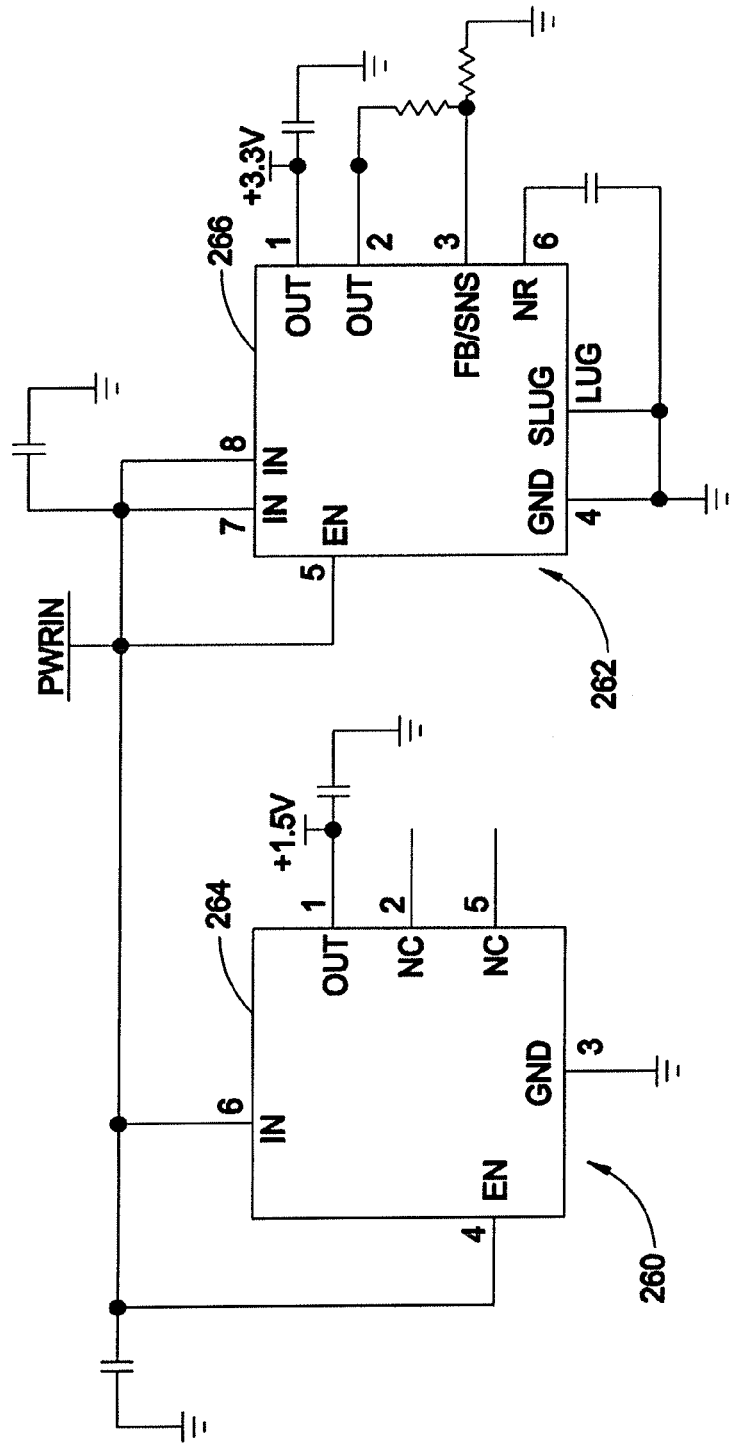
FIGS. 13a-n illustrate schematic circuit diagrams for a logic circuit of the type described.

Turning now to FIGS. 3*a-n*, and particularly to FIG. 13*a*, the logic board 238 includes low voltage power supplies

260, 262 to supply +1.5 VDC and +3.3 VDC to the circuits on board 238. Supply 260 converts either +3.3 VDC or +5 VDC PoWeRIN to +1.5 VDC. PWRIN is coupled to the INput terminal, pin 6, and the ENable terminal, pin 4, of a power supply IC 264, illustratively a Texas Instruments type TPS72715DSE low dropout voltage regulator. The GrouND terminal, pin 3, of IC 264 is coupled to ground. +1.5 VDC appears across a 1 µF, 10% capacitor coupled between the OUTput terminal, pin 1, of IC 264 and ground.

PWRIN is also coupled to the INput terminals, pins 7 and 8, and the ENable terminal, pin 5, of a +3.3 VDC power supply IC 266, illustratively, a Texas Instruments type TPS7A8001DRBR low dropout voltage regulator. The NoiseReduction terminal, pin 6, of IC 266 is coupled through a 0.1 µF, 5% capacitor to ground. The GrouND terminal, pin 4, and SurfacemountLUG of IC 266 are coupled to ground. The FeedBack/SeNSe terminal, pin 3, of IC 266 is coupled through a 10 KΩ, 1% resistor to ground. The OUTput terminals, pins 1 and 2, are coupled through a 22 µF, 10% capacitor to ground and through a 30.9 KΩ, 1% resistor to pin 3 of IC 266. +3.3 VDC appears across pins 1, 2 and ground.

Figure 13B:
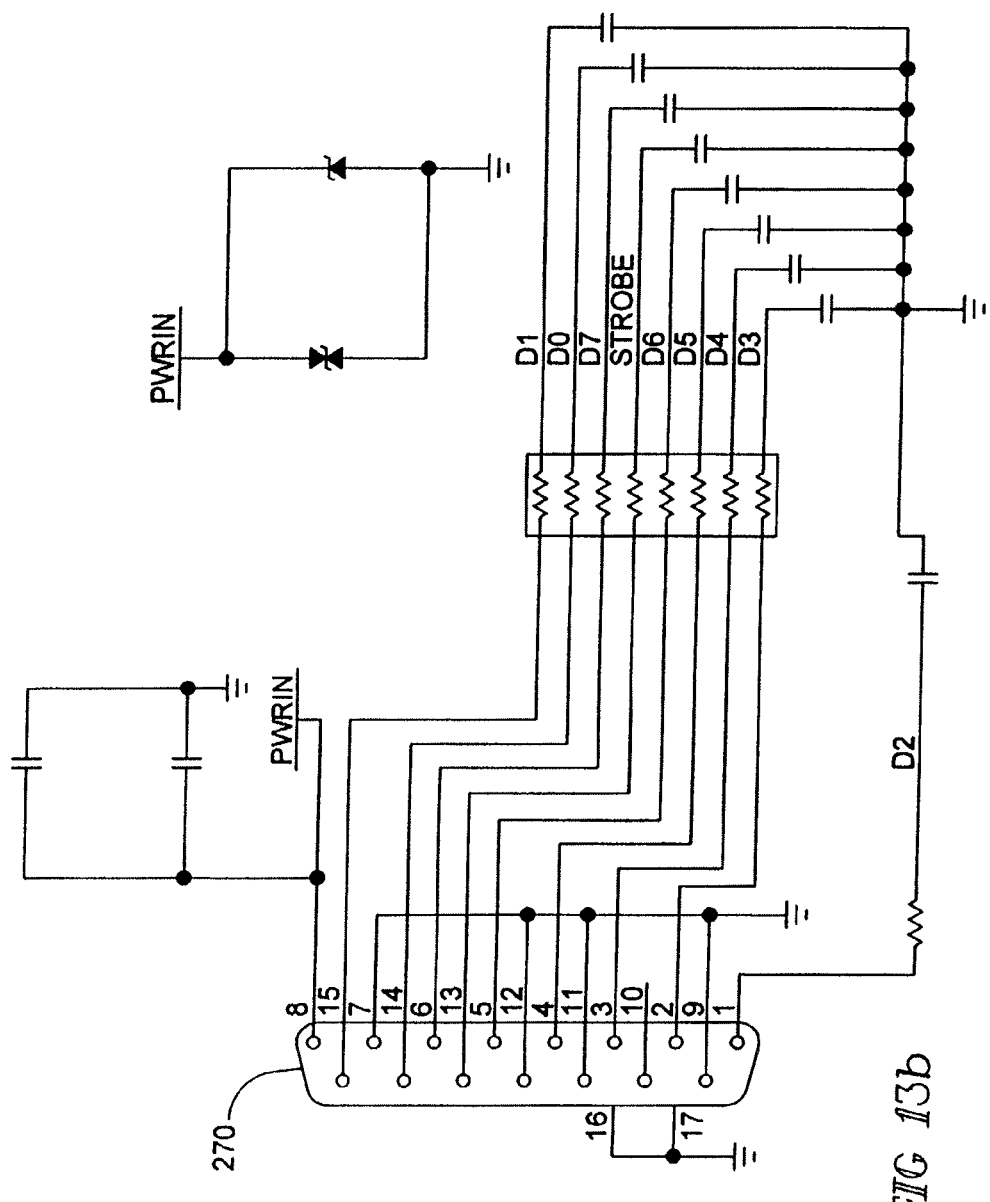

Turning now to FIG. 13*b*, board 238 further includes a 15-pin D connector 270, pins 1-6 and 13-15 of which are coupled through respective series RC circuits including 10Ω resistors and 1000 pF, 10% capacitors to ground. All resistors are 10% tolerance except the one on pin 1, which is 5%. Pins 7, 9, 11, 12, 16 and 17 of connector 270 are coupled to ground. Pin 8 of connector 270 is coupled to PWRIN and through parallel coupled 22 µF, 10% and 3300 pF, 5% capacitors to ground. Board 238 also includes a bidirectional 5 V Zener diode and a 20 V SBR 3A Schottky diode coupled in parallel between PWRIN and ground.

Referring now to FIG. 13*c*, board 238 further includes a field programmable gate array (hereinafter sometimes FPGA) IC 276, such as, for example, an Actel type AGLN030V5-Z FPGA. The filter 226 CONTROL0-CONTROL3 lines, BDATA7-BDATA0 lines, STROBE3V line, RESET line, FLASH WriteProtect line, FLASH0 WriteEnable line, FLASH ADDRESS7-FLASHADDRESS0 lines, FLASH0 OutputEnable line, FLASH1 DATA0-FLASH1 DATA7 lines and FLASH0 DATA0-FLASH0 DATA7 lines are coupled, respectively, to pins 73, 72, 71, 70, 69, 65, 64, 63, 62, 61, 60, 59, 57, 79, 35, 33, 36, 40, 41, 42, 43, 44, 45, 46, 34, 2, 3, 4, 5, 6, 7, 8, 10, 11, 12, 13, 14, 15, 16, 19 and 20 of FPGA 276. The FLASH1 WriteEnable and FLASH1 OutputEnable lines are coupled to pins 32 and 31, respectively, of FPGA 276. The FLASH2 DATA0-FLASH2 DATA7 lines and FLASH3 DATA0-FLASH3-DATA7 lines are coupled, respectively, to pins 93, 94, 95, 96, 97, 98, 99, 100, 82, 83, 84, 85, 86, 90, 91 and 92 of FPGA 276. The VCC terminals, pins 17, 37, 68 and 89, of FPGA 276 are coupled to +1.5 VDC and through a 0.1 µF, 5% capacitor to ground. The VCCIB0-VCCIB1 terminals, pins 66, 87, 18 and 39, of FPGA 276 are coupled to +3.3 VDC and through a 0.1 µF, 5% capacitor to ground. The VPUMP and VJTAG terminals, pins 52 and 56, of FPGA 276 are coupled to +3.3 VDC and through a 0.1 µF, 5% capacitor to ground. The TReSeT, TMS, TransferData1, TD0 and TClocK terminals, pins 55, 49, 48, 54 and 47 of FPGA 276 are coupled to pins 8, 5, 9, 3 and 1, respectively, of a 10 pin programming connector JP1. The TCK terminal is also coupled through a 1K, 5% resistor to ground. The GrouND terminals, pins 1, 9, 38, 51, 57 and 66, of FPGA 276 are all coupled to ground.

Referring now to FIG. 13*d*, board 238 further includes a 16 Mb flash memory 280-1 and low voltage, 16-bit buffer/line driver 282-1. 16 Mb flash memory 280-1 illustratively is a Numonyx type M28W160ECB flash memory. Buffer/line driver 282-1 illustratively is a Fairchild type 74ALVC16244 buffer/line driver. The filter 226 FLASH ADDRESS0-FLASH ADDRESS7 lines are coupled to the A0-A7 terminals, pins 25-18, respectively, of flash memory 280-1. The notOutputEnable, notWriteEnable, notRESET and notWriteProtect terminals, pins 28, 11, 12 and 14, respectively, of flash memory 280-1 are coupled to the filter 226 FLASH0 OE, FLASH0 WE, RESET and FLASH WP lines. The A8-A19 terminals, pins 8-1, 48 and 17-15, respectively, of flash memory 280-1, pins 9, 10, the GND terminals, pins 27 and 46, and the notChipEnable terminal, pin 26, of flash memory 280-1 are all coupled to ground. The D0-D15 terminals, pins 29, 31, 33, 35, 38, 40, 42, 44, 30, 32, 34, 36, 39, 41, 43 and 45, respectively, of flash memory 280-1 form the FLASH1 DATA0-FLASH1 DATA7 and FLASH0 DATA0-FLASH0 DATA7 lines, respectively, of filter 226. The VPP, VCCQ and VCC terminals, pins 13, 47 and 37, respectively, of flash memory 280-1 are coupled to +3.3 VDC and through a 0.1 µF, 5% capacitor to ground.

The I15-I0 terminals, pins 26, 27, 29, 30, 32, 33, 35, 36, 37, 38, 40, 41, 43, 44, 46 and 47, respectively, of buffer/line driver 282-1 are coupled to the FLASH1 DATA7-FLASH 1 DATA0 and FLASH0 DATA7-FLASH0 DATA0 lines, respectively, of filter 226. The O15-O0 terminals, pins 23, 22, 20, 19, 17, 16, 14, 13, 12, 11, 9, 8, 6, 5, 3 and 2, respectively, of buffer/line driver 282-1 are coupled to the FLASH1 DATA7-FLASH1 DATA0 and FLASH0 DATA7-FLASH0 DATA0 lines, respectively, of filter 226. The GND terminals, pins 4, 10, 15, 21, 28, 34, 39 and 45, of buffer/line driver 282-1 are coupled to ground. The notOutputEnable1, notOE2, notOE3 and notOE4 terminals, pins 1, 48, 25 and 24, respectively, of buffer/line driver 282-1 are coupled to ground. The VCC terminals, pins 7, 18, 31 and 42, respectively, of buffer/line driver 282-1 are coupled to +3.3 VDC, and through a 0.1 µF, 5% capacitor to ground.

Referring now to FIG. 13*e*, board 238 further includes a 16 Mb flash memory 280-2 and low voltage, 16-bit buffer/line driver 282-2. 16 Mb flash memory 280-2 illustratively also is a Numonyx type M28W160ECB flash memory. Buffer/line driver 282-2 illustratively also is a Fairchild type 74ALVC16244 buffer/line driver. The filter 226 FLASH ADDRESS0-FLASH ADDRESS7 lines are coupled to the A0-A7 terminals, pins 25-18, respectively, of flash memory 280-2. The notOutputEnable, notWriteEnable, notReSeT and notWriteProtect terminals, pins 28, 11, 12 and 14, respectively, of flash memory 280-2 are coupled to the filter 226 FLASH1 OE, FLASH1 WE, RESET and FLASH WP lines. The A8-A19 terminals, pins 8-1, 48 and 17-15, respectively, of flash memory 280-2, pins 9, 10, the GND terminals, pins 27 and 46, and the notChipEnable terminal, pin 26, of flash memory 280-2 are all coupled to ground. The D0-D15 terminals, pins 29, 31, 33, 35, 38, 40, 42, 44, 30, 32, 34, 36, 39, 41, 43 and 45, respectively, of flash memory 280-2 form the FLASH2 DATA0-FLASH2 DATA7 and FLASH3 DATA0-FLASH3 DATA7 lines, respectively, of filter 226. The VPP, VCCQ and VCC terminals, pins 13, 47 and 37, respectively, of flash memory 280-2 are coupled to +3.3 VDC and through a 0.1 µF, 5% capacitor to ground.

The I15-I8 terminals, pins 26, 27, 29, 30, 32, 33, 35 and 36, respectively, of buffer/line driver 282-2 are coupled to ground. The I7-I0 terminals, pins 37, 38, 40, 41, 43, 44, 46 and 47, respectively, of buffer/line driver 282-2 are coupled to the FLASH3 DATA7-FLASH3 DATA 0 lines, respectively, of filter 226. The O7-O0 terminals, pins 12, 11, 9, 8, 6, 5, 3 and 2, respectively, of buffer/line driver 282-2 are coupled to the FLASH2 DATA7-FLASH2 DATA0 lines, respectively, of filter 226. The GND terminals, pins 4, 10, 15, 21, 28, 34, 39 and 45, of buffer/line driver 282-2 are coupled to ground. The notOutputEnable1, notOE2, notOE3 and notOE4 terminals, pins 1, 48, 25 and 24, respectively, of buffer/line driver 282-2 are coupled to ground. The VCC terminals, pins 7, 18, 31 and 42, respectively, of buffer/line driver 282-2 are coupled to +3.3 VDC, and through a 0.1 µF, 5% capacitor to ground.

Figure 13F:
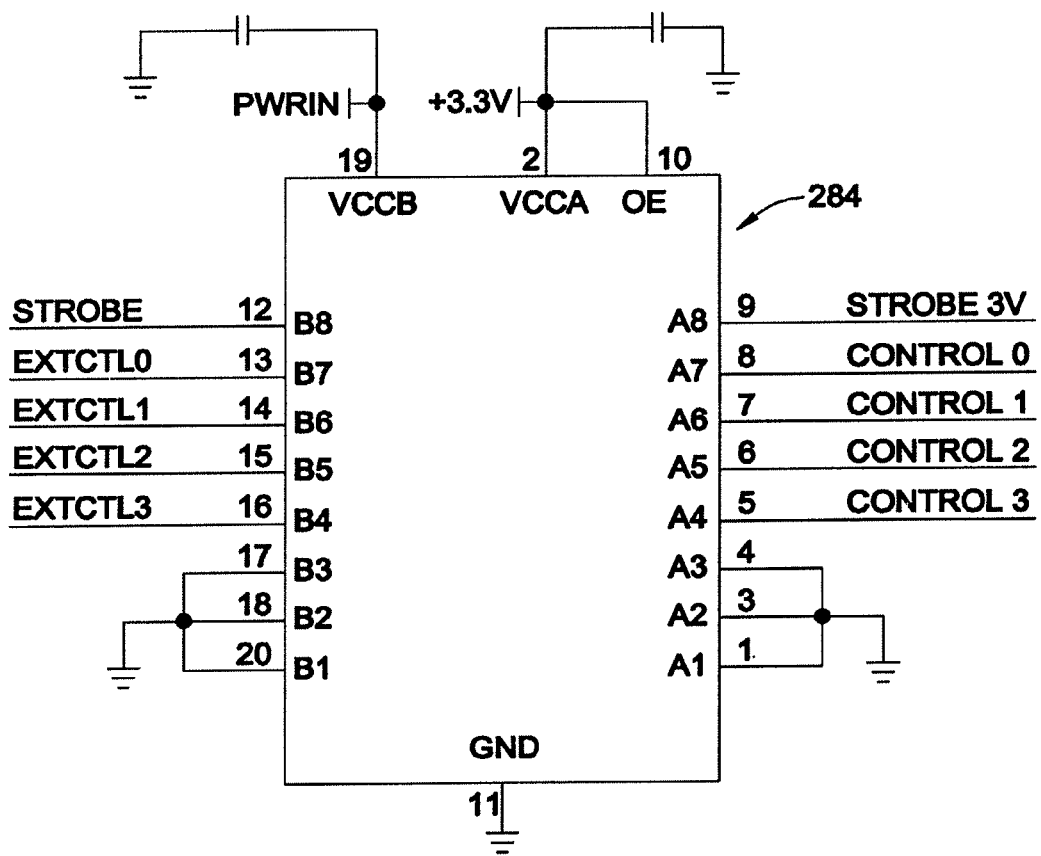
Figure 13G:
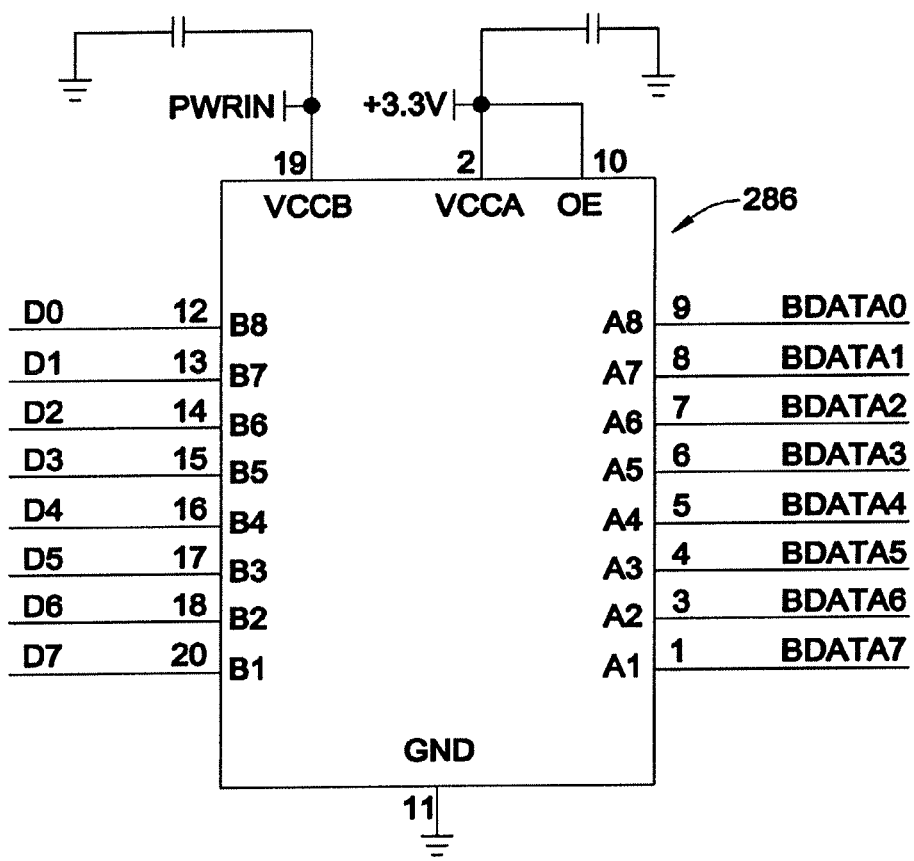

Referring now to FIGS. 13f-g, board 238 further includes two eight-bit level shifters 284, 286 for shifting data between PWRIN level and +3.3 VDC level. Level shifters 284, 286 illustratively are Texas Instruments type TXB0108PWR eight-bit level shifters. The filter 226 STROBE, EXTernalConTroL0, EXTCTL1, EXTCTL2 and EXTCTL3 lines are coupled to terminals B8-B4, pins 12-16, respectively, of level shifter 284. Terminals A8-A4, pins 9-5, respectively, of level shifter 284 are coupled to the STROBE3V, CONTROL0, CONTROL1, CONTROL2 and CONTROL3 lines, respectively, of filter 226. Terminals B3-B1, A3-A1 and GND, pins 17, 18, 20, 4, 3, 1 and 11, respectively, of level shifter 284 are coupled to ground. Terminal VCCB, pin 19, of level shifter 284 is coupled to PWRIN and through a 0.1 µF, 5% capacitor to ground. Terminals VCCA and OE, pins 2 and 10, respectively, of level shifter 284 are coupled to +3.3 VDC and through a 0.1 µF, 5% capacitor to ground.

Referring now to FIG. 13g, The filter 226's D0-D7 and BDATA0-BDATA7 lines are coupled to the B8-B1 and A8-A1 terminals, pins 12-18, 20, 9-3 and 1, respectively, of level shifter 286. The GND terminal, pin 11, of level shifter 286 is coupled to ground. The VCCB terminal, pin 19, of level shifter 286 is coupled to PWRIN and through a 0.1 µF, 5% capacitor to ground. The VCCA and OE terminals, pins 2 and 10, respectively, of level shifter 286 are coupled to +3.3 VDC and through a 0.1 µF, 5% capacitor to ground.

Figure 13H:
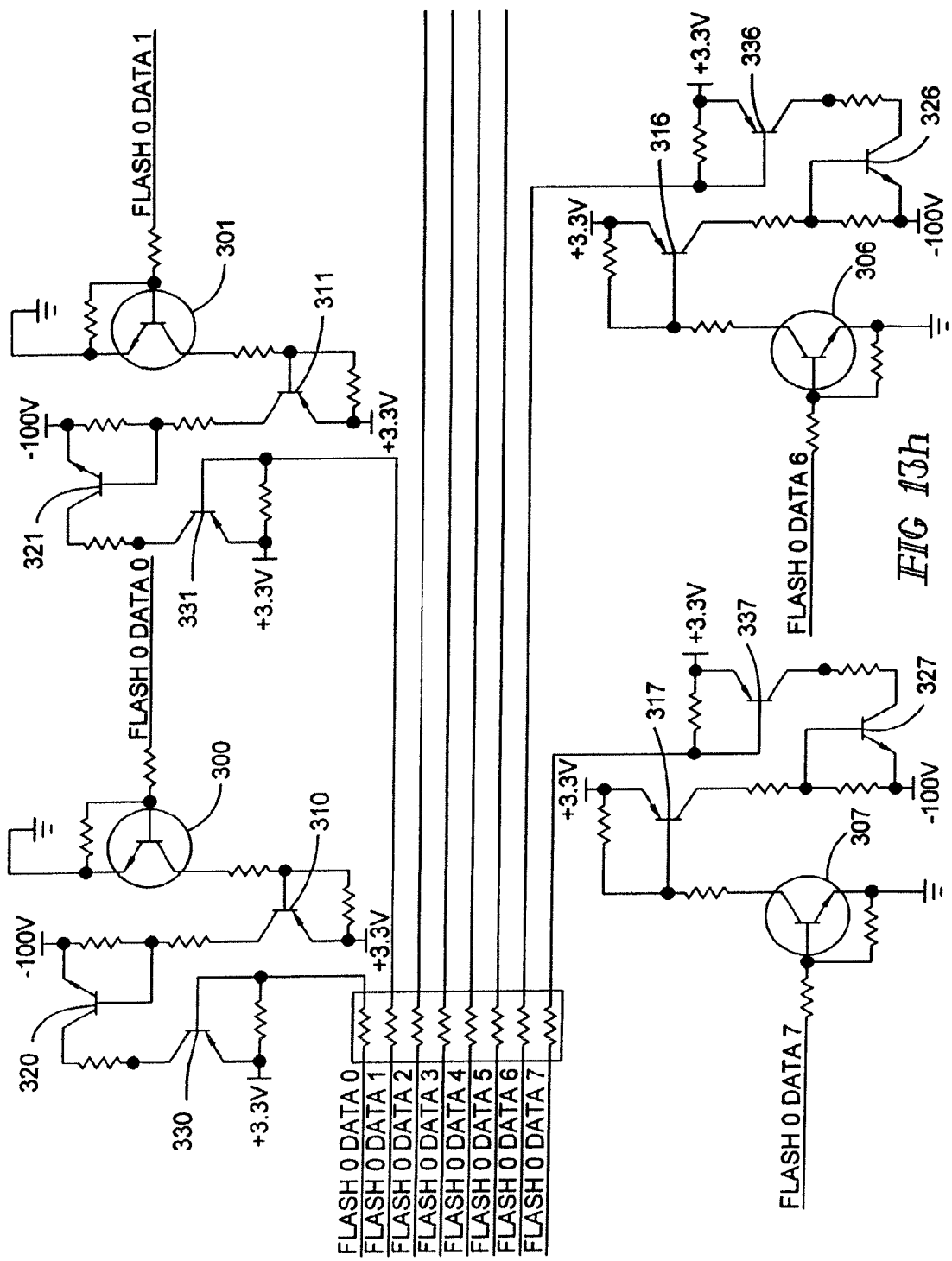
Figure 13I:
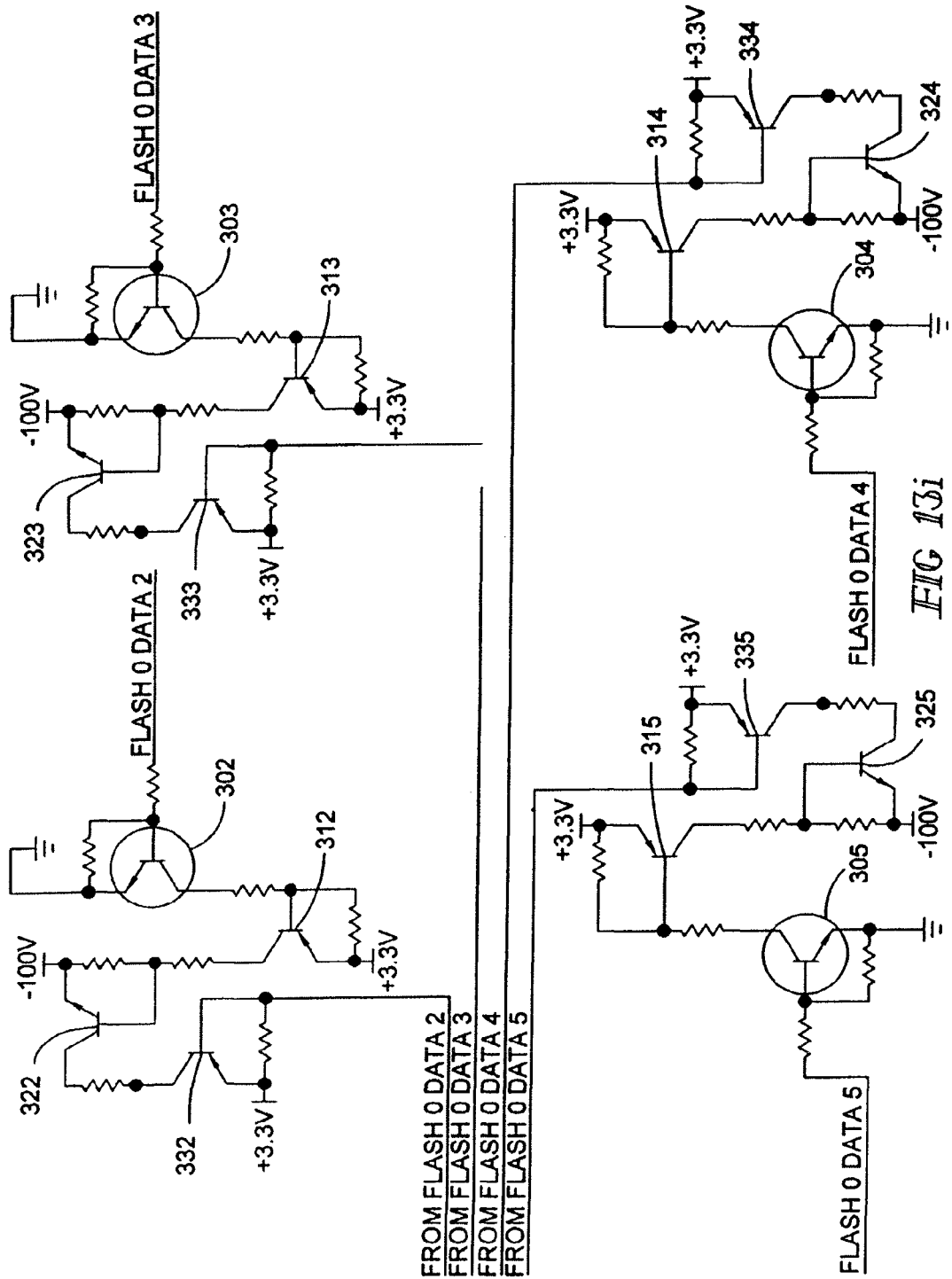

Referring now to FIGS. 13h-i, the filter 226's FLASH0 DATA0-FLASH0 DATA7 lines are coupled through respective 10 KΩ resistors to the bases of respective digital NPN transistors 300-307, illustratively, ON Semiconductor type DTC114EET1G transistors. The bases of transistors 300-307 are also coupled through respective 10 KΩ resistors to ground. The emitters of transistors 300-307 are coupled to ground. The collectors of transistors 300-307 are coupled through respective series pairs of 1 KΩ, 5% resistors to +3.3 VDC. The junction of each respective series pair of 1 KΩ, 5% resistors is coupled to the base of a respective type MMSTA92 PNP transistor 310-317. The collector of each transistor 310-317 is coupled through a respective 100 KΩ, 5% resistor to the base of a respective type MMSTA42 NPN transistor 320-327. The base of each transistor 320-327 is coupled through a respective 1 KΩ, 5% resistor to its emitter. The emitter of each transistor 320-327 is coupled to −100 VDC. The filter 226's FLASH0 DATA0-FLASH0 DATA7 lines are also coupled through respective 1 KΩ, 10% resistors to the bases of respective type MMBTA92 PNP transistors 330-337. The bases of transistors 330-337 are coupled through respective 1 KΩ, 5% resistors to their respective emitters and to +3.3 VDC. The collectors of transistors 330-337 are coupled through respective 20 KΩ, 5% resistors to the collectors of respective transistors 320-327.

Figure 13J:
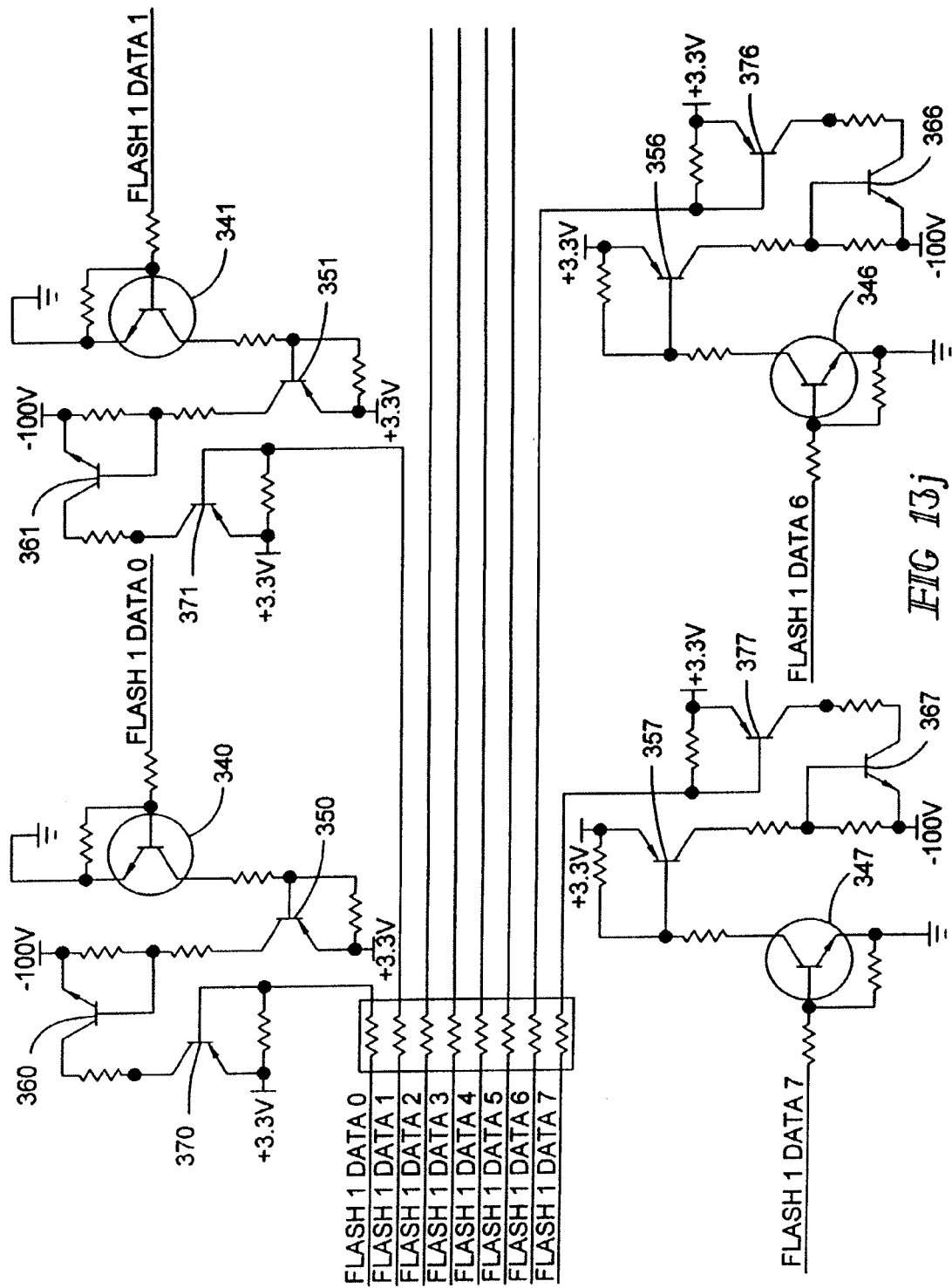
Figure 13K:
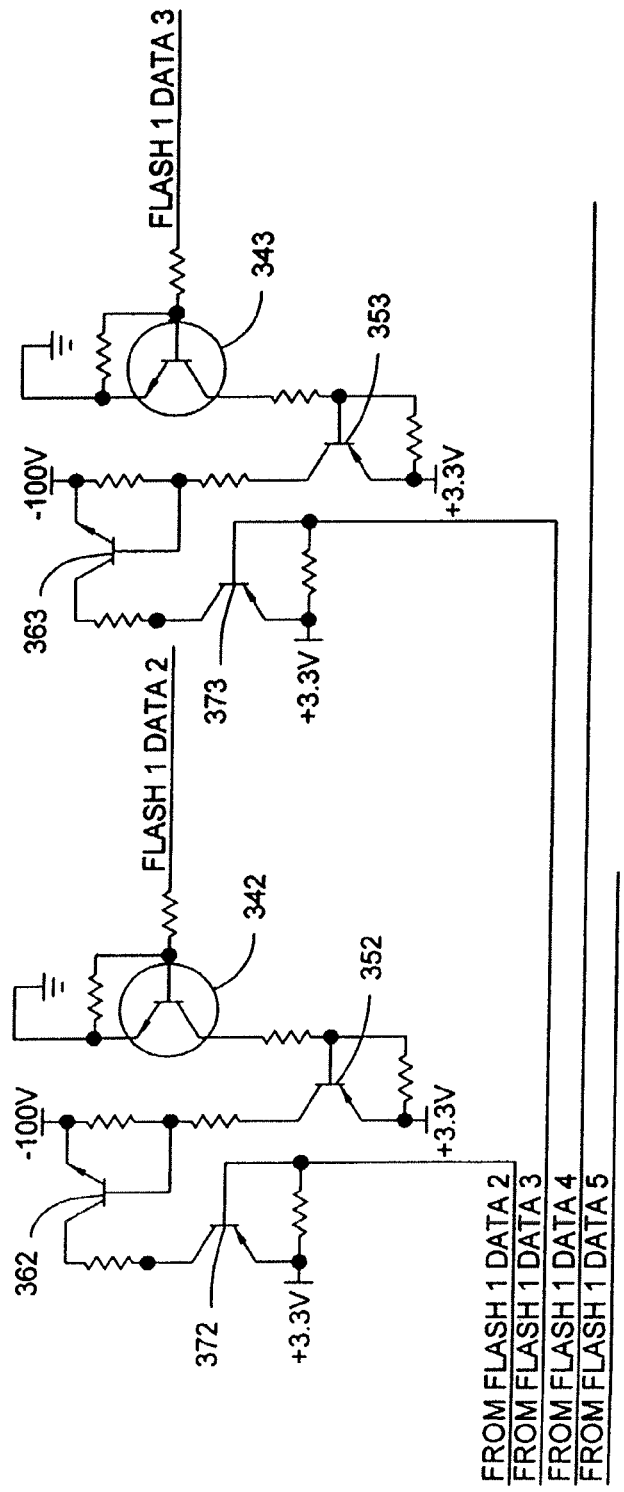
Figure 131:
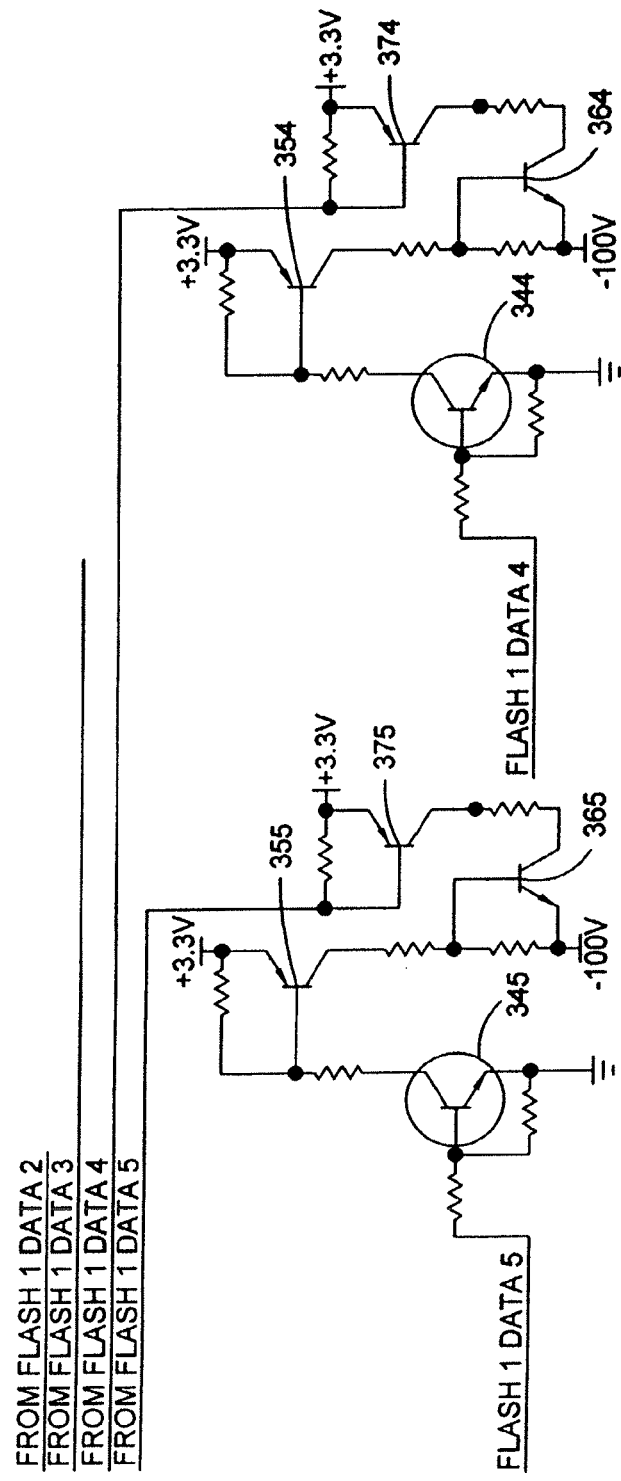

Referring now to FIGS. 13j-l, the filter 226's FLASH1 DATA0-FLASH1 DATA7 lines are coupled through respective 10 KΩ resistors to the bases of respective digital NPN transistors 340-347, illustratively, ON Semiconductor type DTC transistors. The bases of transistors 340-347 are also coupled through respective 10 KΩ resistors to ground. The emitters of transistors 340-347 are coupled to ground. The collectors of transistors 340-347 are coupled through respective series pairs of 1 KΩ, 5% resistors to +3.3 VDC. The junction of each respective series pair of 1 KΩ, 5% resistors is coupled to the base of a respective type MMSTA92 PNP transistor 350-357. The collector of each transistor 350-357 is coupled through a respective 100 KΩ, 5% resistor to the base of a respective type MMSTA42 NPN transistor 360-367. The base of each transistor 360-367 is coupled through a respective 1 KΩ, 5% resistor to its emitter. The emitter of each transistor 360-367 is coupled to −100 VDC. The filter 226's FLASH1 DATA0-FLASH1 DATA7 lines are also coupled through respective 1 KΩ, 10% resistors to the bases of respective type MMBTA92 PNP transistors 370-377. The bases of transistors 370-377 are coupled through respective 1 KΩ, 5% resistors to their respective emitters and to +3.3 VDC. The collectors of transistors 370-377 are coupled through respective 20 KΩ, 5% resistors to the collectors of respective transistors 360-367.

Figure 13M:
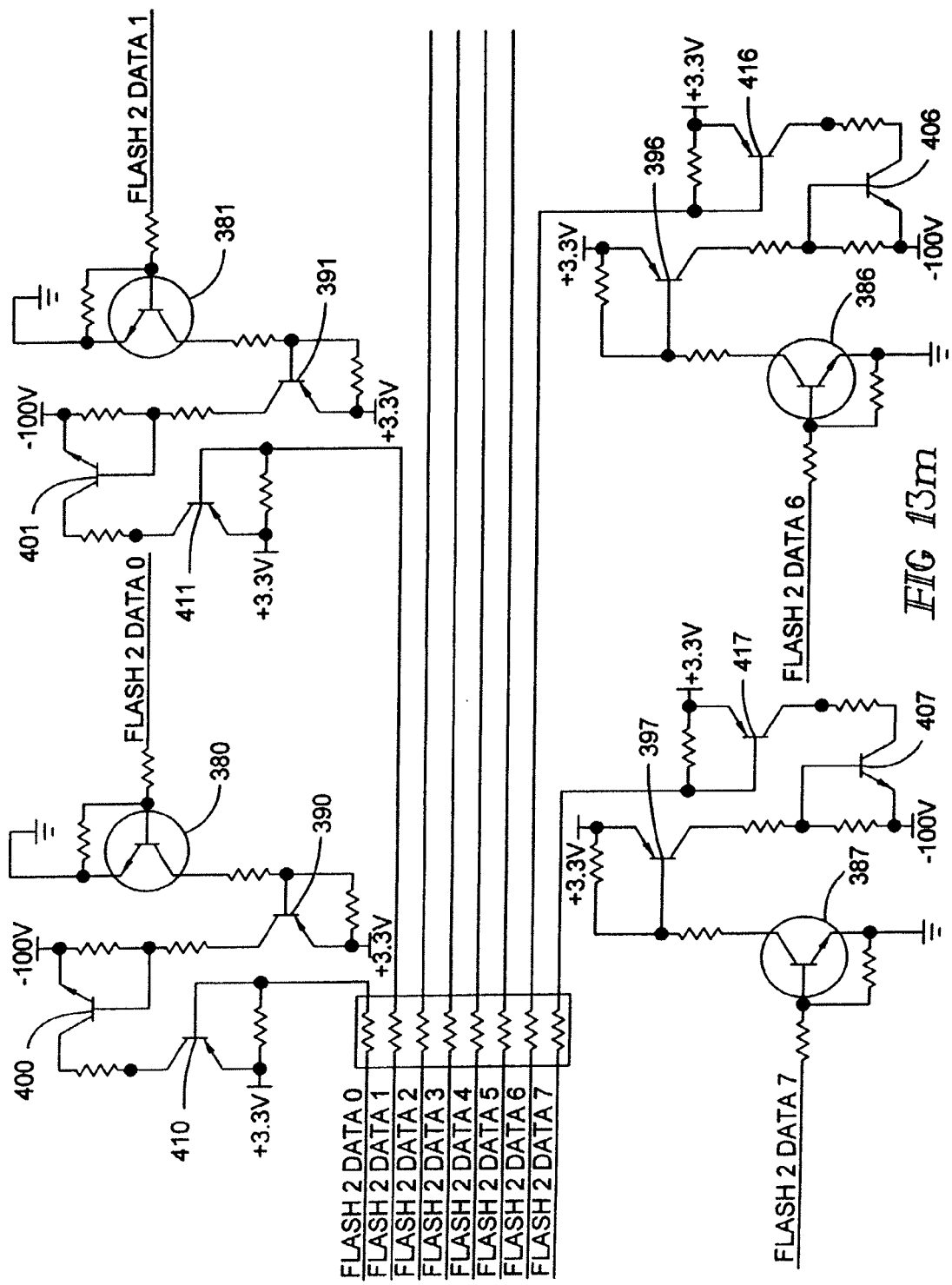
Figure 13N:
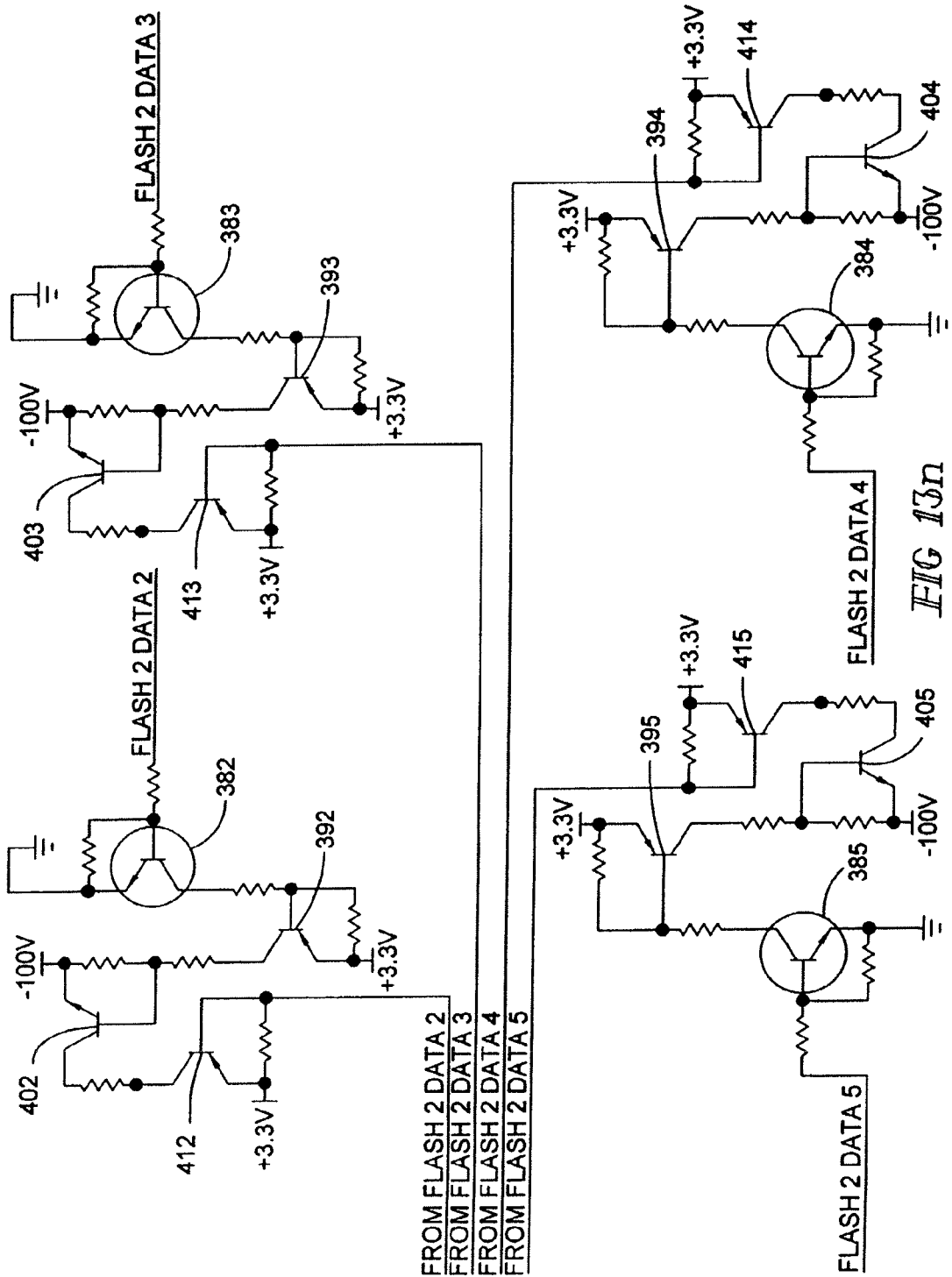

Referring now to FIGS. 13m-n, the filter 226's FLASH2 DATA0-FLASH2 DATA7 lines are coupled through respective 10 KΩ resistors to the bases of respective digital NPN transistors 380-387, illustratively, ON Semiconductor type DTC114EET1G transistors. The bases of transistors 380-387 are also coupled through respective 10 KΩ resistors to ground. The emitters of transistors 380-387 are coupled to ground. The collectors of transistors 380-387 are coupled through respective series pairs of 1 KΩ, 5% resistors to +3.3 VDC. The junction of each respective series pair of 1 KΩ, 5% resistors is coupled to the base of a respective type MMSTA92 PNP transistor 390-397. The collector of each transistor 390-397 is coupled through a respective 100 KΩ, 5% resistor to the base of a respective type MMSTA42 NPN transistor 400-407. The base of each transistor 400-407 is coupled through a respective 1 KΩ, 5% resistor to its emitter. The emitter of each transistor 400-407 is coupled to −100 VDC. The filter 226's FLASH2 DATA0-FLASH2 DATA7 lines are also coupled through respective 1 KΩ, 10% resistors to the bases of respective type MMBTA92 PNP transistors 410-417. The bases of transistors 410-417 are coupled through respective 1 KΩ, 5% resistors to their respective emitters and to +3.3 VDC. The collectors of transistors 410-417 are coupled through respective 20 KΩ, 5% resistors to the collectors of respective transistors 400-407.

The filter 226 is tuned by dividing its frequency range into an integral number of tuning steps. Each tuned bandpass filter center frequency is separated as nearly as possible by the filter 226's tuning range divided by the number of steps so that the steps are as uniform as possible. The actual tuning word (switch 112-1, 112-2, . . . 112-$m$, 116-1, 116-2, . . . 116-$n$, 212-1, 212-2, . . . 212-$m$, 216-1, 216-2, . . . 216-$n$ settings for each frequency) is stored in non-volatile flash memory 280 on the filter 226's controller board 238.

During calibration of the filter 226, the FPGA 276 permits, via the external input signals EXTernalConTroL0-EXTCTL3, an external controller (not shown) to select which capacitors 110-1, 110-2, . . . 110-$m$, 118-1, 118-2, . . . 118-$n$, 210-1, 210-2, . . . 210-$m$, 218-1, 218-2, . . . 218-$n$ are switched 112-1, 112-2, . . . 112-$m$, 116-1, 116-2, . . . 116-$n$, 212-1, 212-2, . . . 212-$m$, 216-1, 216-2, . . . 216-$n$ into the resonant circuit for purposes of determining the best combination of capacitors 110-1, 110-2, . . . 110-$m$, 118-1, 118-2, . . . 118-$n$, 210-1, 210-2, . . . 210-$m$, 218-1, 218-2, . . . 218-$n$ for each of the filter 226's frequency tuning steps. The external controller comprises a PC connected to a general purpose I/O module which provides a tuning word to the FPGA 276. The FPGA 276 responds by activating one or more of the switches 112-1, 112-2, . . . 112-*m*, 116-1, 116-2, . . . 116-*n*, 212-1, 212-2, . . . 212-*m*, 216-1, 216-2, . . . 216-*n*. The PC is also connected to a network analyzer which simultaneously measures the filter 226's frequency response when this combination of switches 112-1, 112-2, . . . 112-*m*, 116-1, 116-2, . . . 116-*n*, 212-1, 212-2, . . . 212-*m*, 216-1, 216-2, . . . 216-*n* is activated. Once the tuning word for each frequency has been determined, the FPGA 276 then permits the external PC and I/O module to program the frequency-versus-tuning word table into the filter 226's flash memory 280. The stored table is then read back to verify proper programming of the flash memory 280.

Once calibration is complete, the FPGA 276 permits a user to set the filter 226's frequency by latching the desired tuning word into a register in the FPGA 276. The FPGA 276 accesses the look up table in the flash memory 280 and applies the stored tuning word to the appropriate switches 112-1, 112-2, . . . 112-*m*, 116-1, 116-2, . . . 116-*n*, 212-1, 212-2, . . . 212-*m*, 216-1, 216-2, . . . 216-*n*. At least one tuning word, defined as high isolation, essentially detunes the filter to provide maximum insertion loss. It may be necessary to provide an isolation switch in instances in which sufficient isolation cannot be achieved by detuning. See, for example, the following discussion of FIGS. 14-19, and particularly FIG. 19*g*.

FIGS. 14-17 illustrate the incorporation of a coupled microstrip filter tunable filter structure 424 in a high power tunable filter 426. Again, it is understood that a variety of equivalent mechanical structures are possible.

Figure 14A:
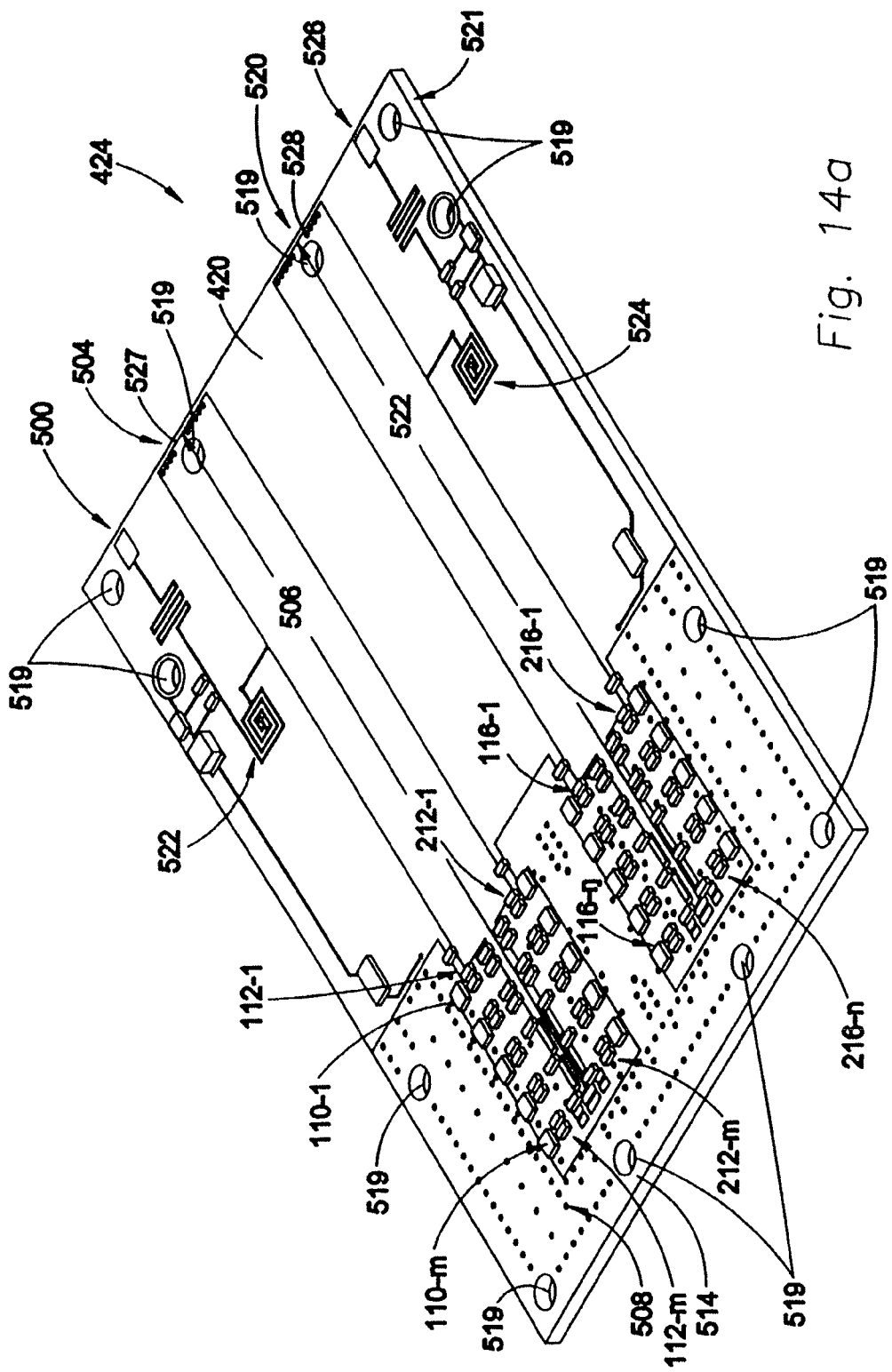
FIGS. 14a and b illustrate a printed wiring board with coupled microstrip tunable filter structures and switched capacitor banks.

In FIG. 14*a*, input port 500 is coupled through low pass filter trace 522 to an input microstrip trace 504 along its length 506. The trace 504 is terminated at one 508 of its ends at a plurality of switched capacitors 110-1, 110-2, . . . 110-*m*, 210-1, 210-2, . . . 210-*m*. The capacitors 110-1, 110-2, . . . 110-*m*, 210-1, 210-2, . . . 210-*m* are switched through a respective plurality of RF switches, such as PIN diodes, FETs, MEMS devices or DTCs, 112-1, 112-2, . . . 112-*m*, 212-1, 212-2, . . . 212-*m*, to a header 514, and through the header 514 and a set of RF switches, such as PIN diodes, FETs, MEMS devices or DTC analog switches 116-1, 116-2, . . . 116-*n*, 216-1, 216-2, . . . 216-*n* and a respective plurality of switched capacitors 118-1, 118-2, . . . 118-*n*, 218-1, 218-2, . . . 218-*n* to an output microstrip trace 520. Along its length 522, trace 520 is coupled through low pass filter trace 524 to output port 526.

Figure 14B:
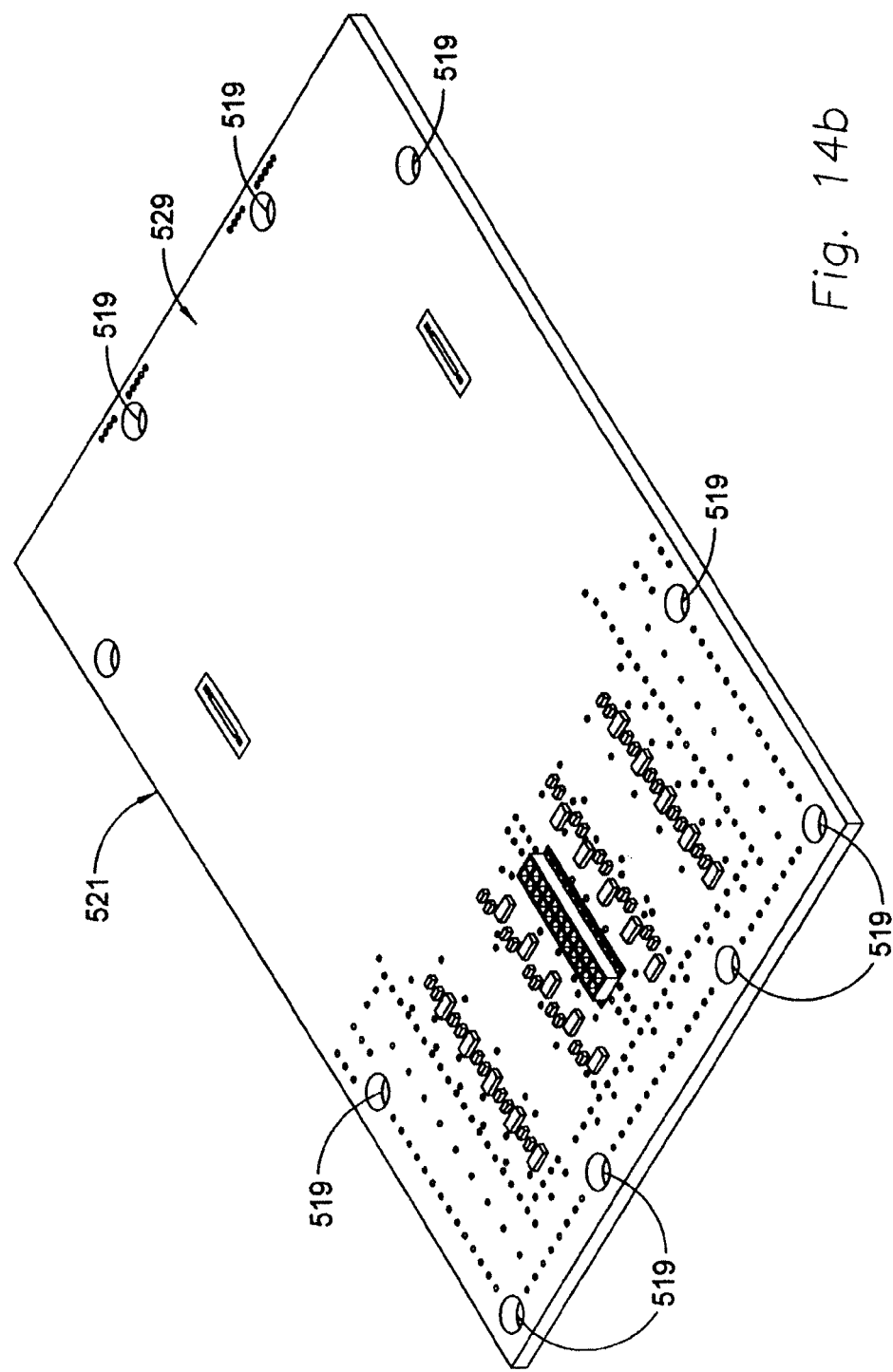

The microstrip traces 504, 520 are shorted together at their ends 527, 528 by plated through holes 519 to the ground plane 529, FIG. 14*b*, provided on the other side of the filter PCB 521. The header 514 is coupled to ground in the same manner.

Figure 15:
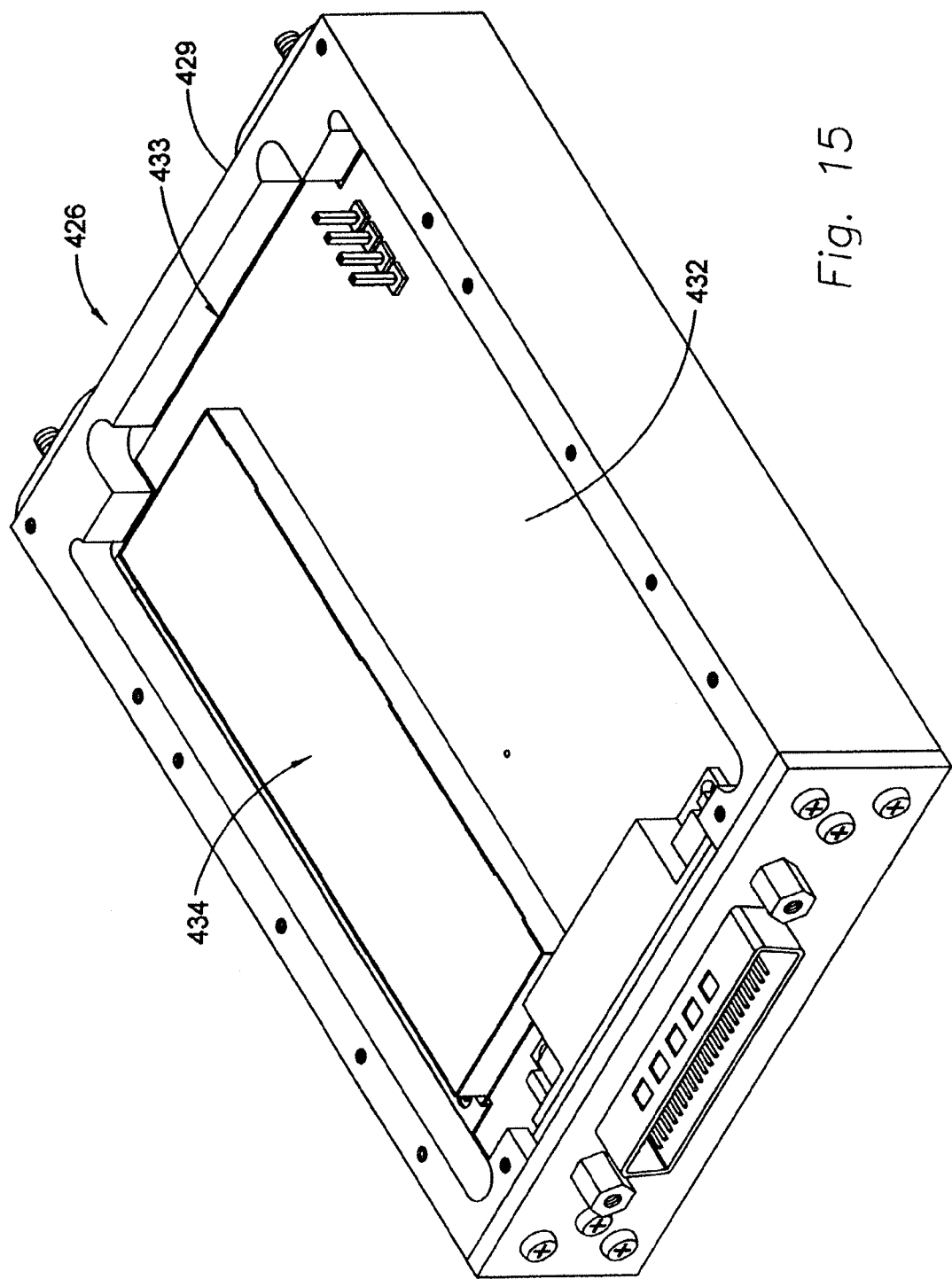
FIGS. 15-17 illustrate a coupled microstrip tunable filter structure of the type illustrated in FIGS. 14a-b incorporated into a high power tunable filter.
Figure 16:
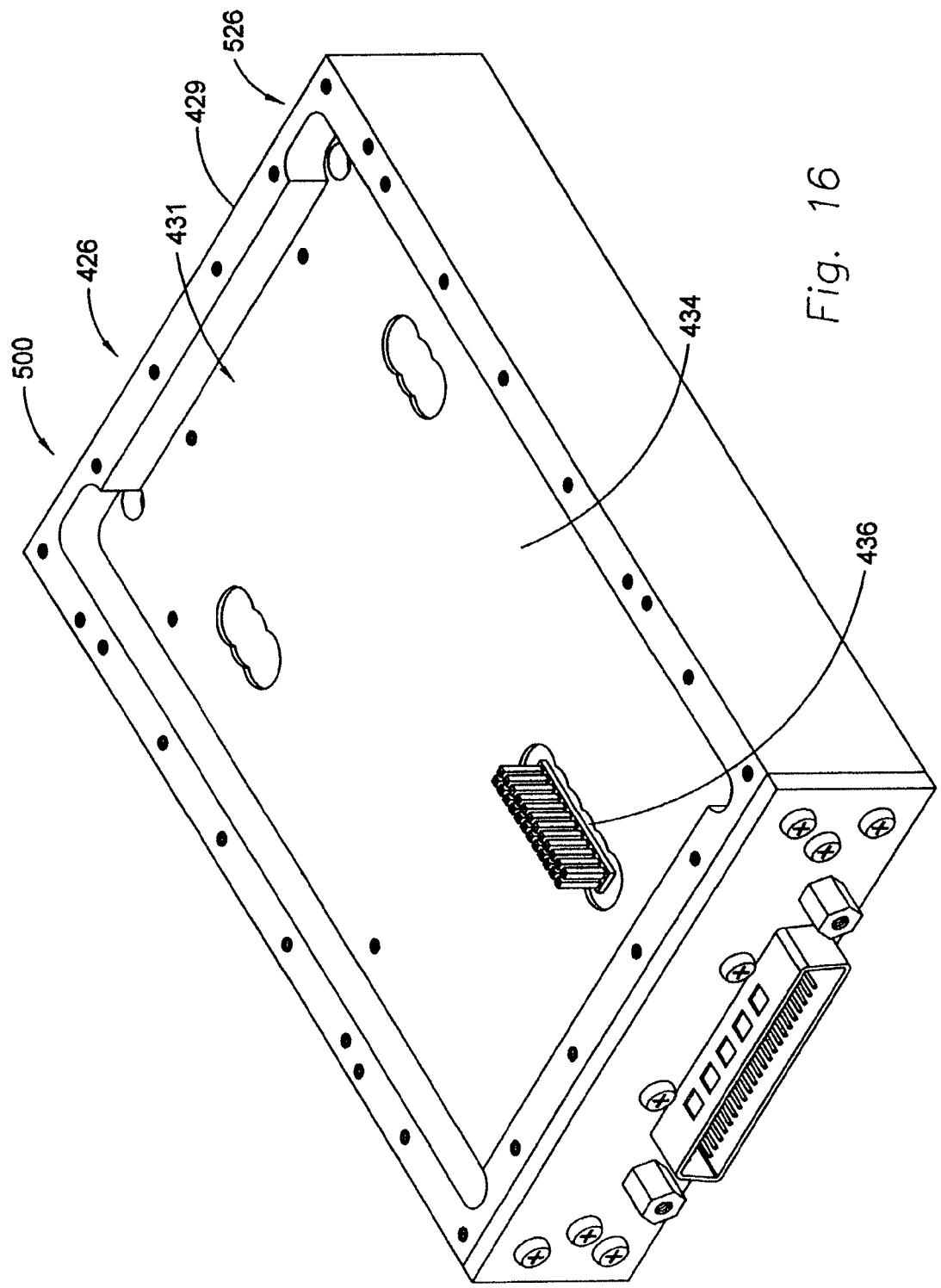
Figure 17:
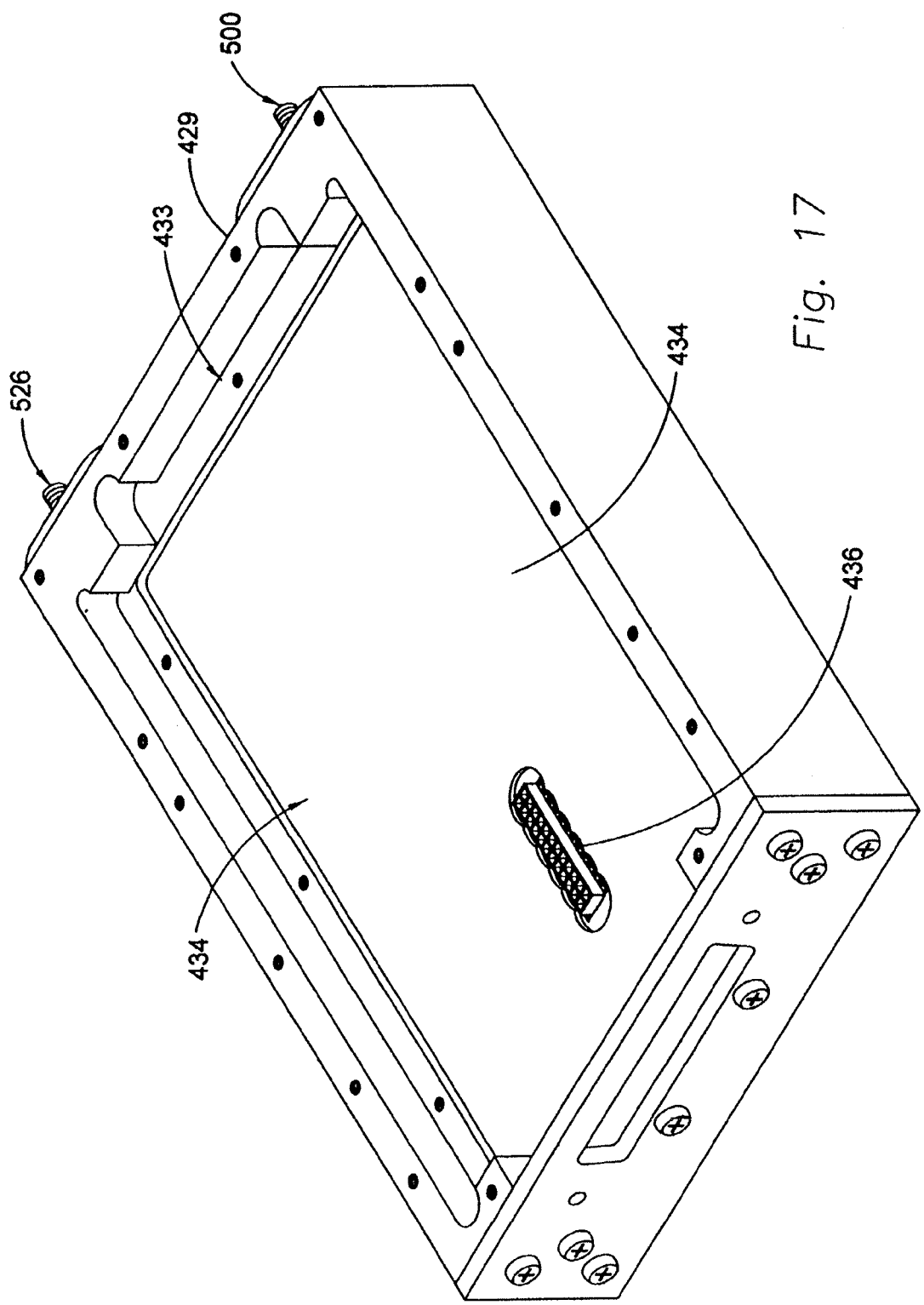

The filter structure 424 is housed in a metal enclosure or housing 429 with two main cavities 431, 433. The RF portion 424 of the filter is mounted in one cavity 431 and the logic interface 432 including the (for example, TTL, not shown) RF switch 112-1, 112-2, . . . 112-*m*, 116-1, 116-2, . . . 116-*n*, 212-1, 212-2, . . . 212-*m*, 216-1, 216-2, . . . 216-*n* drivers is located in the other cavity 432. The cavities 431, 433 are separated by a wall 434 containing access holes 436 for connecting the driver outputs from the logic board 438 to the corresponding RF switches 112-1, 112-2, . . . 112-*m*, 116-1, 116-2, . . . 116-*n*, 212-1, 212-2, . . . 212-*m*, 216-1, 216-2, . . . 216-*n* on the filter board 420. FIG. 15 illustrates the logic side 433 of the filter enclosure 429 with the logic board 438 installed with shielding 434. FIG. 16 illustrates the filter side 431 of the tunable filter 426 with filter board 420 removed. FIG. 17 illustrates the logic side 433 of the filter enclosure 429 with the logic board 438 removed.

Again, the switched capacitors 110-1, 110-2, . . . 110-*m*, 118-1, 118-2, . . . 118-*n*, 210-1, 210-2, . . . 210-*m*, 218-1, 218-2, . . . 218-*n* could be replaced with suitable equivalents, such as voltage variable capacitors (for example, varactors), passively tunable integrated circuit (PTIC) capacitors, DTCs, ferroelectric capacitors with one switch or no switches to tune an octave, or ferroelectric capacitors, or continuously variable microelectromechanical systems (MEMS) devices employing a mechanically movable flap, all with their attendant advantages.

An illustrative voltage tunable filter 426 includes a power supply of the type described in connection with FIG. 11 for supplying −100 VDC. Reference is made to that discussion for a description of a suitable power supply for the tunable filter 426.

Turning now to FIGS. 18*a-g*, the circuit including capacitors 110-1, 110-2, . . . 110-*m*, 118-1, 118-2, . . . 118-*n*, 210-1, 210-2, . . . 210-*m*, 218-1, 218-2, . . . 218-*n* and RF switches 112-1, 112-2, . . . 112-*m*, 116-1, 116-2, . . . 116-*n*, 212-1, 212-2, . . . 212-*m*, 216-1, 216-2, . . . 216-*n* is illustrated.

Figure 18A:
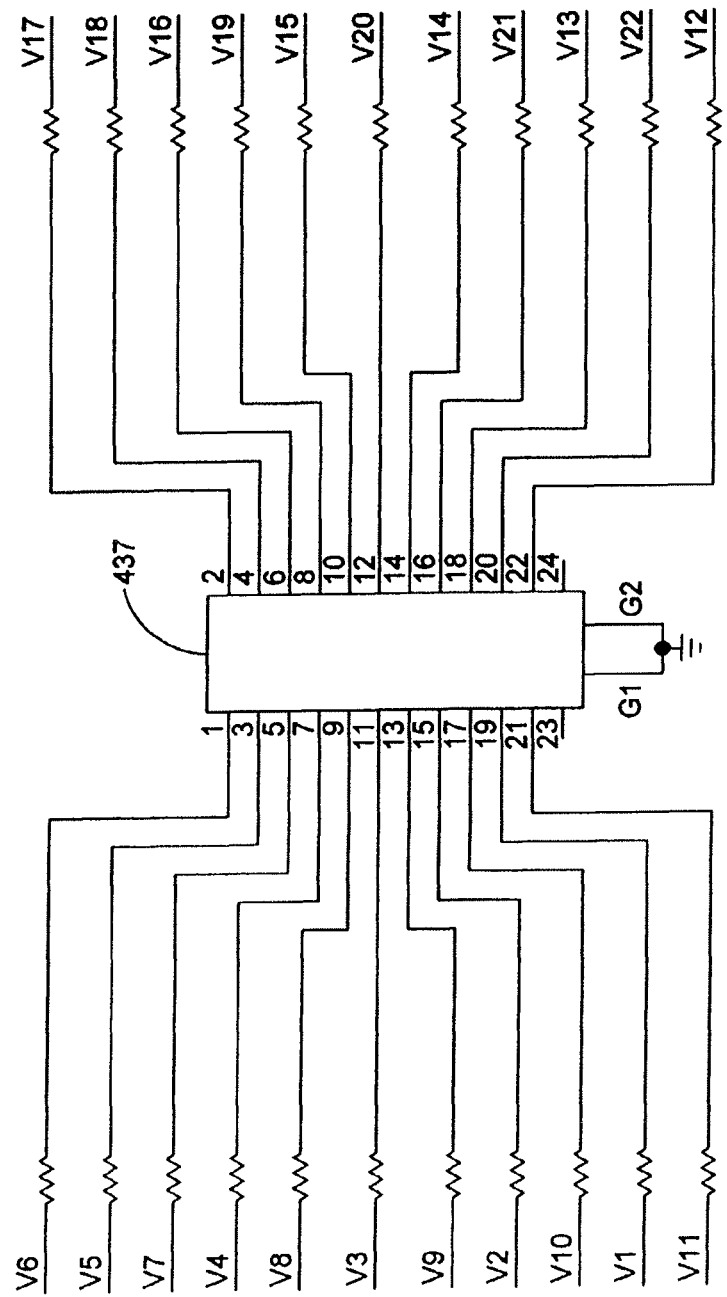
FIGS. 18a-g illustrate schematic circuit diagrams for the filter circuit of FIGS. 14-17.

Referring first to FIG. 18*a*, the connector 437 accessible through access hole 436 for connecting the driver outputs from the logic board 438 to the corresponding RF switches 112-1, 112-2, . . . 112-*m*, 116-1, 116-2, . . . 116-*n*, 212-1, 212-2, . . . 212-*m*, 216-1, 216-2, . . . 216-*n* on the filter board 420 is illustrated. In the embodiment illustrated in FIGS. 18*a-g*, m and n both equal 5. The illustrated connector 437 is a SAMTEC type SKT 2×12 pin connector. Pins 1-12 of connector 437 are coupled through respective 100Ω resistors to lines V6, V17, V5, V18, V7, V16, V4, V19, V8, V15, V3 and V20, respectively, of filter PCB 420. Pins 13-16, 21 and 22 of connector 437 are coupled through respective 51.1Ω resistors to lines V9, V14, V2, V21, V11 and V12, respectively, of filter PCB 420. Pins 17-20 of connector 437 are coupled through respective 25.5Ω resistors to lines V10, V13, V1 and V22, respectively, of filter PCB 420.

Figure 18B:
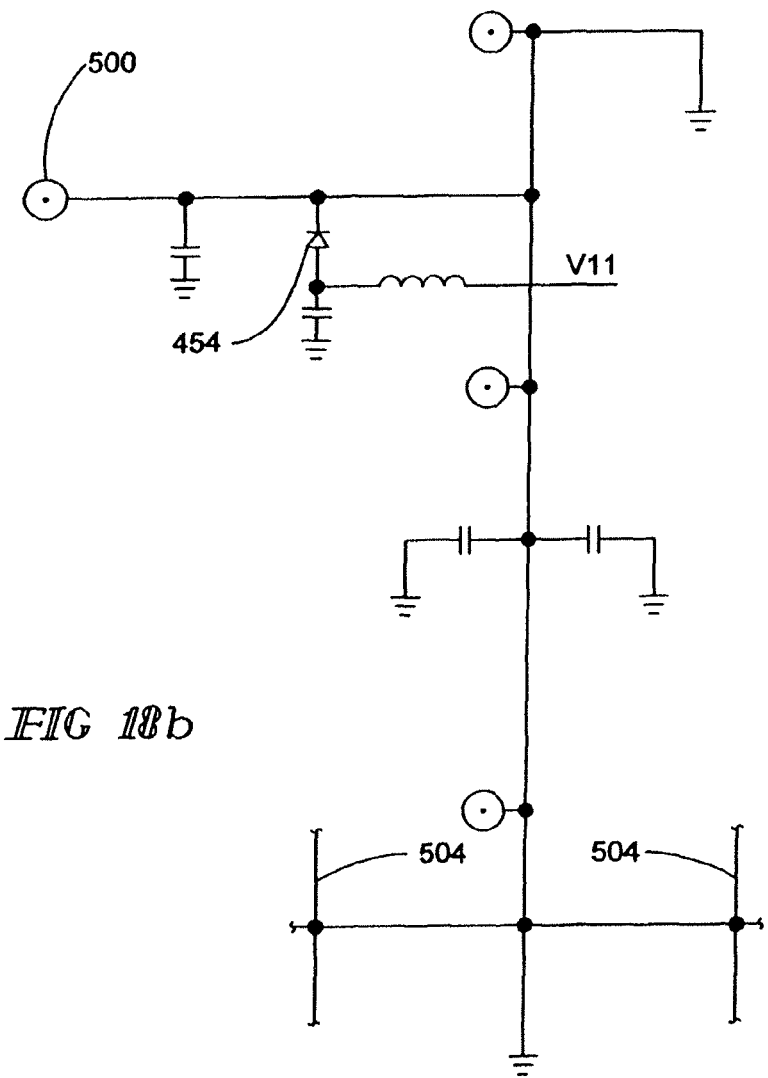

As best seen in FIG. 18*b*, input port 500 is in the form of a coaxial connector, the inner conductor of which is coupled to input microstrip trace 504 and the outer conductor (hereinafter sometimes sheath) of which is coupled to the cathode of a type SMP1320-079 PIN diode 454, the anode of which is coupled through a 510 pF capacitor to ground. The anode of diode 454 is also coupled through a 5.6 μH inductor to line V11. The cathode of diode 454 is also coupled to one terminal of an 8.2 pF capacitor, the other terminal of which is coupled to ground.

The illustrated RF switches 112-1, 112-2, 112-3, 112-4, 112-5, 116-1, 116-2, 116-3, 116-4, 116-5, 212-1, 212-2, 212-3, 212-4, 212-5, 216-1, 216-2, 216-3, 216-4, 216-5 are realized using series-connected pairs of type SMP1322-079 PIN diodes available from several sources (the diodes of each pair being designated −1 and −2). Referring to FIGS. 18*c-f*, the capacitor values are as follows: 110-1, 15 pF (6.8 pF+8.2 pF); 110-2, 6 pF (0.4 pF+5.6 pF); 110-3, 1.8 pF; 110-4, 0.7 pF; 110-5, 0.2 pF; 210-5, 11.2 pF (3.0 pF+8.2 pF); 210-4, 3.9 pF (0.3 pF+3.6 pF); 210-3, 1.0 pF; 210-2, 0.2 pF; 210-1, 0.2 pF; 118-1, 10.9 pF (2.7 pF+8.2 pF); 118-2, 3.9 pF (0.3 pF+3.6 pF); 118-3, 1.2 pF; 118-4, 0.2 pF; 118-5, 0.2 pF; 218-5, 15.7 pF (7.5 pF+8.2 pF); 218-4, 6.1 pF (0.5 pF+5.6 pF); 218-3, 1.6 pF; 218-2, 0.7 pF; 218-1, 0.2 pF.

Figure 18C:
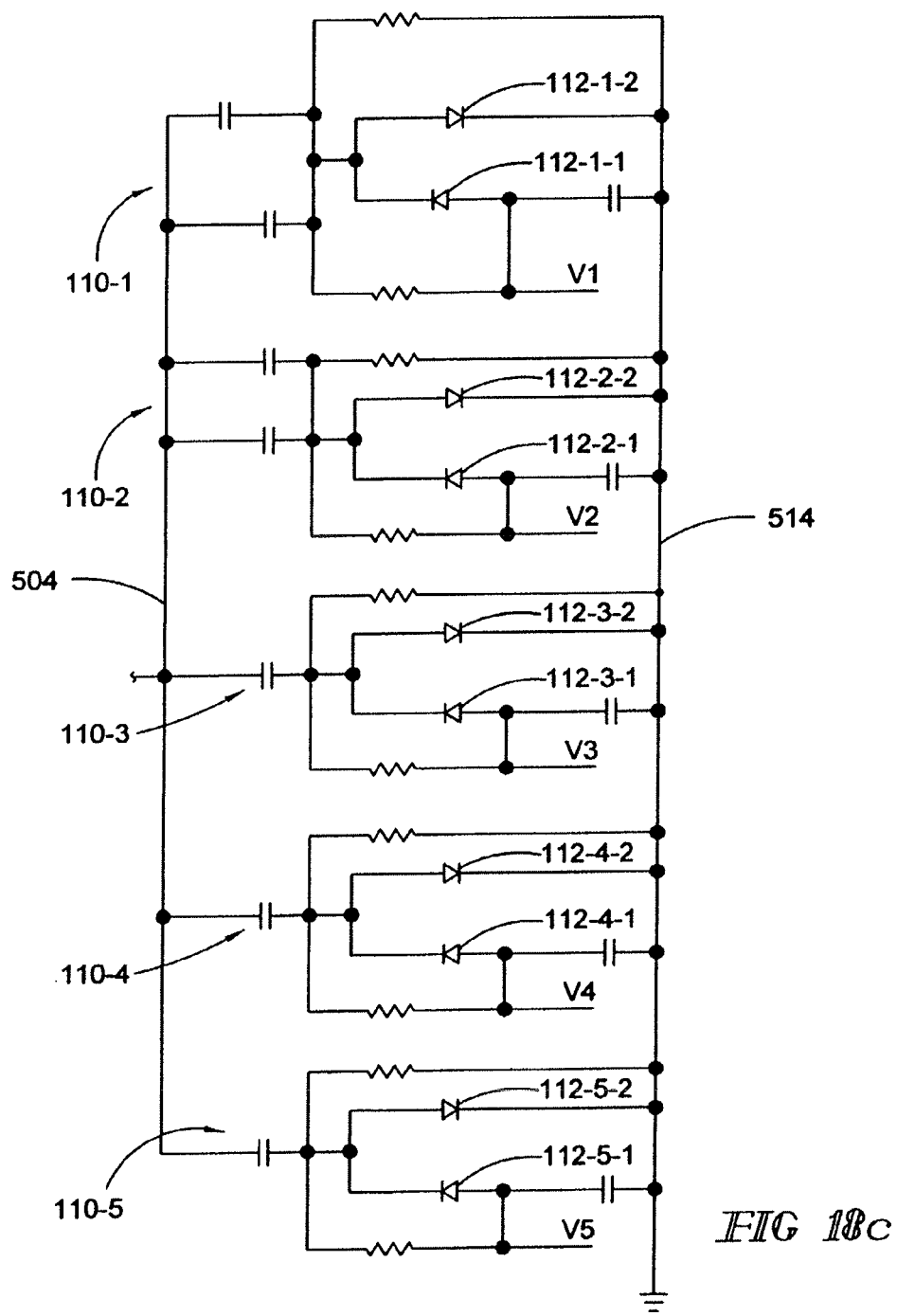

Referring to FIG. 18*c*, the cathodes of diodes 112-1-2, 112-2-2, 112-3-2, 112-4-2, 112-5-2 are coupled to header 514. The anodes of diodes 112-1-2, 112-2-2, 112-3-2, 112-4-2, 112-5-2 are coupled to respective capacitors 110-1, 110-2, 110-3, 110-4, 110-5. The cathodes of diodes 112-1-1, 112-2-1, 112-3-1, 112-4-1, 112-5-1 are coupled to respective capacitors 110-1, 110-2, 110-3, 110-4, 110-5. The anodes of diodes 112-1-1, 112-2-1, 112-3-1, 112-4-1, 112-5-1 are coupled to lines V1-V5, respectively.

Figure 18D:
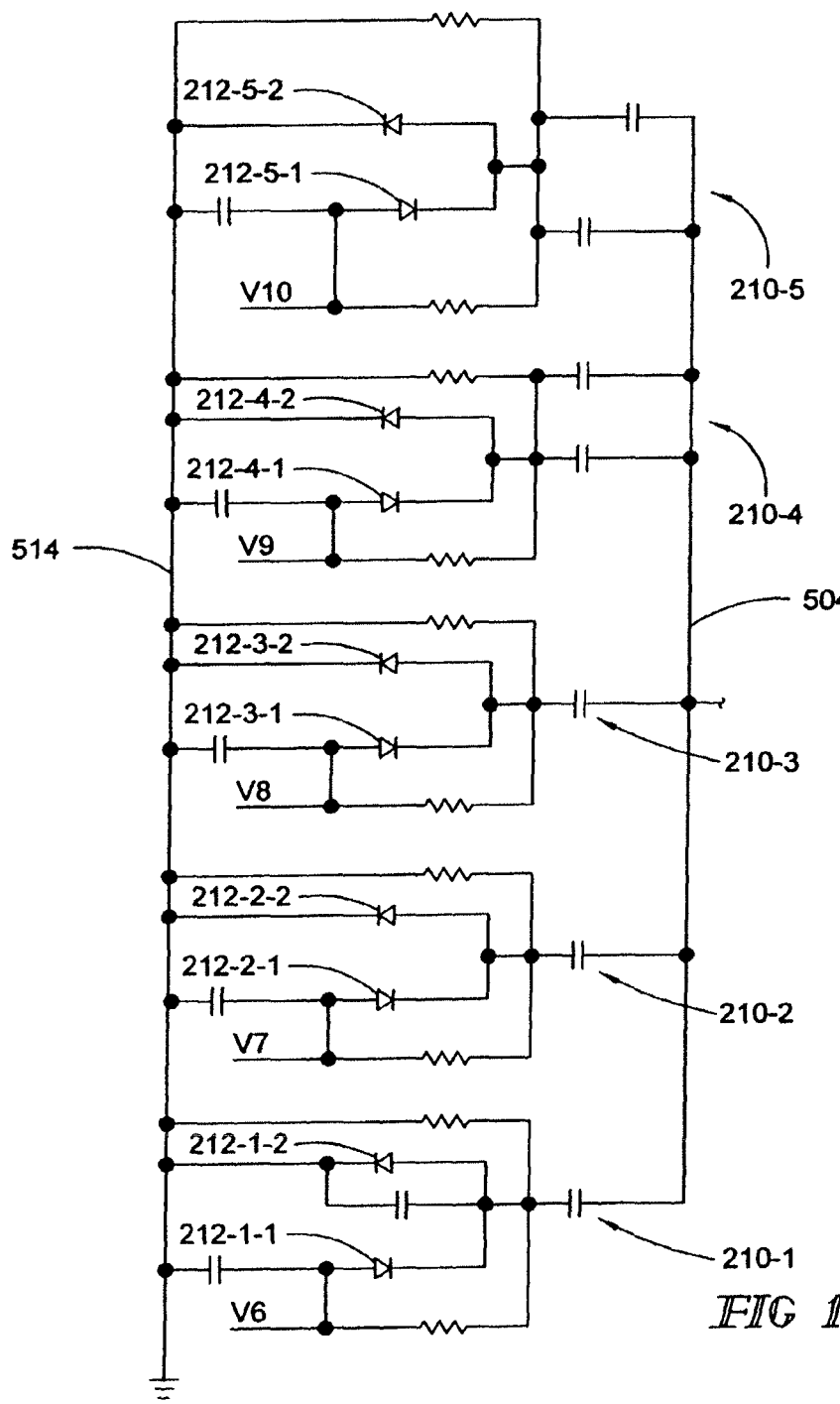

Referring to FIG. 18d, the cathodes of diodes 212-1-2, 212-2-2, 212-3-2, 212-4-2, 212-5-2 are coupled to header 514. The anodes of diodes 212-1-2, 212-2-2, 212-3-2, 212-4-2, 212-5-2 are coupled to respective capacitors 210-1, 210-2, 210-3, 210-4, 210-5. The cathodes of diodes 212-1-1, 212-2-1, 212-3-1, 212-4-1, 212-5-1 are coupled to respective capacitors 210-1, 210-2, 210-3, 210-4, 210-5. The anodes of diodes 212-1-1, 212-2-1, 212-3-1, 212-4-1, 212-5-1 are coupled to lines V6-V10, respectively.

Figure 18E:
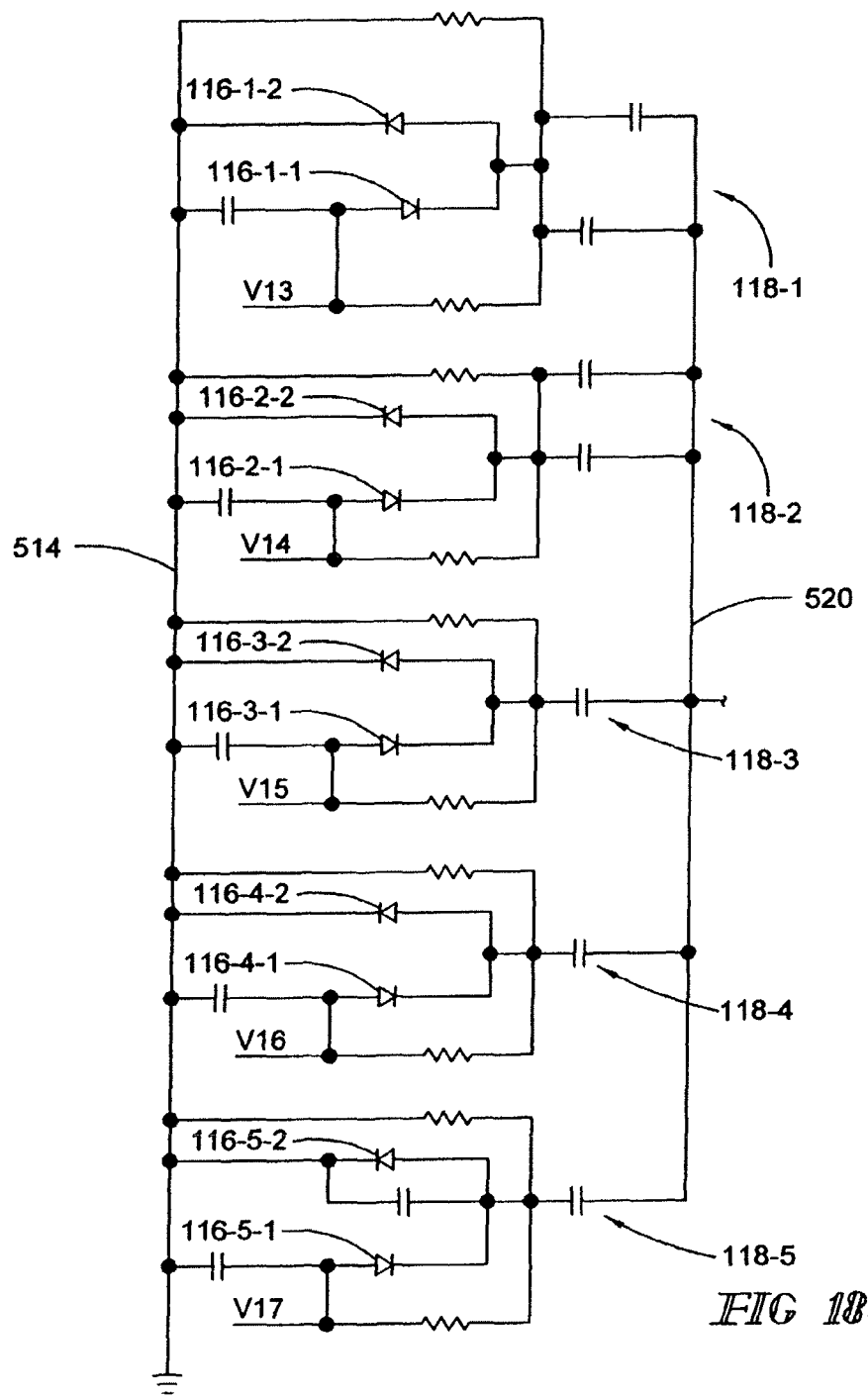

Referring to FIG. 18e, the cathodes of diodes 116-1-2, 116-2-2, 116-3-2, 116-4-2, 116-5-2 are coupled to header 514. The anodes of diodes 116-1-2, 116-2-2, 116-3-2, 116-4-2, 116-5-2 are coupled to respective capacitors 118-1, 118-2, 118-3, 118-4, 118-5. The cathodes of diodes 116-1-1, 116-2-1, 116-3-1, 116-4-1, 116-5-1 are coupled to respective capacitors 118-1, 118-2, 118-3, 118-4, 118-5. The anodes of diodes 116-1-1, 116-2-1, 116-3-1, 116-4-1, 116-5-1 are coupled to lines V13-V17, respectively.

Figure 18F:
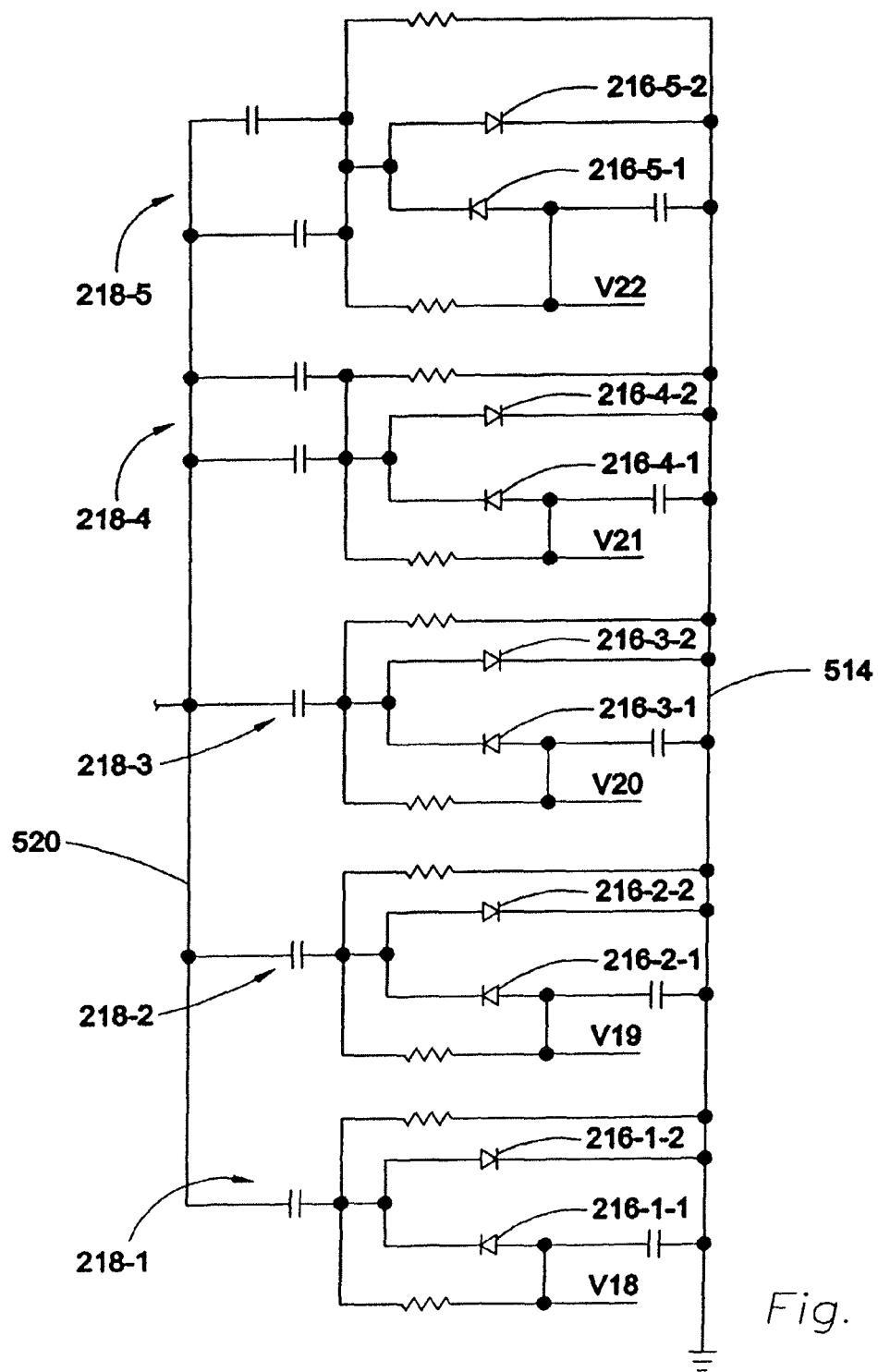

Referring to FIG. 18f, the cathodes of diodes 216-1-2, 216-2-2, 216-3-2, 216-4-2, 216-5-2 are coupled to header 514. The anodes of diodes 216-1-2, 216-2-2, 216-3-2, 216-4-2, 216-5-2 are coupled to respective capacitors 218-1, 218-2, 218-3, 218-4, 218-5. The cathodes of diodes 216-1-1, 216-2-1, 216-3-1, 216-4-1, 216-5-1 are coupled to respective capacitors 218-1, 218-2, 218-3, 218-4, 218-5. The anodes of diodes 216-1-1, 216-2-1, 216-3-1, 216-4-1, 216-5-1 are coupled to lines V18-V22, respectively.

A 5.1 MΩ resistor is coupled across each of diodes 112, 116, 212, 216. A 510 pF capacitor is coupled between the anode of each diode 112-1-1, 112-2-1, 112-3-1, 112-4-1, 112-5-1, 116-1-1, 116-2-1, 116-3-1, 116-4-1, 116-5-1, 212-1-1, 212-2-1, 212-3-1, 212-4-1, 212-5-1, 216-1-1, 216-2-1, 216-3-1, 216-4-1, 216-5-1 and header 514.

Figure 18G:
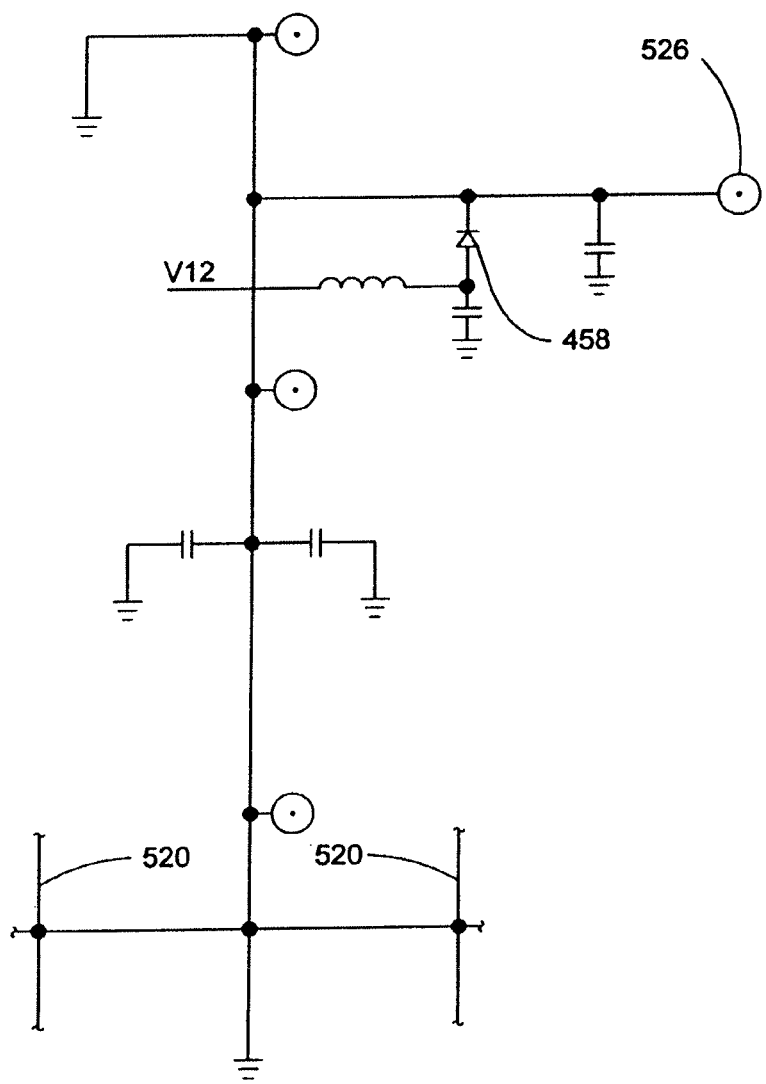

As best seen in FIG. 18g, output port 526 is in the form of a coaxial connector, the inner conductor of which is coupled to output coupled microstrip 520, 620 and the sheath of which is coupled to the cathode of a type SMP1320-079 PIN diode 458, the anode of which is coupled through a 510 pF capacitor to ground. The anode of diode 458 is coupled through a 5.6 μH inductor to line V12. The cathode of diode 458 is also coupled to one terminal of an 8.2 pF capacitor, the other terminal of which is coupled to ground.

Figure 19A:
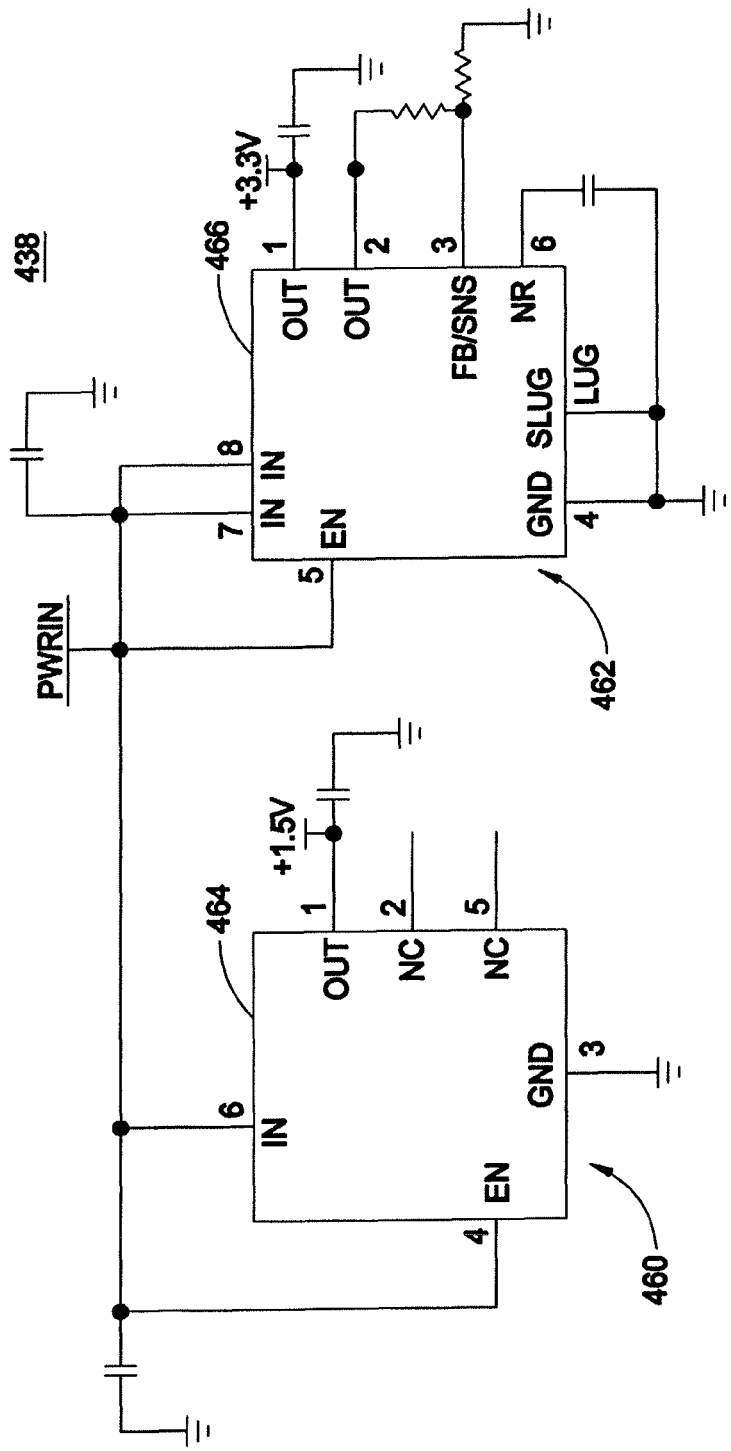

Turning now to FIGS. 19a-l, and particularly to FIG. 19a, the logic board 438 includes low voltage power supplies 460, 462 to supply +1.5 VDC and +3.3 VDC to the circuits on board 438. Supply 460 converts either +3.3 VDC or +5 VDC PoWeRIN to +1.5 VDC. PWRIN is coupled to the INput terminal, pin 6, and the ENable terminal, pin 4, of a power supply IC 464, illustratively a Texas Instruments type TPS72715DSE low dropout voltage regulator. The GrouND terminal, pin 3, of IC 464 is coupled to ground. +1.5 VDC appears across a 1 μF, 10% capacitor coupled between the OUTput terminal, pin 1, of IC 464 and ground.

PWRIN is also coupled to the INput terminals, pins 7 and 8, and the ENable terminal, pin 5, of a +3.3 VDC power supply IC 466, illustratively, a Texas Instruments type TPS7A8001DRBR low dropout voltage regulator. The NoiseReduction terminal, pin 6, of IC 466 is coupled through a 0.1 μF, 5% capacitor to ground. The GrouND terminal, pin 4, and SurfacemountLUG of IC 466 are coupled to ground. The FeedBack/SeNSe terminal, pin 3, of IC 466 is coupled through a 10 KΩ, 1% resistor to ground. The OUTput terminals, pins 1 and 2, are coupled through a 22 μF, 10% capacitor to ground and through a 30.9 KΩ, 1% resistor to pin 3 of IC 466. +3.3 VDC appears across pins 1,2 and ground.

Figure 19B:
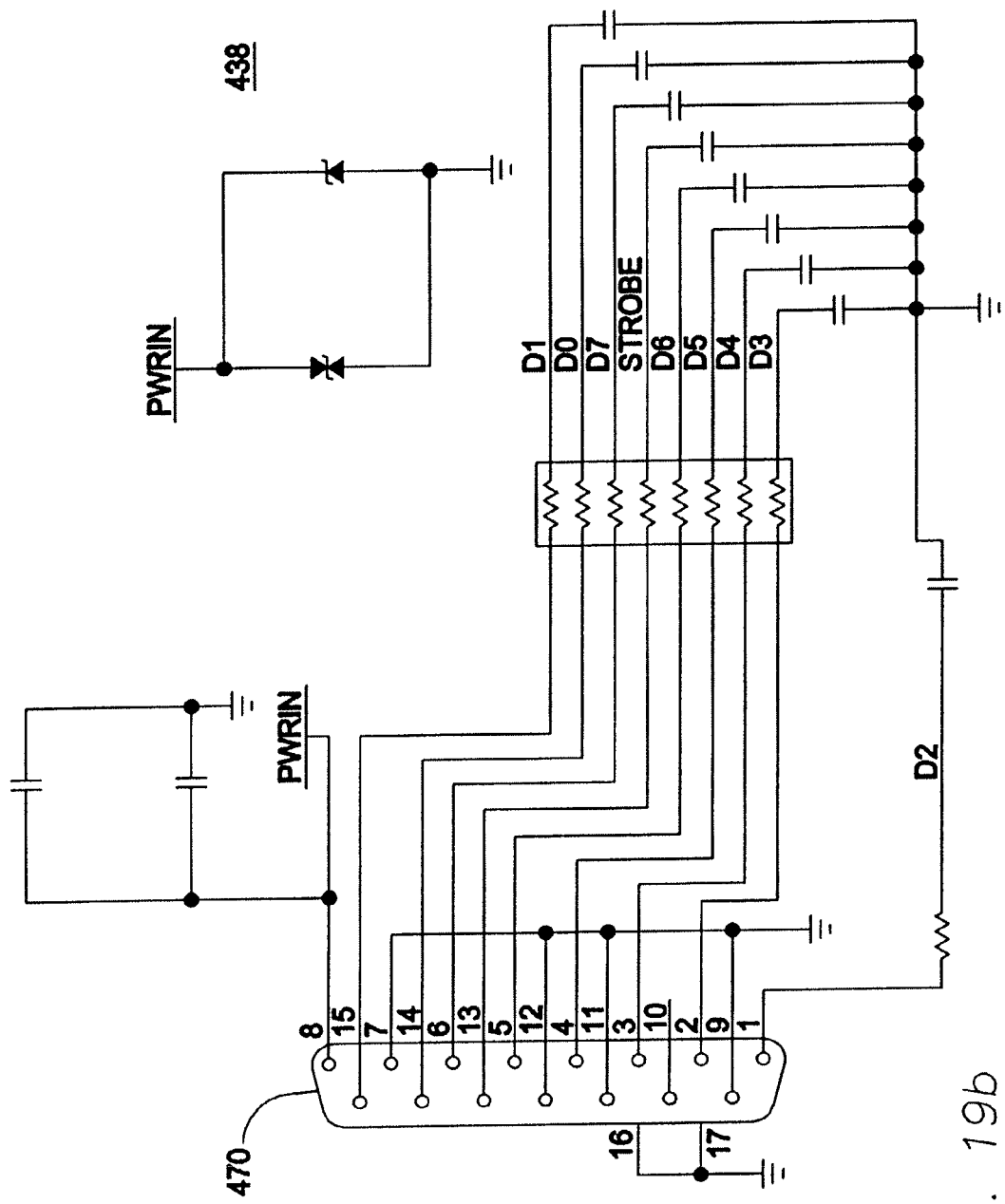

Turning now to FIG. 19b, board 438 further includes a 15-pin D connector 470, pins 1-6 and 13-15 of which are coupled through respective series RC circuits including 10Ω resistors and 1000 pF, 10% capacitors to ground. All resistors are 10% tolerance except the one on pin 1, which is 5%. Pins 7, 9, 11, 12, 16 and 17 of connector 470 are coupled to ground. Pin 8 of connector 470 is coupled to PWRIN and through parallel coupled 22 μF, 10% and 3300 pF, 5% capacitors to ground. Board 438 also includes a bidirectional 5 V Zener diode and a 20 V SBR 3A Zener diode coupled in parallel between PWRIN and ground.

Referring now to FIG. 19c, board 438 further includes a field programmable gate array (hereinafter sometimes FPGA) IC 476, such as, for example, an Actel type AGLN015V5 FPGA. The filter 426 CONTROL0-CONTROL3 lines, BDATA7-BDATA0 lines, STROBE3V line, RESET line, notISOLATE line, FLASH WriteProtect line, FLASH0 WriteEnable line, FLASH ADDRESS7-FLASHADDRESS0 lines, FLASH0 OutputEnable line, FLASH1 DATA0-FLASH1 DATA7 lines and FLASH0 DATA0-FLASH0-DATA7 lines are coupled, respectively, to pins 51, 53, 50, 52, 49, 48, 47, 43, 42, 41, 40, 39, 54, 55, 30, 57, 58, 22, 62, 21, 63, 20, 64, 19, 18, 65, 1, 66, 67, 2, 3, 4, 5, 6, 7, 11, 12, 13, 14, 15, 16, and 17 of FPGA 476. The VCC terminals, pins 8, 24 and 46, of FPGA 476 are coupled to +1.5 VDC and through a 0.1 μF, 5% capacitor to ground. The VCCIB0-VCCIB2 terminals, pins 44, 26 and 10, respectively, of FPGA 476 are coupled to +3.3 VDC and through a 0.1 μF, 5% capacitor to ground. The VPUMP and VJTAG terminals, pins 35 and 38, of FPGA 476 are coupled to +3.3 VDC and through a 0.1 μF, 5% capacitor to ground. The TReSeT, TMS, TransferData1, TD0 and TClocK terminals, pins 37, 34, 33, 36 and 32 of FPGA 476 are coupled to pins 8, 5, 9, 3 and 1, respectively, of 10 pin programming connector JP1. The TCK terminal is also coupled through a 1K, 5% resistor to ground.

Referring now to FIG. 19d, board 438 further includes a 16 Mb flash memory 480 and low voltage, 16-bit buffer/line driver 482. 16 Mb flash memory 480 illustratively is a Numonyx type M28W160ECB flash memory. Buffer/line driver 482 illustratively is a Fairchild type 74ALVC16244 buffer/line driver. The filter 426 FLASH ADDRESS0-FLASH ADDRESS7 lines are coupled to the A0-A7 terminals, pins 25-18, respectively, of flash memory 480. The notOutputEnable, notWriteEnable, notReSeT and notWriteProtect terminals, pins 28, 11, 12 and 14, respectively, of flash memory 480 are coupled to the filter 426 FLASH0 OE, FLASH0 WE, RESET and FLASH WP lines. The A8-A19 terminals, pins 8-1, 48 and 17-15, respectively, pins 9, 10, the GND terminals, pins 27 and 46, and the notClearEnable terminal, pin 26, of flash memory 480 are all coupled to ground. The D0-D15 terminals, pins 29, 31, 33, 35, 38, 40, 42, 44, 30, 32, 34, 36, 39, 41, 43 and 45, respectively, of flash memory 480 are coupled to the I15-I0 terminals, pins 26, 27, 29, 30, 32, 33, 35, 36, 37, 38, 40, 41, 43, 44, 46 and 47, respectively, of buffer/line driver 482. The O15-O0 terminals, pins 23, 22, 20, 19, 17, 16, 14, 13, 12, 11, 9, 8, 6, 5, 3 and 2, respectively, of buffer/line driver 482 are coupled to the FLASH1 DATA0-FLASH1 DATA7 and FLASH0 DATA0-FLASH0 DATA7 lines, respectively, of filter 426. The GND terminals, pins 4, 10, 15, 21, 28, 34, 39 and 45, of buffer/line driver 482 are coupled to ground. The notOutputEnable1, notOE2, notOE3 and notOE4 terminals, pins 1, 48, 25 and 24, respectively, of buffer/line driver 482 are coupled to ground. The VCC terminals, pins 7, 18, 31 and 42, respectively, of buffer/line driver 482 are coupled to +3.3 VDC, and through a 0.1 µF, 5% capacitor to ground.

Figure 19E:
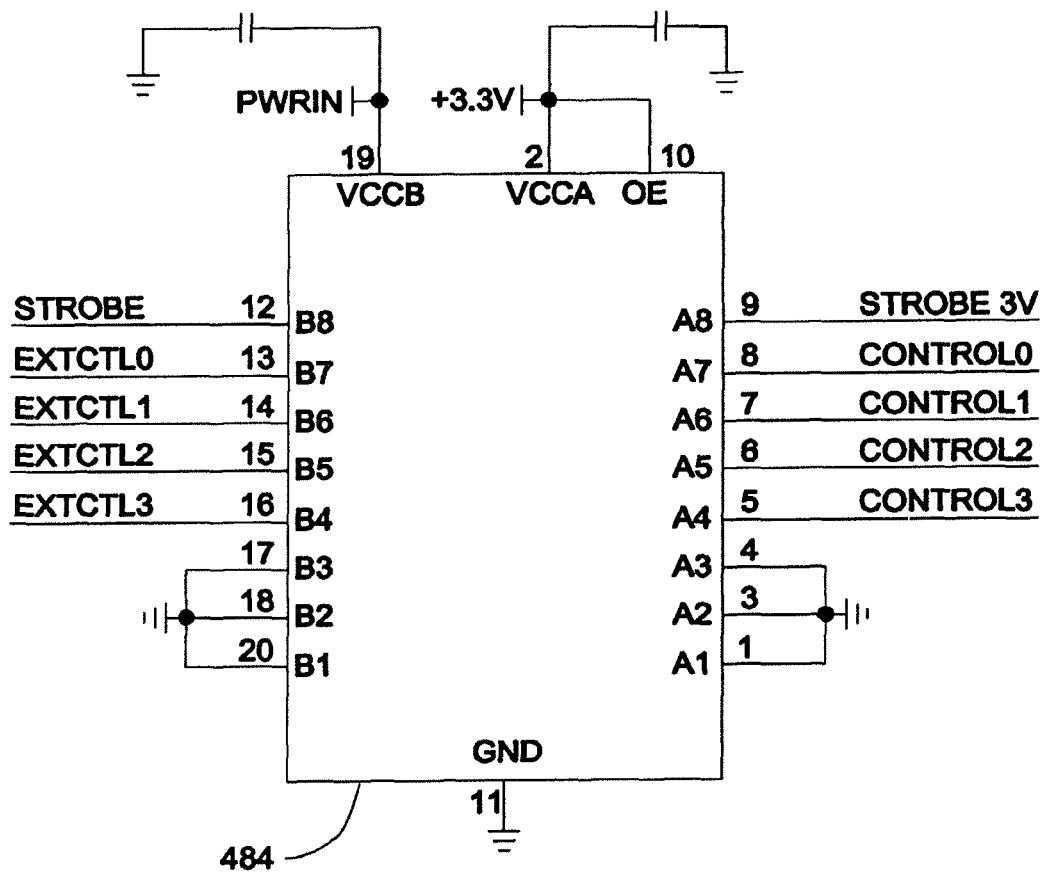
Figure 19F:
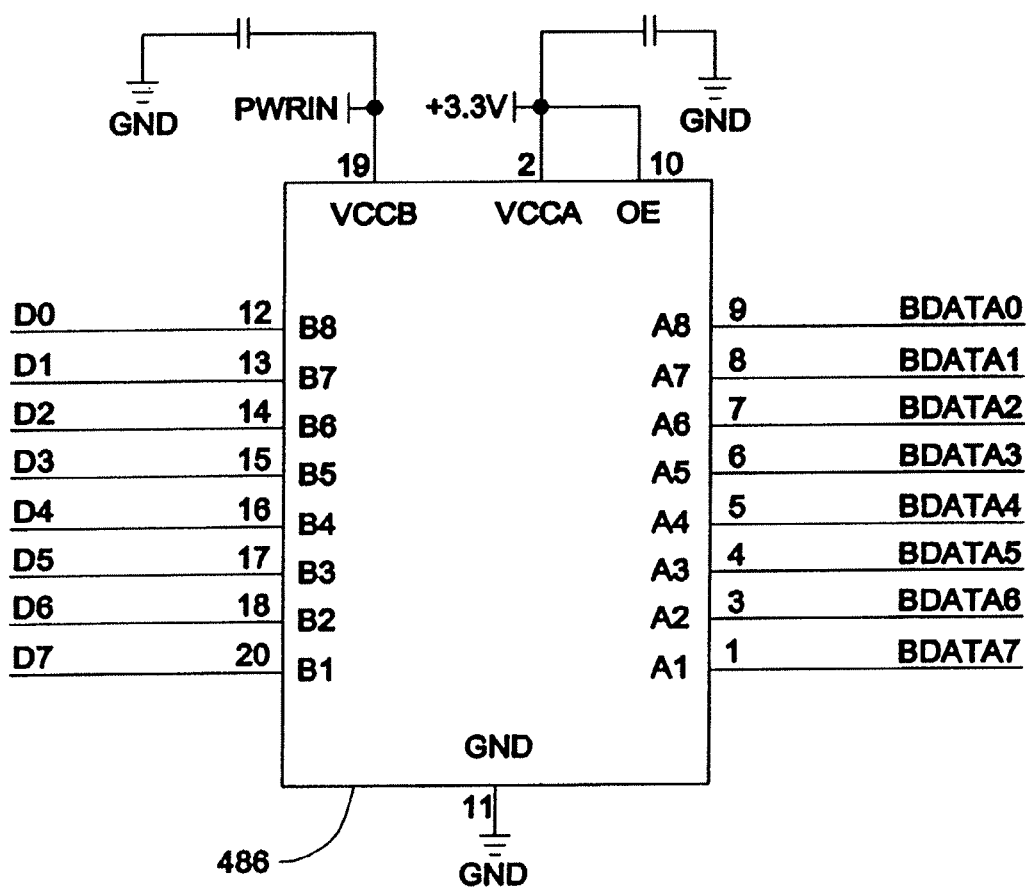

Referring now to FIGS. 19*e-f*, board 438 further includes two eight-bit level shifters 484, 486 for shifting data between PWRIN level and +3.3 VDC level. Level shifters 484, 486 illustratively are Texas Instruments type TXB0108PWR eight-bit level shifters. The filter 426 STROBE, EXTernalConTroL0, EXTCTL1, EXTCTL2 and EXTCTL3 lines are coupled to terminals B8-B4, pins 12-16, respectively, of level shifter 484. Terminals A8-A4, pins 9-5, respectively, of level shifter 484 are coupled to the STROBE3V, CONTROL0, CONTROL1, CONTROL2 and CONTROL3 lines, respectively, of filter 426. Terminals B3-B1, A3-A1 and GND, pins 17, 18, 20, 4, 3, 1 and 11, respectively, of level shifter 484 are coupled to ground. Terminal VCCB, pin 19, of level shifter 484 is coupled to PWRIN and through a 0.1 µF, 5% capacitor to ground. Terminals VCCA and OE, pins 2 and 10, respectively, of level shifter 484 are coupled to +3.3 VDC and through a 0.1 µF, 5% capacitor to ground.

Referring now to FIG. 19*f*, The filter 426's D0-D7 and BDATA0-BDATA7 lines are coupled to the B8-B1 and A8-A1 terminals, pins 12-18, 20, 9-3 and 1, respectively, of level shifter 486. The GND terminal, pin 11, of level shifter 486 is coupled to ground. The VCCB terminal, pin 19, of level shifter 486 is coupled to PWRIN and through a 0.1 µF, 5% capacitor to ground. The VCCA and OE terminals, pins 2 and 10, respectively, of level shifter 486 are coupled to +3.3 VDC and through a 0.1 µF, 5% capacitor to ground.

Figure 19G:
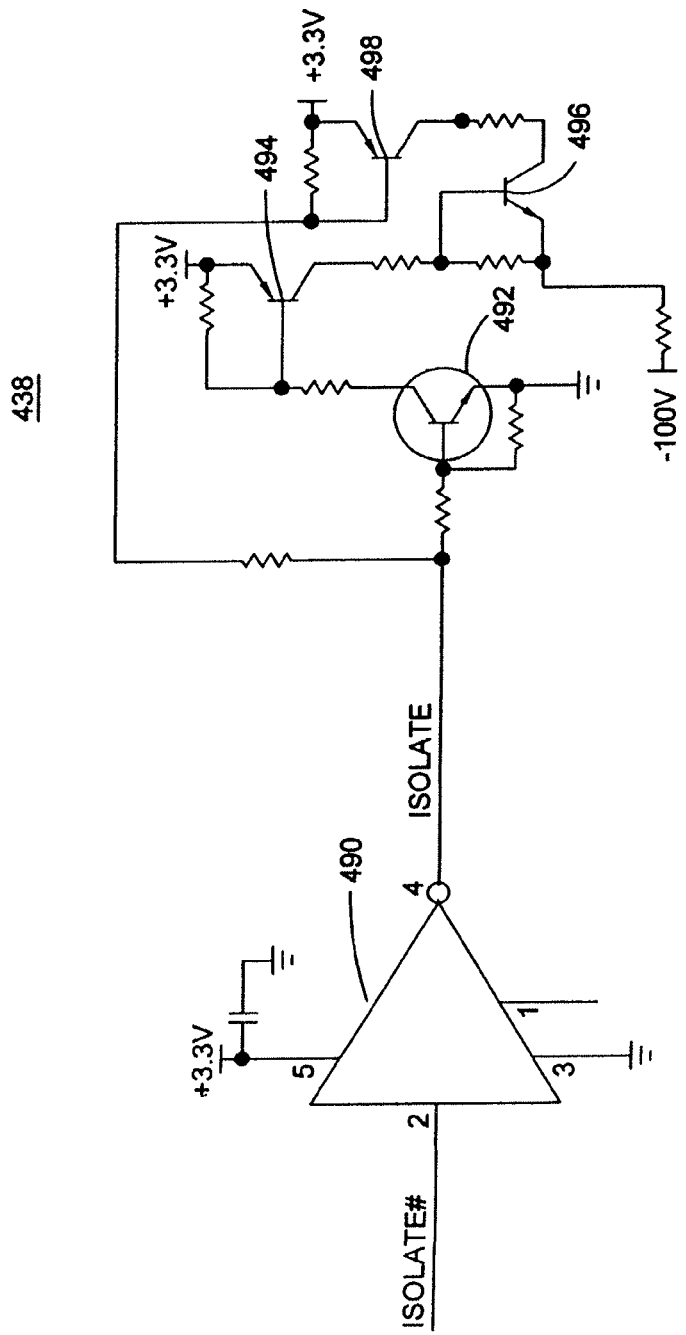

As illustrated in FIG. 19*g*, board 438 further includes an inverter 490, illustratively, a NXP Semiconductors type 74LVC1G04GV inverter. The filter 426 notISOLATE line is coupled to an input terminal of inverter 490. An output terminal of inverter 490 thus forms the filter 426's ISOLATE line. The ISOLATE line is coupled through a 10 KΩ resistor to the base of a digital NPN transistor 492, illustratively, a ON Semiconductor type DTC114EET1G transistor. The base of transistor 492 is also coupled through a 10 KΩ resistor to ground. The emitter of transistor 492 is coupled to ground. The collector of transistor 492 is coupled through two series 1 KΩ, 5% resistors to +3.3 VDC. The junction of the two series 1 KΩ, 5% resistors is coupled to the base of a type MMSTA92 PNP transistor 494. The collector of transistor 494 is coupled through a 100 KΩ, 5% resistor to the base of a type MMSTA42 NPN transistor 496. The base of transistor 496 is coupled through a 1KΩ, 5% resistor to its emitter. The emitter of transistor 496 is coupled through a 100 KR 5% resistor to −100 VDC. The ISOLATE line is also coupled through a 1 KR 5% resistor to the base of a type MMSTA92 PNP transistor 498. The base of transistor 498 is coupled through a 1 KΩ, 5% resistor to its emitter and to +3.3 VDC. The collector of transistor 498 is coupled through a 20 KΩ, 5% resistor to the collector of transistor 496.

Figure 19H:
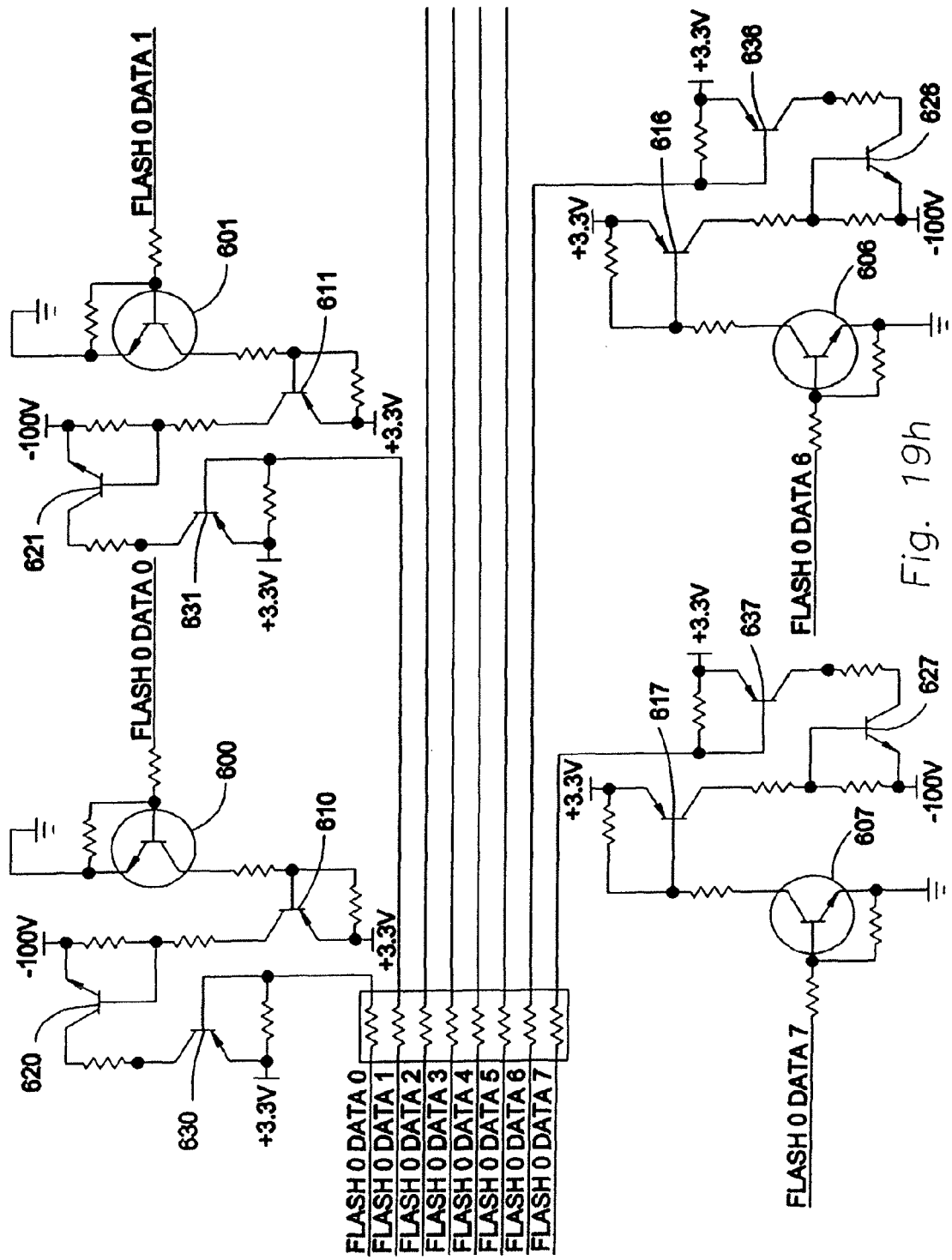
Figure 19I:
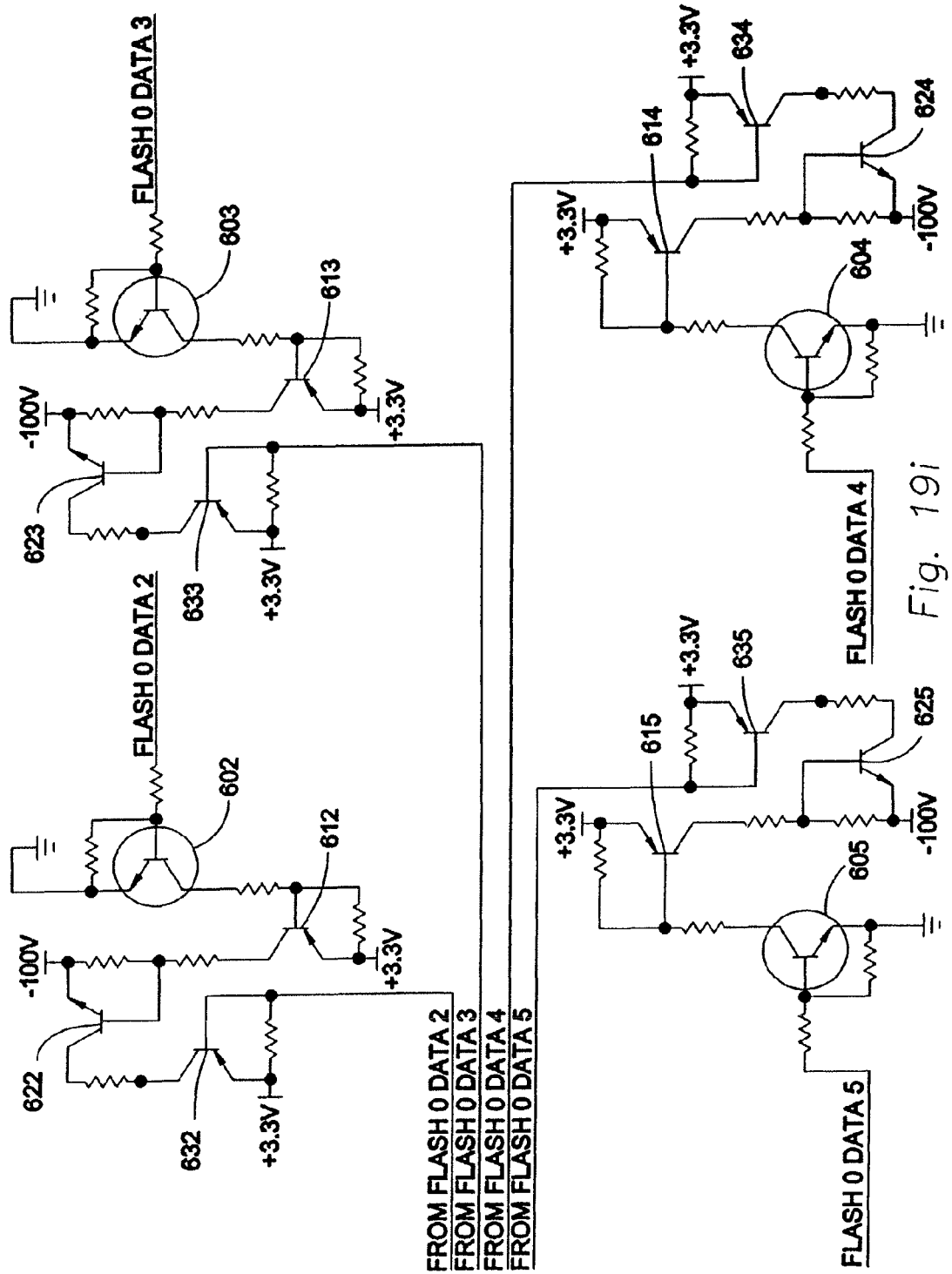

Referring now to FIGS. 19*h-i*, the filter 426's FLASH0 DATA0-FLASH0 DATA7 lines are coupled through respective 10 KΩ resistors to the bases of respective digital NPN transistors 600-607, illustratively, ON Semiconductor type DTC transistors. The bases of transistors 600-607 are also coupled through respective 10 KΩ resistors to ground. The emitters of transistors 600-607 are coupled to ground. The collectors of transistors 600-607 are coupled through respective series pairs of 1 KΩ, 5% resistors to +3.3 VDC. The junction of each respective series pair of 1 KΩ, 5% resistors is coupled to the base of a respective type MMSTA92 PNP transistor 610-617. The collector of each transistor 610-617 is coupled through a respective 100 KΩ, 5% resistor to the base of a respective type MMSTA42 NPN transistor 620-627. The base of each transistor 620-627 is coupled through a respective 1 KΩ, 5% resistor to its emitter. The emitter of each transistor 620-627 is coupled to −100 VDC. The filter 426's FLASH0 DATA0-FLASH0 DATA7 lines are also coupled through respective 1 KΩ, 10% resistors to the bases of respective type MMSTA92 PNP transistors 630-637. The bases of transistors 630-637 are coupled through respective 1 KΩ, 5% resistors to their respective emitters and to +3.3 VDC. The collectors of transistors 630-637 are coupled through respective 20 KΩ, 5% resistors to the collectors of respective transistors 620-627.

Figure 19J:
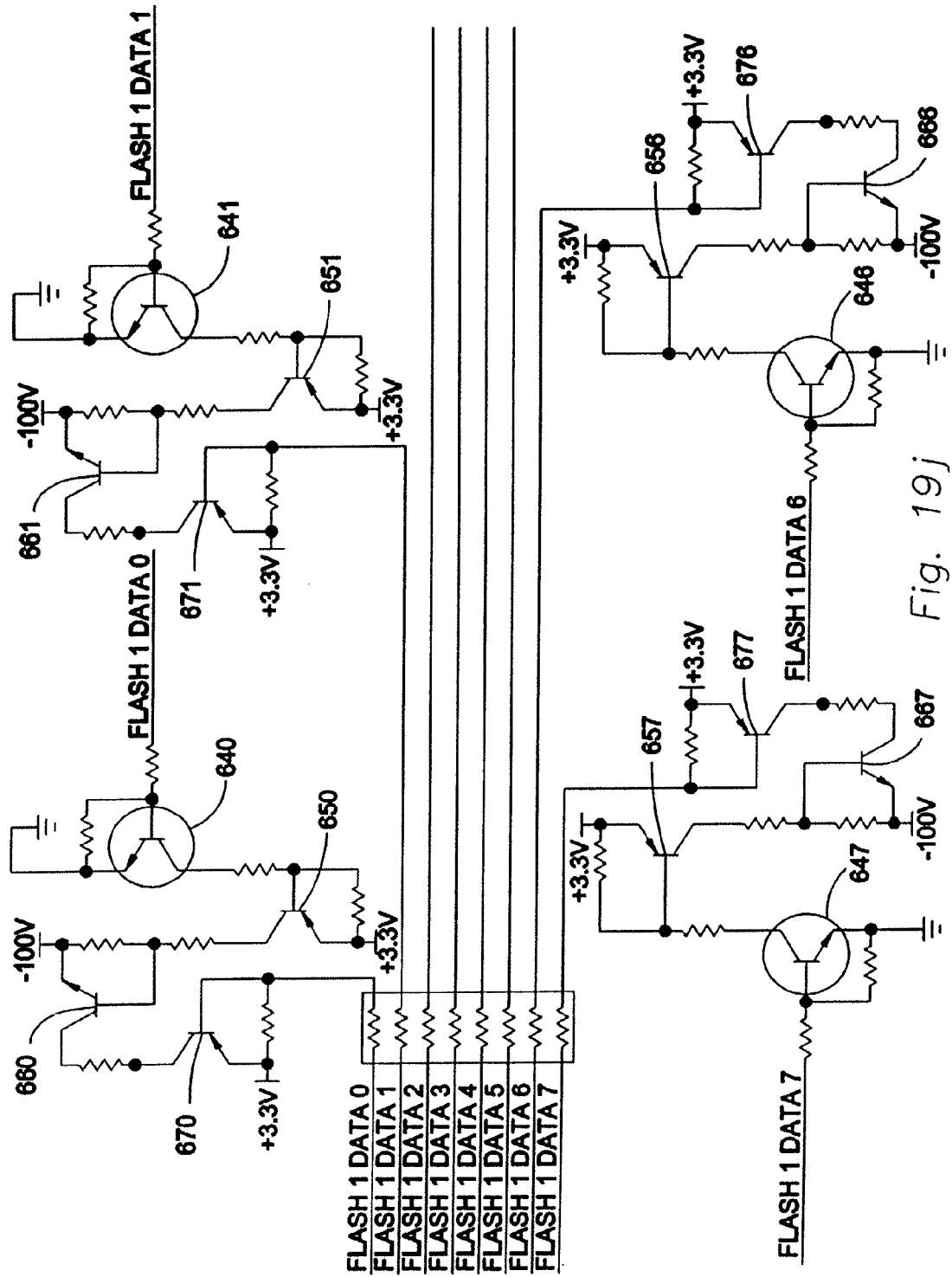
Figure 19K:
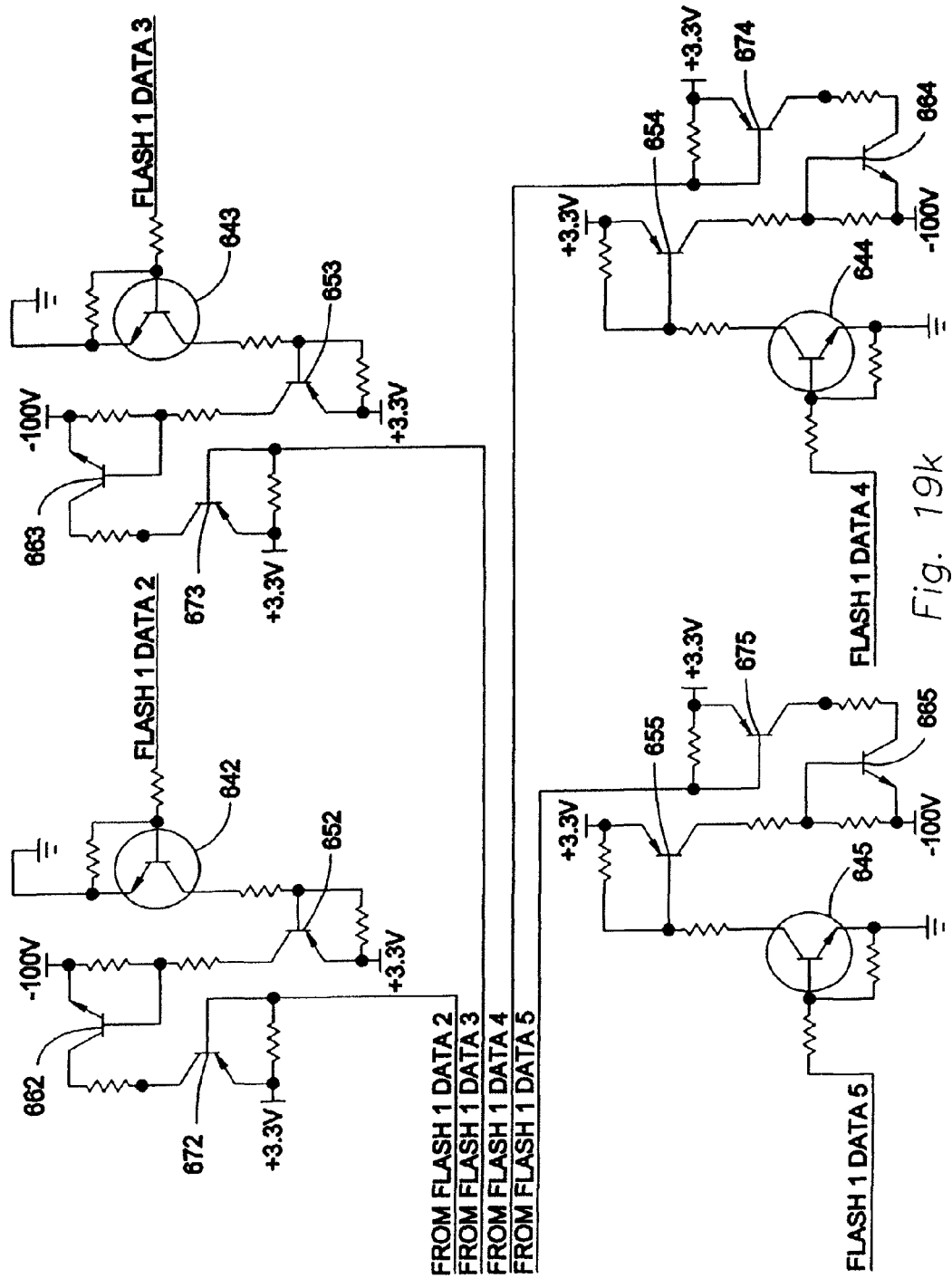
Figure 191:
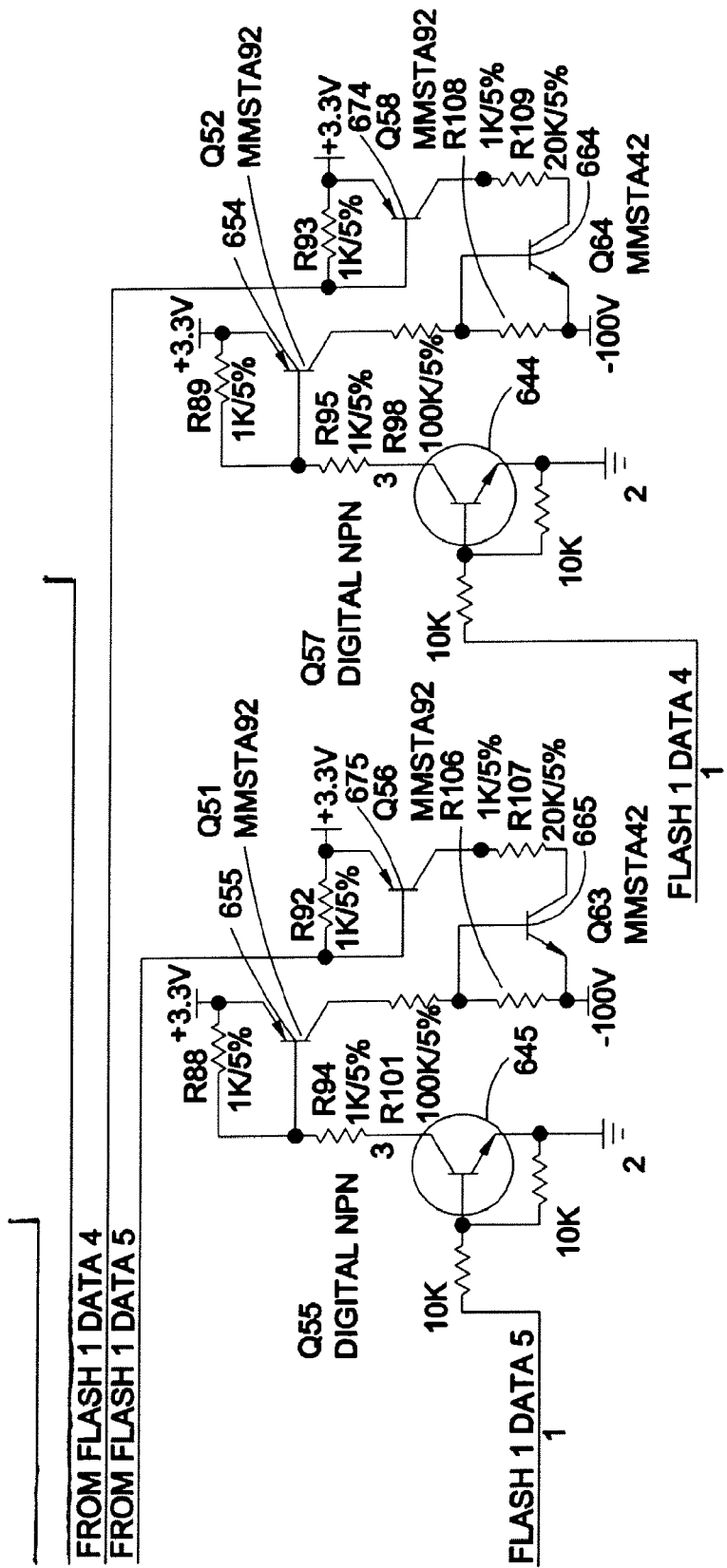

Referring now to FIGS. 19*j-l*, the filter 426's FLASH1 DATA0-FLASH1 DATA7 lines are coupled through respective 10 KΩ resistors to the bases of respective digital NPN transistors 640-647, illustratively, ON Semiconductor type DTC114EET1G transistors. The bases of transistors 640-647 are also coupled through respective 10 KΩ resistors to ground. The emitters of transistors 640-647 are coupled to ground. The collectors of transistors 640-647 are coupled through respective series pairs of 1 KΩ, 5% resistors to +3.3 VDC. The junction of each respective series pair of 1 KΩ, 5% resistors is coupled to the base of a respective type MMSTA92 PNP transistor 650-657. The collector of each transistor 650-657 is coupled through a respective 100 KΩ, 5% resistor to the base of a respective type MMSTA42 NPN transistor 660-667. The base of each transistor 660-667 is coupled through a respective 1 KΩ, 5% resistor to its emitter. The emitter of each transistor 660-667 is coupled to −100 VDC. The filter 426's FLASH1 DATA0-FLASH1 DATA7 lines are also coupled through respective 1 KΩ, 10% resistors to the bases of respective type MMSTA92 PNP transistors 670-677. The bases of transistors 670-677 are coupled through respective 1 KΩ, 5% resistors to their respective emitters and to +3.3 VDC. The collectors of transistors 670-677 are coupled through respective 20 KΩ, 5% resistors to the collectors of respective transistors 660-667.

In another embodiment, the ground plane 529 can be eliminated and the filter PCB 521 located in its cavity 431 of housing 429 with traces 504, 520 substantially equidistant between generally parallel upper and lower surfaces of cavity 431. This configuration, including the essentially air dielectric between traces 504, 520 and these adjacent upper and lower surfaces, constitutes this structure a suspended substrate resonator filter.

It will be appreciated that the described construction, with the exception of the housing/heat sink 229, 429, is virtually planar. The coupled resonator board 20 and microstrip board 521 can thus be populated with their components using high speed automated machines and techniques, rather than requiring time-consuming hand assembly. Significant manufacturing and cost benefits are capable of being realized with the described planar or two dimensional geometry, even when vias are used to create equivalent three dimensional resonator structures (as in FIG. 4) because the illustrated structures can still be populated with components by high speed machines. Eliminating parts and/or labor significantly reduces manufacturing cost.

What is claimed is:
1. A tunable filter comprising:
   a suspended coupled line structure comprising:
      a substrate,
      line segments on both sides of the substrate, wherein
         the line segments are connected with multiple con- ductors extending through the substrate to form the suspended coupled line structure, a plurality of capacitors at an ungrounded end of the suspended coupled line structure, and a plurality of switching elements, wherein each switching element is coupled to a respective one of the plurality of capacitors to switch the respective capacitor into and out of circuit with the ungrounded end of the suspended coupled line structure.

2. The tunable filter of claim 1 further comprising a housing, wherein the housing includes:

a first chamber housing the suspended coupled line structure, and at least a second chamber housing the capacitors and switching elements, wherein the second chamber is electrically shielded from the first chamber by the housing.

3. The tunable filter of claim 1, wherein the suspended coupled line structure comprises a first suspended coupled line structure and a second suspended coupled line structure, wherein the line segments on both sides of the substrate comprise a first set of line segments and a second set of line segments, the first set of line segments being associated with the first suspended coupled line structure and the second set of line segments being associated with the second suspended coupled line structure, wherein the line segments for each of the first and the second sets of line segments are located on both sides of the substrate, wherein the line segments of each of the first and the second sets of line segments are connected with the multiple conductors extending through the substrate to form a resonator, wherein the plurality of capacitors comprises first and second pluralities of capacitors, the first plurality of capacitors being associated with the first suspended coupled line structure and the second plurality of capacitors being associated with the second suspended coupled line structure, wherein the first and the second suspended coupled line structures each contain an ungrounded end, wherein the first plurality of capacitors and the second plurality of capacitors are located at the ungrounded ends of the first and second suspended coupled line structures, respectively, wherein the plurality of switching elements comprises first and second pluralities of switching elements, the first plurality of switching elements associated with the first suspended coupled line structure and the second plurality of switching elements associated with the second suspended coupled line structure, wherein each switching element of the first plurality of switching elements is coupled to a respective one of the first plurality of capacitors to switch the respective capacitor into and out of circuit with the ungrounded end of the first suspended coupled line structure, and wherein each switching element of the second plurality of switching elements is coupled to a respective one of the second plurality of capacitors to switch the respective capacitor into any out of circuit with the ungrounded end of the second suspended coupled line structure.

4. The tunable filter of claim 3 further comprising an input port coupled to the first suspended coupled line structure between a grounded end of the first suspended coupled line structure and the ungrounded end of the first suspended coupled line structure and an output port coupled to the second suspended coupled line structure between a grounded end of the second suspended coupled line structure and the ungrounded end of the second suspended coupled line structure.

5. The tunable filter of claim 4 further comprising a low pass filter coupled between the input port and the first suspended coupled line structure.

6. The tunable filter of claim 5 further comprising a low pass filter coupled between the second suspended coupled line structure and the output port.

7. The tunable filter of claim 4 further comprising a low pass filter coupled between the second suspended coupled line structure and the output port.

8. The tunable filter of claim 1 wherein the switching elements are selected from the group consisting of positive-intrinsic-negative (PIN) diodes, field effect transistors (FETs), microelectromechanical systems (MEMS) devices and digitally tunable capacitors (DTCs).

9. The tunable filter of claim 1 wherein the tunable filter has a 3 dB bandwidth and a minimum frequency tuning step providing a filter frequency tuning step size that is less than the 3 dB bandwidth of the tunable filter.

10. The tunable filter of claim 1 further comprising a controller for controlling each of the switching elements by causing the switching elements to switch their respective capacitors into and out of circuit with the ungrounded end of the suspended coupled line structure to tune the tunable filter to a desired frequency.

11. The tunable filter of claim 3 further comprising:

a controller for controlling each of the switching elements by causing the switching elements to switch their respective capacitors into and out of circuit with the ungrounded end of the respective suspended coupled line structure to tune the tunable filter to a desired frequency; and a housing, the housing including a first chamber configured for housing the suspended coupled line structure, a second chamber configured for housing the first plurality of capacitors and first plurality of switching elements, a third chamber configured for housing the second plurality of capacitors and second plurality of switching elements, and a fourth chamber configured for housing the controller, wherein the first, second, third and fourth chambers are electrically shielded from each other by the housing.

12. A suspended line resonator comprising:

a first electrically insulating substrate having two opposed sides, a first pair of electrically conductive traces, wherein one electrically conductive trace of the first pair of electrically conductive traces is provided on a first side of the two opposed sides of the first substrate, wherein each of the electrically conductive traces of the first pair of electrically conductive traces has a first grounded end and a second ungrounded end, first passageways through the first substrate between the electrically conductive traces of the first pair of electrically conductive traces, and conductive material in the first passageways for electrically coupling the conductive traces of the first pair of electrically conducive traces.

13. The suspended line resonator of claim 12 configured for use with a tunable filter, wherein the tunable filter comprises:

a first plurality of capacitors located at the second ungrounded ends of the first pair of electrically conductive traces of the suspended line resonator, and a first plurality of switching elements, wherein each switching element of the first plurality of switching elements is coupled to a respective one of the first plurality of capacitors to switch the respective capacitor into and out of circuit with the second ungrounded ends of the first pair of electrically conductive traces of the suspended line resonator.

14. The suspended line resonator of claim 12 further comprising:
a second pair of electrically conductive traces, wherein one electrically conductive trace of the second pair of electrically conductive traces is provided on the first side of the two opposed sides of the first substrate, wherein each of the electrically conductive traces of the second pair of electrically conductive traces has a first end coupled to one of the first grounded ends of the first pair of conductive traces, and a second ungrounded end, wherein the electrically conductive traces of the second pair of electrically conductive traces are spaced from respective electrically conductive traces of the first pair of electrically conductive traces,
second passageways through the first substrate between the electrically conductive traces of the second pair of electrically conductive traces, and
conductive material in the second passageways for electrically coupling the conductive traces of the second pair of electrically conductive traces.

15. The suspended line resonator of claim 14 configured for use with a tunable filter, wherein the tunable filter comprises:
a first plurality of capacitors located at the second ungrounded ends of the first pair of electrically conductive traces,
a second plurality of capacitors located at the second ungrounded ends of the second pair of electrically conductive traces,
a first plurality of switching elements, and
a second plurality of switching elements,
wherein each switching element of the first plurality of switching elements is coupled to a respective capacitor of the first plurality of capacitors to switch the respective capacitor into and out of circuit with the second ungrounded ends of the first pair of electrically conductive traces, and
wherein each switching element of the second plurality of switching elements is coupled to a respective capacitor of the second plurality of capacitors to switch the respective capacitor into and out of circuit with the second ungrounded ends of the second pair of electrically conductive traces.

16. The suspended line resonator and tunable filter of claim 15 further comprising an input port coupled to the first pair of electrically conductive traces located between the first grounded ends of the first pair of electrically conductive traces and the second ungrounded ends of the first pair of traces, and an output port coupled to the second pair of electrically conductive traces between the first grounded ends of the second pair of electrically conductive traces and the second ungrounded ends of the second pair of electrically conductive traces.

17. The suspended line resonator and tunable filter of claim 16 further comprising:
a suspended coupled line structure comprising a first suspended coupled line structure and a second suspended coupled line structure; and
a low pass filter coupled between the input port and the first suspended coupled line structure.

18. The suspended line resonator and tunable filter of claim 17 further comprising a low pass filter coupled between the second suspended coupled line structure and the output port.

19. The suspended line resonator and tunable filter of claim 16 further comprising:
a suspended coupled line structure comprising a first suspended coupled line structure and a second suspended coupled line structure; and
a low pass filter coupled between the second suspended coupled line structure and the output port.

20. The suspended line resonator of claim 12 wherein the switching elements are selected from the group consisting of positive-intrinsic-negative (PIN) diodes, field effect transistors (FETs), microelectromechanical systems (MEMS) devices and digitally tunable capacitors (DTCs).

21. The suspended line resonator of claim 12 configured for use with a tunable filter wherein the tunable filter has a 3 dB bandwidth and a minimum frequency tuning step providing a filter frequency tuning step size that is less than the 3 dB bandwidth of the filter.

22. The suspended line resonator of claim 12 configured for use with a tunable filter, wherein the tunable filter comprises:
a suspended coupled line structure having an ungrounded end,
a second electrically insulating substrate,
a first plurality of capacitors at the second ungrounded ends of the first pair of electrically conductive traces,
a first plurality of switching elements,
a controller for controlling each switching element of the first plurality of switching elements in order to switch a respective capacitor of the first plurality of capacitors into and out of circuit with the ungrounded end of the suspended coupled line structure to tune the tunable filter to a desired frequency, wherein the controller is provided on the second electrically insulating substrate, and
a plug and socket, wherein one of the plug and socket is provided on the first electrically insulating substrate and the other one of the plug and socket is provided on the second electrically insulating substrate, wherein an engagement of the plug and socket couples the first plurality of switches to the controller.

* * * * *